US012217162B2

(12) United States Patent
Liu et al.

(10) Patent No.: US 12,217,162 B2
(45) Date of Patent: *Feb. 4, 2025

(54) INTEGRATED CIRCUIT CHIP APPARATUS

(71) Applicant: Cambricon Technologies Corporation Limited, Beijing (CN)

(72) Inventors: Shaoli Liu, Beijing (CN); Xinkai Song, Beijing (CN); Bingrui Wang, Beijing (CN); Yao Zhang, Beijing (CN); Shuai Hu, Beijing (CN)

(73) Assignee: CAMBRICON TECHNOLOGIES CORPORATION LIMITED, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/085,273

(22) Filed: Dec. 20, 2022

(65) Prior Publication Data

US 2023/0120704 A1 Apr. 20, 2023

Related U.S. Application Data

(63) Continuation of application No. 16/721,875, filed on Dec. 19, 2019, now Pat. No. 11,562,216, which is a
(Continued)

(30) Foreign Application Priority Data

Dec. 14, 2017 (CN) .......................... 201711343642.1
Dec. 14, 2017 (CN) .......................... 201711346333.X
(Continued)

(51) Int. Cl.
*G06N 3/063* (2023.01)
*G06F 7/483* (2006.01)
(Continued)

(52) U.S. Cl.
CPC ............ *G06N 3/063* (2013.01); *G06F 7/483* (2013.01); *G06F 7/5443* (2013.01);
(Continued)

(58) Field of Classification Search
CPC .......... G06N 3/063; G06N 3/04; G06N 3/06; G06N 3/08; G06N 3/044; G06N 3/045;
(Continued)

(56) References Cited

U.S. PATENT DOCUMENTS 5,161,117 A * 11/1992 Waggener, Jr. ......... H03M 7/24
708/204
5,956,703 A 9/1999 Turner et al.
(Continued)

FOREIGN PATENT DOCUMENTS

CN 103199806 A 7/2013
CN 103631761 A 3/2014
(Continued)

OTHER PUBLICATIONS

First Office action issued in related Chinese Application No. 201711346333.X, dated Sep. 3, 2019, 8 pages.
(Continued)

*Primary Examiner* — Angelica Ruiz
(74) *Attorney, Agent, or Firm* — BAYES PLLC

(57) ABSTRACT

Provided are an integrated circuit chip apparatus and a related product, the integrated circuit chip apparatus being used for executing a multiplication operation, a convolution operation or a training operation of a neural network. The present technical solution has the advantages of a small amount of calculation and low power consumption.

20 Claims, 46 Drawing Sheets

Related U.S. Application Data continuation of application No. PCT/CN2019/073453, filed on Jan. 28, 2019.

(30) Foreign Application Priority Data

| | | | |
|---|---|---|---|
| Dec. 14, 2017 | (CN) | ......................... | 201711347310.0 |
| Dec. 14, 2017 | (CN) | ......................... | 201711347406.7 |
| Dec. 14, 2017 | (CN) | ......................... | 201711347407.1 |
| Dec. 14, 2017 | (CN) | ......................... | 201711347408.6 |
| Dec. 14, 2017 | (CN) | ......................... | 201711347767.1 |

(51) Int. Cl.

| | |
|---|---|
| *G06F 7/544* | (2006.01) |
| *G06F 17/15* | (2006.01) |
| *G06F 17/16* | (2006.01) |
| *G06N 3/04* | (2023.01) |
| *G06N 3/06* | (2006.01) |
| *G06N 3/08* | (2023.01) |
| *H01L 25/065* | (2023.01) |

(52) U.S. Cl.
CPC ............ *G06F 17/153* (2013.01); *G06F 17/16* (2013.01); *G06N 3/04* (2013.01); *G06N 3/06* (2013.01); *G06N 3/08* (2013.01); *H01L 25/065* (2013.01); *G06F 2207/4824* (2013.01)

(58) Field of Classification Search
CPC ...... G06F 7/483; G06F 7/5443; G06F 17/153; G06F 17/16; G06F 2207/4824; H01L 25/065
See application file for complete search history.

(56) References Cited

U.S. PATENT DOCUMENTS

| | | | |
|---|---|---|---|
| 6,094,715 A | 7/2000 | Wilkinson et al. | |
| 6,272,577 B1* | 8/2001 | Leung .................. | H04L 25/0292 710/110 |
| 7,236,995 B2 | 6/2007 | Hinds .................. | G06F 9/30025 708/204 |
| 7,426,501 B2* | 9/2008 | Nugent .................. | G06N 3/063 706/26 |
| 7,571,303 B2 | 8/2009 | Smith et al. | |
| 7,945,607 B2* | 5/2011 | Hinds .................... | H03M 7/24 708/204 |
| 8,156,057 B2* | 4/2012 | Nugent .................. | G06N 3/065 706/25 |
| 8,601,013 B2* | 12/2013 | Dlugosch ............ | G06F 9/44521 707/758 |
| 9,607,355 B2 | 3/2017 | Zou et al. | |
| 9,990,687 B1 | 6/2018 | Kaufhold et al. | |
| 10,073,816 B1 | 9/2018 | Lu et al. | |
| 11,295,196 B2 | 4/2022 | Chen et al. | |
| 2005/0125477 A1 | 6/2005 | Genov et al. | |
| 2010/0122070 A1 | 5/2010 | Guevorkian et al. | |
| 2011/0026640 A1 | 2/2011 | Milbar | |
| 2011/0119467 A1 | 5/2011 | Cadambi et al. | |
| 2011/0314256 A1 | 12/2011 | Callahan, II et al. | |
| 2015/0019840 A1 | 1/2015 | Anderson et al. | |
| 2015/0277912 A1 | 10/2015 | Gueron | |
| 2016/0191204 A1 | 6/2016 | Kim et al. | |
| 2016/0342888 A1 | 11/2016 | Yang et al. | |
| 2016/0350645 A1 | 12/2016 | Brothers et al. | |
| 2017/0061279 A1 | 3/2017 | Yang et al. | |
| 2017/0102921 A1 | 4/2017 | Henry et al. | |
| 2017/0103305 A1 | 4/2017 | Henry et al. | |
| 2017/0344880 A1 | 11/2017 | Nekuii et al. | |
| 2017/0357891 A1 | 12/2017 | Judd et al. | |
| 2018/0046894 A1 | 2/2018 | Yao | |
| 2018/0046903 A1 | 2/2018 | Yao et al. | |
| 2018/0121240 A1 | 5/2018 | Cai et al. | |
| 2018/0157969 A1 | 6/2018 | Xie et al. | |
| 2018/0218275 A1 | 8/2018 | Arrigoni et al. | |
| 2018/0315158 A1 | 11/2018 | Nurviladhi et al. | |
| 2019/0087716 A1 | 3/2019 | Du et al. | |
| 2019/0114534 A1 | 4/2019 | Teng et al. | |
| 2019/0339972 A1 | 11/2019 | Valentine et al. | |

FOREIGN PATENT DOCUMENTS

| | | |
|---|---|---|
| CN | 104134349 A | 11/2014 |
| CN | 104463324 A | 3/2015 |
| CN | 104572011 A | 4/2015 |
| CN | 104992430 A | 10/2015 |
| CN | 105426344 A | 3/2016 |
| CN | 105956659 A | 9/2016 |
| CN | 106126481 A | 11/2016 |
| CN | 106570559 A | 4/2017 |
| CN | 106575379 A | 4/2017 |
| CN | 106844294 A | 6/2017 |
| CN | 106940815 A | 7/2017 |
| CN | 106991476 A | 7/2017 |
| CN | 106991478 A | 7/2017 |
| CN | 107016175 A | 8/2017 |
| CN | 107229967 A | 10/2017 |
| CN | 107239829 A | 10/2017 |
| CN | 107315574 A | 11/2017 |
| CN | 107329734 A | 11/2017 |
| CN | 107330515 A | 11/2017 |
| CN | 109726806 A | 5/2019 |
| CN | 11136897 A | 7/2020 |
| CN | 107608715 B | 7/2020 |
| JP | 2001188767 A | 10/2001 |
| KR | 1020160140394 A | 12/2016 |
| WO | 2017106469 A1 | 6/2017 |
| WO | 2017185412 A1 | 11/2017 |
| WO | 2017185414 A1 | 11/2017 |

OTHER PUBLICATIONS

International Search Report in corresponding International Application No. PCT/CN2019/073453, mailed Apr. 18, 2019, 4 pages.
Second Office action issued in related Chinese Application No. 201711347406.7, dated Nov. 27, 2019, 7 pages.
Third Office action issued in related Chinese Application No. 201711346333.X, dated Feb. 21, 2020, 9 pages.
First Office action issued in related Chinese Application No. 201711347408.6, dated Sep. 12, 2019, 7 pages.
First Office action issued in related Chinese Application No. 201711455397.3, dated Nov. 14, 2019, 8 pages.
Second Office action issued in related Chinese Application No. 201711455397.3, dated Mar. 3, 2020, 7 pages.
Office action issued in related Taiwan Application No. 107144036, dated Dec. 7, 2021, 10 pages.
Office action issued in related Taiwan Application No. 107144037, dated Dec. 7, 2021, 9 pages.
Liu, Shaoli et al., "Cambricon: An Instruction Set Architecture for Neural Networks", IEEE Computer Society, 2016 ACM/IEEE 43rd Annual International Symposium on Computer Architecture, 13 pages.
Zhang, Shijin et al., "Cambricon-X: An Accelerator for Sparse Neural Networks", 978-1-5090-3/16/$31.00, 2016 IEEE, 12 pages.
Chen, Yunji et al., "DaDianNao: A Machine-Learning Supercomputer", IEEE Computer Society, 2014 47th Annual IEEE/ACM International Symposium on Microarchitecture, 14 pages.
Chen, Tianshi et al., "DianNao: A Small-Footprint High-Throughput Accelerator for Ubiquitous Machine-Learning", ASPLOS '14, Mar. 1-5, 2014, Salt Lake City, Utah, USA, 15 pages.
Liu, Daofu et al., "PuDianNao: A Polyvalent Machine Learning Accelerator", ASPLOS '15, Mar. 14-18, 2015, Istanbul, Turkey, 13 pages.
Du, Zidong et al., "ShiDianNao: Shifting Vision Processing Closer to the Sensor", ISCA '15, Jun. 13-17, 2015, Portland, OR, USA, 13 pages.
First Office action issued in related Chinese Application No. 201811462676.7, dated Sep. 17, 2019, 9 pages.

(56) References Cited

OTHER PUBLICATIONS

First Office action issued in related Chinese Application No. 201811462969.5, dated Sep. 30, 2019, 9 pages.
International Search Report and Written Opinion in corresponding International Application No. PCT/CN2017/099991, mailed May 31, 2018, 8 pages.
First Office action issued in related Chinese Application No. 201780002287.3, dated Dec. 2, 2019, 12 pages.
Second Office action issued in related Chinese Application No. 201811462969.5, dated Feb. 3, 2020, 10 pages.
First Office action issued in related Chinese Application No. 201910102972.4, dated Nov. 29, 2019, 7 pages.
First Office action issued in related Chinese Application No. 201910534118.5, dated Nov. 18, 2019, 8 pages.
First Office action issued in related Chinese Application No. 201910531031.2, dated Nov. 6, 2019, 7 pages.
First Office action issued in related Chinese Application No. 201910530860.9, dated Nov. 19, 2019, 6 pages.
First Office action issued in related Chinese Application No. 201910534527.5, dated Dec. 11, 2019, 7 pages.
Extended European search report in related European Application No. 19211995.6, dated Apr. 6, 2020, 11 pages.
Jonghoon Jin et al: "Flattened Convolutional Neural Networks for Feedforward Acceleration", Arxiv.org, Nov. 20, 2015, 11 pages.
The Tensorflow Authors: "tensorflow/conv_grad_input_ops.cc at 19881 1c64d3139d52eb074fdf20c8156c42f9d0etensorflow/tensorflow . GitHub", GitHub TensorFlow repository, Aug. 2, 2017, 21 pages.
Vincent Dumoulin et al:"A guide to convolution arithmetic for deep learning", arxiv.org, Cornell University Library, 201 Olin Library Cornell University Ithaca, NY 14853, Mar. 23, 2016, 28 pages.
Extended European search report in related European Application No. 19212002.0, dated Apr. 8, 2020, 11 pages.
Minsik Cho et al: "MEC: Memory-efficient Convolution for Deep Neural Network", arxiv.org, Cornell University Library, 201 Olin Library Cornell University Ithaca, NY 14853, Jun. 21, 2017, 10 pages.
Extended European search report in related European Application No. 19212010.3, dated Apr. 20, 2020, 9 pages.
Extended European search report in related European Application No. 19212365.1, dated Apr. 21, 2020, 10 pages.
Extended European search report in related European Application No. 19212368.5, dated Apr. 22, 2020, 10 pages.
Second Office action issued in related Chinese Application No. 201910534528.X, dated Feb. 25, 2020, 8 pages.
Yunji Chen, "DaDianNao: Machine-Learning Supercomputer" <<2014 47th Annual IEEE/ACM International Symposium on Microarchitecture>> , Jan. 19, 2015, 15 pages.
First Office action issued in related Japanese Application No. 2019 553977, dated Feb. 2, 2021, 5 pages.
Lili Song et al., "C-Brain:A Deep Learning Accelerator that Tames the Diversity of CNNs through Adaptive Data-level Parallelization" Proceedings of the 53rd ACM/EDAC/IEEE Design Automation Conference, US IEEE, Jun. 5, 2016, pp. 1-6.
First Office action issued in related Japanese Application No. 2019 221533, dated Nov. 4, 2020, 4 pages.
Third Office action issued in related Chinese Application No. 201910534528.X, dated May 22, 2020, 9 pages.
Third Office action issued in related Chinese Application No. 201910531031.2, dated Jul. 3, 2020, 11 pages.

Yu Wang et al, "Low Power Convolutional Neural Networks on a Chip", 2016 IEEE International Symposium on Circuits and Systems(ISCAS), IEEE, May 22, 2016, pp. 129-132, XP32941496A.
Office Action issued in related European Application No. 19211995.6, dated Dec. 8, 2021, 11 pages.
Office Action issued in related Korean Application No. 10-2019-7029020, dated Februay 26, 2022, 11 pages.
Ngo, Kalle. "FPGA hardware acceleration on inception style parameter reduced convolution neural networks." (2016).
Reyes IV, R., Fedyushkina, I. V., Skvortsov, V. S., & Filimonov, D. A. (2013). Prediction of progesterone receptor Inhibition by high-performance neural network algorithm. International journal of mathematical models and methods in applied sciences, 7, 303-310. (Year: 2013).
Karam, R., Paul, S., Puri, R., & Bhunia, S. (2017). Memory-centric reconfigurable accelerator for classification and machine learning applications. ACM Journal on Emerging Technologies in Computing Systems (JETC), 13(3), 1-24. (Year: 2017).
Sankaradas, M., Jakkula, V., Cadambi, S., et al. (2009, July). A massively parallel coprocessor for convolutional neural networks. In 2009 20th IEEE International Conference on Application-specific Systems, Architectures and Processors (pp. 53-60). IEE(Year: 2009).
Chen, Yunji et al., "DianNao Family: Energy-Efficient Hardware Accelerators for Machine Learning", DOI: 10.1145/2996864, Nov. 2016, vol. 59, No. 11, Communications of the ACM, 8 pages.
Bianconi, G., Dorogovtsev, S. N., & Mendes, J. F. (2015). Mutually connected component of networks of networks with replica nodes. Physical Review E, 91(1), 012804. (Year: 2015).
Yang et al., (2016). A Systematic approach to blocking convolutional neural networks. arXiv: 1606.04209v1, 12 pages.
Pande et al., Matrix Convolution using parallel programming, International Journal of Sciene and Researach (IJSR), India Online ISSN:2319-7064 (Jul. 2013) 6 pages.
Chellapilla et al., High performance convolutional neural networks for document processing, HAL Id: inria-00112631. https://halinria.fr/inria-00112631 (Nov. 2006) 7 pages.
Hy et al., DLPlib: A library for deep learning processor, J. Computer Science & Tech 32(2):286-296 (Mar. 2017) 11 pages.
"Brito, R., Fong, S., Cho, K., Song, W., Wong, R., Mohammed, S., & Fiaidhi, J. (2016). GPU-enabled back-propagation artificialneural network for digit recognition in parallel. The Journal of Supercomputing, 72(10), 3868-3886. (Year: 2016)".
"Han, S., Liu, X., Mao, H., Pu, J., Pedram, A., Horowitz, M.A., & Dally, W. J. (2016). EIE: efficient inference engine on compressed deep neural network. ACM Sigarch Computer Architecture News, 44(3), 243-254(Year: 2016)".
Zhang, J., & Li, J. (2017, February). Improving the performance of OpenCL-based FPGA accelerator for convolutional neuralnetwork. In Proceedings of the 2017 ACM/SIGDA International Symposium on Field-Programmable Gate Arrays (pp. 25-34). (Year2017).
Azarkhish, et al., (2017). Neurostream: Scalable and Energy Efficient Deep Learning with Smart Memory Cues. arXiv preprint arXiv:1701.06420. (Year 2017).
Moini S., et al., A resource-limited hardware accelerator for convoultional neural networks in embeded vision applications. IEEE Transactions on Circuits and Systems II: Express Briefs. 2017, Apr. 4:64(10):1217-21 (Year 2017).
Chinese Office Action in related Chinese Application No. 201911335145.6 dated Feb. 27, 2023 (34 pages).
Yuanyuan Li et al., New Materials Science and Technology-Metal Materials Sep. 30, 2012 (7 pages).
Second Office action issued in related Chinese Application No. 201911163257.8, dated Sep. 21, 2023, 6 pages.

* cited by examiner

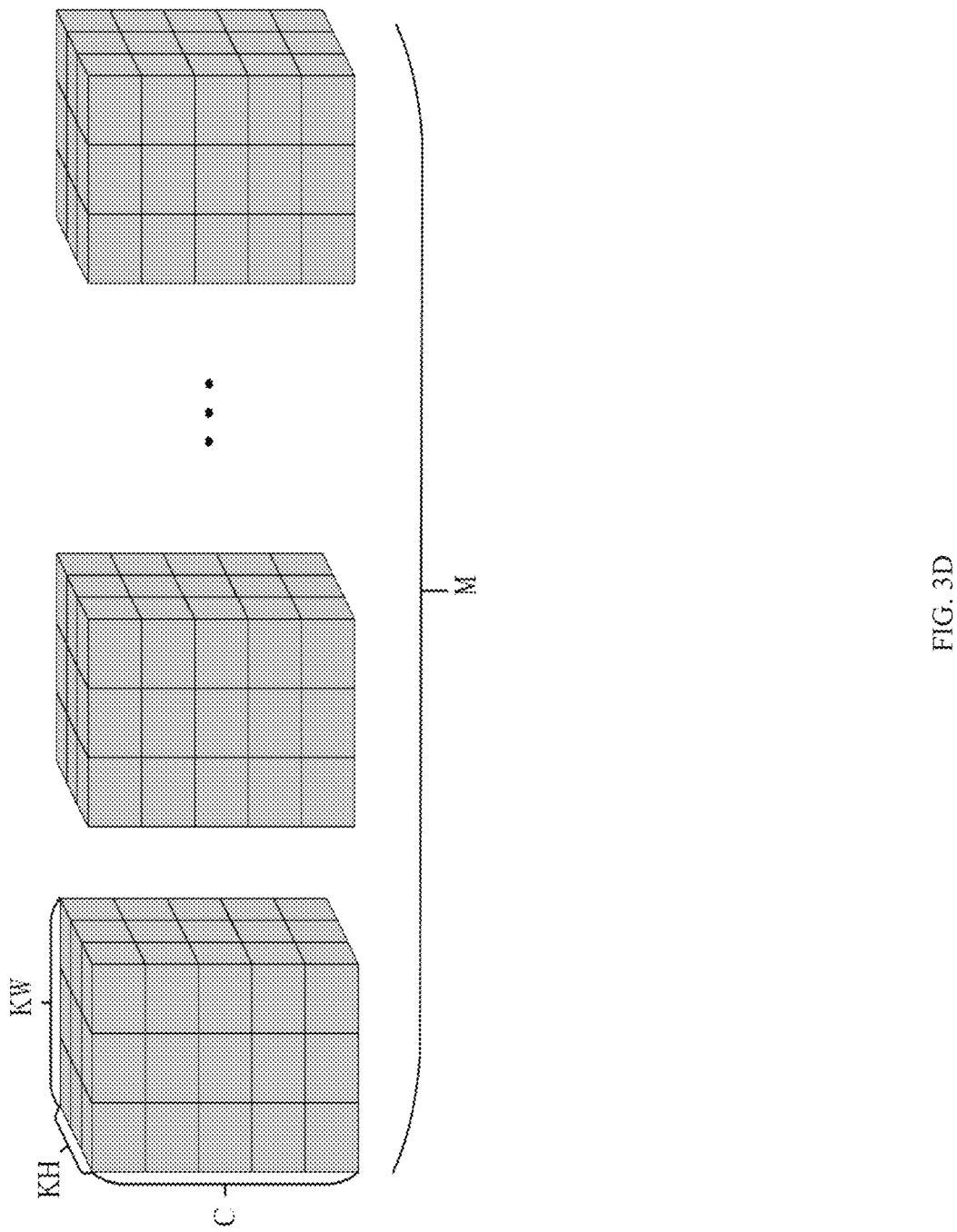

INTEGRATED CIRCUIT CHIP APPARATUS

RELATED APPLICATION

The present application is a continuation of U.S. application Ser. No. 16/721,875, filed Dec. 19, 2019, which is a by-pass continuation application of PCT International Application No. PCT/CN2019/073453 filed Jan. 28, 2019, and further claims the benefit and priority of Chinese Patent Application No. 201711346333X, No. 2017113436421, No. 2017113474071, No. 2017113477671, No. 2017113474067, No. 2017113474086, and No. 2017113473100, each with the title of "Integrated Circuit Chip Apparatus and Product thereof" and filed on Dec. 14, 2017. The entire contents of each of the above-identified applications are incorporated herein by reference.

TECHNICAL FIELD

The present disclosure relates to the field of neural network computation apparatus, and particularly relates to integrated circuit chip apparatus.

BACKGROUND

ANN (Artificial Neural Network) is a research focus emerged in 1980s in the field of artificial intelligence. ANN abstracts the human brain neuron network from the perspective of information processing to establish a simple model, and then builds different networks according to different connection methods. ANN is often referred to as neural network in engineering and academia. Neural networks are a type of computational model. They are formed by a large number of interconnecting nodes (or may be referred to as neurons). Existing neural networks are based on CPU (Central Processing Unit) or GPU (Graphics Processing Unit) to realize neural network operations. The operations often require a large amount of computations and have high power consumption.

SUMMARY

The present disclosure provides embodiments of an integrated circuit chip apparatus, a method performed using the same, and a processing apparatus having the same. Compared with existing integrated circuit chip apparatuses, the disclosed integrated circuit chip apparatus can reduce the amount of computations and power consumption.

An aspect of the disclosure provides an integrated circuit chip apparatus that may include a main processing circuit and a plurality of basic processing circuits. The main processing circuit or at least one of the plurality of basic processing circuits may include a data type conversion circuit configured to convert data between a floating point data type and a fixed point data type. The plurality of basic processing circuits may be configured to perform a first set of neural network computations in parallel on data transferred by the main processing circuit, and transfer a plurality of computation results to the main processing circuit. The main processing circuit may be configured to perform a second set of neural network computations in series on the plurality of computation results.

Another aspect of the disclosure provides a processing system that may include a neural network computing apparatus, a general interconnection interface, and a general-purpose processing apparatus connected to the neural network computing apparat via the general interconnection interface. The neural network computing apparatus may further include a main processing circuit and a plurality of basic processing circuits. The main processing circuit or at least one of the plurality of basic processing circuits may include a data type conversion circuit configured to convert data between a floating point data type and a fixed point data type. The plurality of basic processing circuits may be configured to perform a first set of neural network computations in parallel on data transferred by the main processing circuit, and transfer a plurality of computation results to the main processing circuit. The main processing circuit may be configured to perform a second set of neural network computations in series on the plurality of computation results.

A further aspect of the disclosure provides method for performing neural network operations using an integrated circuit chip apparatus that may include a main processing circuit and a plurality of basic processing circuits. The method may include converting data between a floating point data type and a fixed point data type using a data type conversion circuit in the main processing circuit or at least one of the basic processing circuits. The method may also include performing a first set of neural network computations in parallel on the data using the plurality of basic processing circuits to obtain a plurality of computation results. The method may further include transferring the plurality of computation results from the plurality of basic processing circuits to the main processing circuit. The method may additionally include performing a second set of neural network computations in series on the plurality of computation results using the main processing circuit.

An additional aspect of the disclosure provides an integrated circuit chip apparatus that may include a main processing circuit, k branch circuits connected to the main processing circuits, and k groups of basic processing circuits. Each group of basic processing circuits may be connected to each branch circuit. Each branch processing circuit may further include a data type conversion circuit configured to convert data between a floating data type and a fixed point data type. The main processing circuit may be configured to transfer data and a computation instruction to the k branch circuits. The k branch circuits may be configured to forward the data transferred from the main processing circuit to the k groups of basic processing circuits, and determine whether to convert the data transferred between a fixed point data type and a floating point data type using the data type conversion circuits according to the type of the data transferred and the computation instruction. The k groups of basic processing circuits may be configured to perform a first set of neural network computations in parallel on the data forwarded by the k branch circuits, and transfer computation results to the main processing circuit through the k branch circuits. The main processing unit may be further configured to perform a second set of neural network computations in series on the computation results.

Another aspect of the disclosure provides a processing system that may include a neural network computing apparatus, a general interconnection interface, and a general-purpose processing apparatus connected to the neural network computing apparatus via the general interconnection interface. The neural network computing apparatus may further include a main processing circuit, k branch circuits connected to the main processing circuits, and k groups of basic processing circuits may be connected to each branch circuit. Each branch processing circuit may further include a data type conversion circuit configured to convert data between a floating data type and a fixed point data type. The main processing circuit may be configured to transfer data and a computation instruction to the k branch circuits. The k branch circuits may be configured to determine whether to convert the data transferred between a fixed point data type and a floating point data type using the data type conversion circuits according to the type of the data transferred and the computation instruction, and forward the data transferred from the main processing circuit to the k groups of basic processing circuits. The k groups of basic processing circuits may be configured to perform a first set of neural network computations in parallel on the data forwarded by the k branch circuits, and transfer computation results to the main processing circuit through the k branch circuits. The main processing circuit may be further configured to perform a second set of neural network computations in series on the computation results.

In another aspect, the disclosure provides a method for performing neural network operations using an integrated circuit chip apparatus that may include a main processing circuit, k branch circuits connected to the main processing circuit, and k groups of basic processing circuits. Each group of basic processing circuits may be connected to each branch circuit. The method may include transferring data and a computation instruction from the main processing circuit to the k branch circuits. The method may also include determining, by the k branch circuits, whether to convert the data transferred between a fixed point data type and a floating point data type using the data type conversion circuits according to the type of the data transferred and the computation instruction. The method may further include performing, by the k groups of basic processing circuits, a first set of neural network computations in parallel on the data forwarded by the k branch circuits. The method may additionally include transferring computation results from the k groups of basic processing circuits to the main processing circuit through the k branch circuits. The method may also include performing, by the main processing circuit, a second set of neural network computations in series on the computation results.

In a further aspect, the disclosure provides an integrated circuit chip apparatus that may include a main processing circuit and a plurality of basic processing circuits, each including a data type conversion computational circuit configured to convert data between a floating point data type and a fixed point data type. The main processing circuit may be configured to perform a first set of neural network computations in series, and transfer data and a computation instruction to the plurality of basic processing circuits. The plurality of basic processing circuits may be configured to determine whether to convert the data transferred between the floating point data type and the fixed point data type using the data type conversion computational circuits according to the type of data transferred the computation instruction, perform a second set of neural network computations in parallel on the data transferred, and transfer computation results to the main processing circuit.

In an additional aspect, the disclosure provides a processing system that may include a neural network computing apparatus, a general interconnection interface, and a general-purpose processing apparatus connected to the neural network computing apparatus via the general interconnection interface. The neural network computing apparatus may further include a main processing circuit and a plurality of basic processing circuits, each including a data type conversion computational circuit configured to convert data between a floating point data type and a fixed point data type. The main processing circuit may be configured to perform a first set of neural network computations in series, and transfer data and a computation instruction to the plurality of basic processing circuits. The plurality of basic processing circuits may be configured to determine whether to convert the data transferred between the floating point data type and the fixed point data type using the data type conversion computational circuits according to the type of data transferred and the computation instruction, perform a second set of neural network computations in parallel on the data transferred, and transfer computation results to the main processing circuit.

The disclosure provides, in an aspect, a method for performing neural network operations using an integrated circuit chip apparatus that may include a main processing circuit, and a plurality of basic processing circuits, each including a data type conversion computational circuit configured to convert data between a floating point data type and a fixed point data type. The method may include transferring data and a computation instruction from the main processing circuit to the basic processing circuits. The method may also include determining, by the basic processing circuits, whether to convert the data transferred between a fixed point data type and a floating point data type using the data type conversion computational circuits according to the type of data transferred and the computation instruction. The method may further include performing, by the basic processing circuits, a first set of neural network computations in parallel on the data forwarded by the k branch circuits. The method may additionally include transferring computation results from the basic processing circuits to the main processing circuit. The method may also include performing, by the main processing circuit, a second set of neural network computations in series on the computation results.

The disclosure provides, in another aspect, an integrated circuit chip apparatus that may include a main processing circuit and a plurality of basic processing circuits arranged in a form of an m*n array including m rows and n columns of basic processing circuits. Each basic processing circuit may be connected to its adjacent basic processing circuits in the array. The main processing circuit may be connected to k basic processing circuits of the plurality of basic processing circuits arranged on one or more sides of the array. Each of the k basic processing circuits may include a data type conversion circuit configured to convert data between a floating point data type and a fixed point data type. The main processing circuit may be configured to transfer data and a computation instruction to the k basic processing circuits. The k basic processing circuits may be configured to determine whether to convert the data transferred between the floating point data type and the fixed point data type according to the type of the data transferred and the computation instruction, and forward data received from the main processing circuit to the other basic processing circuits among the plurality of basic processing circuits. The plurality of basic processing circuits may be configured to perform a first set of neural network computations in parallel on the data transferred, and transfer computation results to the main processing circuit through the k basic processing circuits. The main processing circuit may be further configured to perform a second set of neural network computations in series on the computation results.

Then disclosure provides, in a further aspect, a processing system that may include a neural network computing apparatus, a general interconnection interface, and a general-purpose processing apparatus connected to the neural network computing apparatus via the general interconnection interface. The neural network computing apparatus may further include a main processing circuit and a plurality of basic processing circuits arranged in a form of an m*n array including m rows and n columns of basic processing circuits. Each basic processing circuit may be connected to its adjacent basic processing circuits in the array. The main processing circuit may be connected to k basic processing circuits of the plurality of basic processing circuits arranged on one or more sides of the array. Each of the k basic processing circuits may include a data type conversion circuit configured to convert data between a floating point data type and a fixed point data type. The main processing circuit may be configured to transfer data and a computation instruction to the k basic processing circuits. The k basic processing circuits may be configured to determine whether to convert the data transferred between the floating point data type and the fixed point data type according to the type of the data transferred and the computation instruction, and forward data received from the main processing circuit to the other basic processing circuits among the plurality of basic processing circuits. The plurality of basic processing circuits may be configured to perform a first set of neural network computations in parallel on the data transferred, and transfer computation results to the main processing circuit through the k basic processing circuits. The main processing circuit may be further configured to perform a second set of neural network computations in series on the computation results.

The disclosure provides, in an additional aspect, a method for performing neural network operations using an integrated circuit chip apparatus that may include a main processing circuit, and a plurality of basic processing circuits arranged in a form of an m*n array including m rows and n columns of basic processing circuits. Each basic processing circuit may be connected to its adjacent basic processing circuits in the array. The main processing circuit may be connected to k basic processing circuits of the plurality of basic processing circuits arranged on one or more sides of the array. Each of the k basic processing circuits may include a data type conversion circuit configured to convert data between a floating point data type and a fixed point data type. The method may include transferring data and a computation instruction from the main processing circuit to the k basic processing circuits. The method may also include determining, by the k basic processing circuits, whether to convert the data transferred between the fixed point data type and the floating point data type using the data type conversion circuits according to the type of data transferred and the computation instruction. The method may further include forwarding, by the k basic processing circuits, data received from the main processing circuit to the other basic processing circuits among the plurality of basic processing circuits. The method may additionally include performing, by the plurality of basic processing circuits, a first set of neural network computations in parallel on the data forwarded by the k basic processing circuits. The method may also include transferring computation results to the main processing circuit through the k basic processing circuits. The method may further include performing, by the main processing circuit, a second set of neural network computations in series on the computation results.

An aspect of the disclosure provides an integrated circuit chip apparatus that may include a main processing circuit and a plurality of basic processing circuits arranged in a form of an m*n array that includes m rows and n columns of basic processing circuits. Each basic processing circuit may be connected to its adjacent basic processing circuits in the array. The main processing circuit may be connected to k basic processing circuits of the plurality of basic processing circuits arranged on one or more sides of the array. The plurality of basic processing circuits may include data type conversion circuits configured to convert data between a floating data type and a fixed point data type. The main processing circuit may be configured to transfer data and a computation instruction to the k basic processing circuit. The k basic processing circuits may be configured to forward data received from the main processing circuit to the other basic processing circuits among the plurality of basic processing circuits. The plurality of basic processing circuits may be configured to determine whether to convert the data transferred between the floating point data type and the fixed point data type according to the type of the data transferred and the computation instruction, perform a first set of neural network computations in parallel on the data transferred, and transfer computation results to the main processing circuit through the k basic processing circuits. The main processing circuit may be further configured to perform a second set of neural network computations in series on the computation results.

Another aspect of the disclosure provides a processing system that may include a neural network computing apparatus, a general interconnection interface, and a general-purpose processing apparatus connected to the neural network computing apparatus via the general interconnection interface. The neural network computing apparatus may further include a main processing circuit and a plurality of basic processing circuits arranged in a form of an m*n array including m rows and n columns of basic processing circuits. Each basic processing circuit may be connected to its adjacent basic processing circuits in the array. The main processing circuit may be connected to k basic processing circuits of the plurality of basic processing circuits arranged on one or more sides of the array. The plurality of basic processing circuits may include data type conversion circuits configured to convert data between a floating data type and a fixed point data type. The main processing circuit may be configured to transfer data and a computation instruction to the k basic processing circuits. The k basic processing circuits may be configured to forward data received from the main processing circuit to the other basic processing circuits among the plurality of basic processing circuits. The plurality of basic processing circuits may be configured to determine whether to convert the data transferred between the floating point data type and the fixed point data type according to the type of the data transferred and the computation instruction, perform a first set of neural network computations in parallel on the data transferred, and transfer computation results to the main processing circuit through the k basic processing circuits. The main processing circuit may be further configured to perform a second set of neural network computations in series on the computation results.

A further aspect of the disclosure provides a method for performing neural network operations using an integrated circuit chip apparatus that may include a main processing circuit, and a plurality of basic processing circuits arranged in a form of an m*n array including m rows and n columns of basic processing circuits. Each basic processing circuit may be connected to its adjacent basic processing circuits in the array. The main processing circuit may be connected to k basic processing circuits of the plurality of basic processing circuits arranged on one or more sides of the array. The plurality of basic processing circuits may include data type conversion circuits configured to convert data between a floating data type and a fixed point data type. The method may include transferring data and a computation instruction from the main processing circuit to the k basic processing circuits. The method may also include forwarding, by the k basic processing circuits, data received from the main processing circuit to the other basic processing circuits among the plurality of basic processing circuits. The method may further include determining, by the plurality of basic processing circuits, whether to convert the data forwarded by the k basic processing circuits between the fixed point data type and the floating point data type using the data type conversion circuits according to the type of data transferred and the computation instruction. The method may additionally include performing, by the plurality of basic processing circuits, a first set of neural network computations in parallel on the data forwarded. The method may also include transferring computation results to the main processing circuit through the k basic processing circuits. The method may further include performing, by the main processing circuit, a second set of neural network computations in series on the computation results.

An additional aspect of the disclosure provides a method for performing a neural network computation using an integrated circuit chip apparatus. The method may include receiving an operation instruction. The method may also include parsing the operation instruction to obtain input data and weight data for a first computation. The method may further include determining a first complexity of the first computation according to the input data, the weight data, and characteristics of the first computation. The method may additionally include determining a first data type for the input data and the weight data in which the first computation is to be performed according to the first complexity. The first data type may be a floating point data type or a fixed point data type. The method may also include performing the first computation on the input data and the weight data in the first data type.

In an aspect, the disclosure provides an integrated circuit chip apparatus configured to perform a neural network computation. The apparatus may include an external interface configured to receive a first operation instruction. The apparatus may also include a processing circuit configured to parse the first operation instruction to obtain a first computation to be performed at a layer of the neural network and corresponding input data and weight data for performing the first computation, determine a first complexity of the first computation according to the input data, the weight data, and characteristics of the first computation, determine a first data type for the input data and the weight data in which the first computation is to be performed according to the first complexity, wherein the first data type may be a floating point datatype or a fixed point data type, and perform the first computation on the input data and the weight data in the first data type.

In another aspect, the disclosure provides a processing apparatus that may include a neural network computing apparatus configured to perform a neural network computation of a neural network, a general interconnection interface, and a general-purpose processing apparatus connected to the neural network computing apparatus via the general interconnection interface. The neural network computation apparatus may be configured to receive input data and weight data for performing a first computation, determine a first complexity of the first computation according to the input data, the weight data, and characteristics of the first computation, determine a first data type for the input data and the weight data in which the first computation is to be performed according to the first complexity, wherein the first data type may be a floating point data type or a fixed point data type, and perform the first computation on the input data and the weight data in the first data type.

In a further aspect, the disclosure provides a method for training a neural network using an integrated circuit chip apparatus. The neural network may include a plurality of layers. The method may include receiving a training instruction. The method may also include determining input data to the neural network and weight group data for the respective layers according to the training instruction. The method may further include performing, by the integrated circuit chip apparatus, forward computations on the plurality of layers of the neural network using the input data and the weight group data to obtain input data and output data of the respective layers. The method may additionally include performing, by the integrated circuit chip apparatus, back computations on the plurality of layers of the neural network according to the training instruction to update the weight group data of the respective layers. Performing a first back computation on an $n^{th}$ layer further may include determining a computation complexity of the first back computation to be performed on the $n^{th}$ layer, determining a first data type in which the first back computation is to be performed based on the computation complexity, wherein the first data type may be a fixed point data type or a floating point data type, determining a weight group data gradient by performing the first back computation on the $n^{th}$ layer in the first data type, and updating the weight group data of the $n^{th}$ layer based on the weight group data gradient.

In additional aspect, the disclosure provides an integrated circuit chip apparatus configured to train a neural network. The neural network may include a plurality of layers. The integrated circuit chip apparatus may include an external interface configured to receive a training instruction and a processing circuit. The processing circuit may be configured to perform forward computations on the plurality of layers of the neural network according to the training instruction to obtain input data and output data of the respective layers and perform back computations on the plurality of layers of the neural network according to the training instruction to update the weight group data of the respective layers. To perform a first back computation on an $n^{th}$ layer, the neural network computing apparatus may be configured to determine a computation complexity of the first back computation to be performed on the $n^{th}$ layer, determine a first data type in which the first back computation is to be performed based on the computation complexity, wherein the first data type may be a fixed point data type or a floating point data type, determine a weight group data gradient by performing the first back computation on the $n^{th}$ layer in the first data type, and update the weight group data of the $n^{th}$ layer based on the weight group data gradient $n^{th}$ layer.

The disclosure provides, in an aspect, a processing apparatus that may include a neural network computing apparatus configured to train a neural network, wherein the neural network may include a plurality of layers, a general interconnection interface, and a general-purpose processing apparatus connected to the neural network computing apparatus via the general interconnection interface. The neural network computing apparatus may be configured to perform forward computations on the plurality of layers of the neural network according to a training instruction to obtain input data and output data of the respective layers and perform back computations on the plurality of layers of the neural network according to the training instruction to update weight group data of the respective layers. To perform a first back computation on an $n^{th}$ layer the neural network computing apparatus may be configured to determine a computation complexity of the first back computation to be performed on the $n^{th}$ layer, determine a first data type in which the first back computation is to be performed based on the computation complexity, wherein the first data type may be a fixed point data type or a floating point data type, determine a weight group data gradient by performing the first back computation on the $n^{th}$ layer in the first data type, and update the weight group data of the $n^{th}$ layer based on the weight group data gradient.

BRIEF DESCRIPTION OF THE DRAWINGS

In order to illustrate the technical solutions in the examples of the present disclosure more clearly, the drawings to be used in the description of the examples will be briefly explained below. Obviously, the drawings in the description below are some examples of the present disclosure. Other drawings can be obtained according to the disclosed drawings without any creative effort by those skilled in the art.

FIG. 1i is a structural diagram of other integrated circuit chip apparatus.

FIG. 2i is a structural diagram of integrated circuit chip apparatus.

FIG. 3d is a schematic diagram of a convolution kernel.

DETAILED DESCRIPTION

To help those skilled in the art to understand the present disclosure better, the technical solutions in the examples of the present disclosure will be described clearly and completely hereinafter with reference to the accompanied drawings in the examples of the present disclosure. Obviously, the described examples are merely some rather than all examples of the present disclosure. All other examples obtained by those of ordinary skill in the art based on the examples of the present disclosure without creative efforts shall fall within the protection scope of the present disclosure.

Figure 1A:
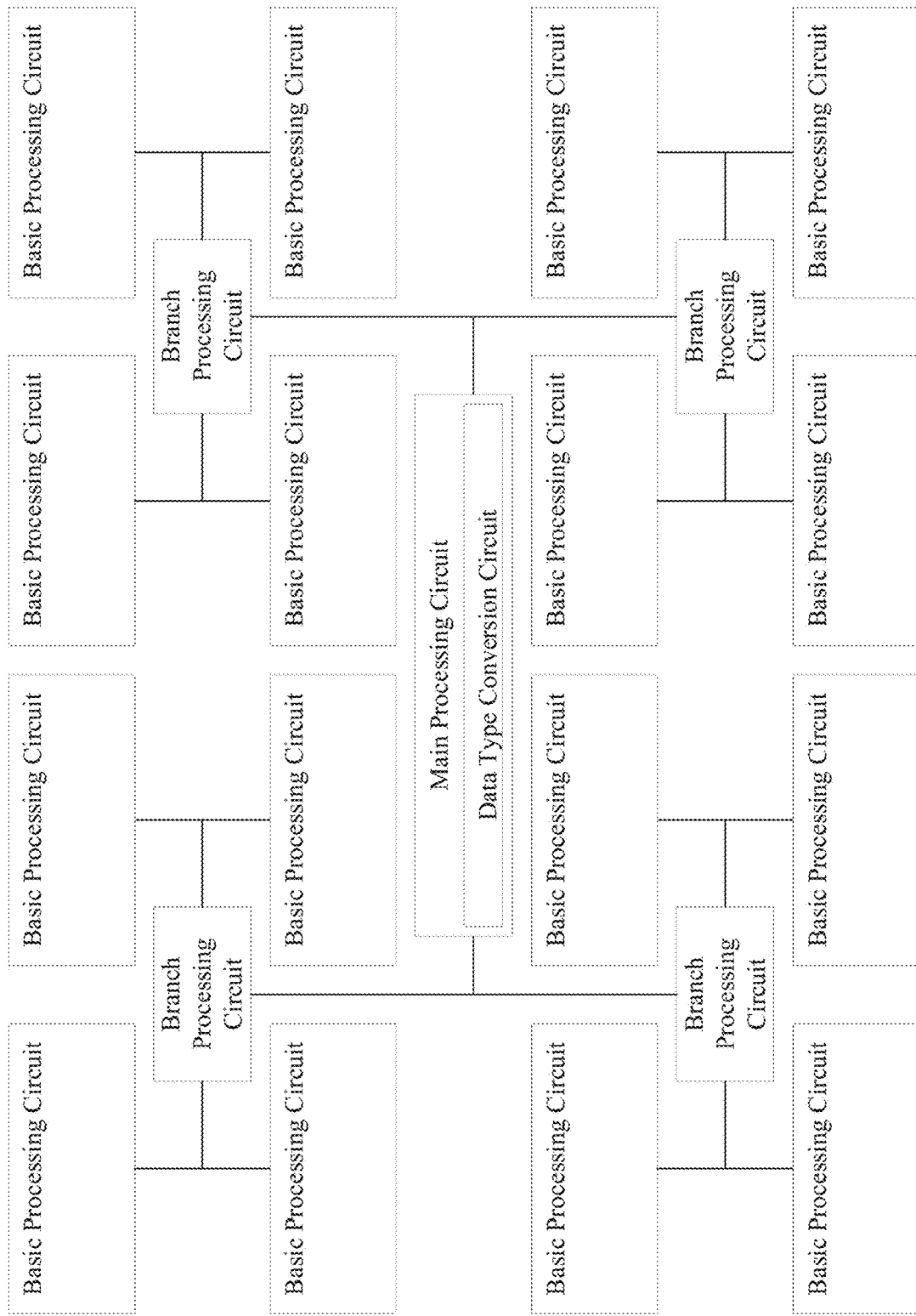
FIG. 1a is a structural diagram of integrated circuit chip apparatus.

FIG. 1a is a structural diagram of integrated circuit chip apparatus. As shown in FIG. 1a, the chip apparatus may include a main processing circuit, a basic processing circuit, and a branch processing circuit (optional), where the main processing circuit may include a register and/or an on-chip caching circuit. As shown in FIG. 1c, the main processing circuit may further include a control circuit, a vector computing unit circuit, an ALU (Arithmetic and Logic Unit) circuit, an accumulator circuit, a DMA (Direct Memory Access) circuit, and the like. In certain applications, the main processing circuit may further include a conversion circuit (e.g., a matrix transposition circuit), a data rearrangement circuit, an activation circuit, or the like.

Alternatively, the main processing circuit may include: a data type conversion circuit, where the data type conversion circuit may be configured to convert received or transferred data from floating point data to fixed point data. Of course, in certain applications, the data type conversion circuit may also convert fixed point data into floating point data. The present disclosure does not restrict a form of the data type conversion circuit.

The main processing circuit may also include a data transferring circuit, a data receiving circuit or interface, where a data distribution circuit and a data broadcasting circuit may be integrated in the data transferring circuit. In in certain applications, the data distribution circuit and the data broadcasting circuit may be set independently; the data transferring circuit and the data receiving circuit may also be integrated to form a data transceiving circuit. Data for broadcasting refers to data that are to be sent to each basic processing circuit. Data for distribution refers to data that are to be selectively sent to some basic processing circuits. A selection method may be determined by the main processing circuit according to its load and a computation method. A method of broadcasting refers to transferring the data for broadcasting to each basic processing circuit by means of broadcasting. In some embodiments, the data for broadcasting may be transferred to each basic processing circuit by broadcasting for once or a plurality of times. The times of broadcasting are not restricted in the example of the present disclosure. A method of distributing refers to selectively transferring the data for distribution to some basic processing circuits.

When distributing data, the control circuit of the main processing circuit may transfer data to some or all of the basic processing circuits (the data may be identical or different). Specifically, if data is transferred by means of distribution, data received by each basic processing circuit may be different, and of course some of the basic processing circuits may receive the same data. Specifically, when broadcasting data, the control circuit of the main processing circuit may transfer data to some or all of the basic processing circuits, and each basic processing circuit may receive the same data.

Alternatively, the vector computing unit circuit of the main processing circuit may be configured to perform a vector computation which may include but is not limited to: addition, subtraction, multiplication, and division between two vectors; addition, subtraction, multiplication, and division between a vector and a constant; or any computation performed on each element in a vector. A computation performed by the main processing circuit may be addition, subtraction, multiplication, division, activation computation, accumulation computation, and the like, between a vector and a constant.

Each basic processing circuit may include a basic register and/or a basic on-chip caching circuit. Each basic processing circuit may further include one or more of an inner product computing unit circuit, a vector computing unit circuit, an accumulator circuit, and the like. The inner product computing unit circuit, the vector computing unit circuit, and the accumulator circuit may all be integrated circuits, and the inner product computing unit, the vector computing unit circuit, and the accumulator circuit may also be circuits that are set independently.

In an alternative example, the chip apparatus may also include one or more branch processing circuits. If a branch processing circuit is included, the main processing circuit may be connected to the branch processing circuit, and the branch processing circuit may be connected to the basic processing circuits. The inner product computing unit of a basic processing circuit may be configured to perform an inner product computation between data blocks. The control circuit of the main processing circuit may control the data receiving circuit or the data transferring circuit to receive or transfer external data, and control the data transferring circuit to distribute the external data to the branch processing circuit. The branch processing circuit may be configured to receive data from and transfer data to the main processing circuit or the basic processing circuit. A structure shown in FIG. 1a may be suitable for complex data computations, which is due to a fact that a count of units connected to the main processing circuit is limited, and a branch processing circuit may be added between the main processing circuit and the basic processing circuits so that more basic processing circuits can be connected, which may thereby realize computations of complex data blocks. A connection structure of the branch processing circuit and the basic processing circuits may be arbitrary and is not restricted to an H-shape structure in FIG. 1a. Alternatively, a data transferring direction from the main processing circuit to the basic processing circuits may be a direction of broadcasting or distribution, and a data transferring direction from the basic processing circuits to the main processing circuit may be a direction of gathering. Broadcasting, distribution, and gathering are defined as follows: a distribution or broadcasting structure refers to that a count of the basic processing circuits is greater than a count of the main processing circuit, in other words, one main processing circuit corresponds to a plurality of basic processing circuits, and a structure from the main processing circuit to the plurality of basic processing circuits is a broadcasting or distribution structure. On the contrary, a structure from the plurality of basic processing circuits to the main processing circuit may be a structure of gathering.

The basic processing circuit may be configured to receive data that are distributed or broadcast by the main processing circuit, and store the data in the on-chip caches of the basic processing circuit. The basic processing circuit may be configured to perform computations to obtain results, and send data to the main processing circuit.

Data involved in the basic processing circuit may be data of any data type, data represented by a floating point number of any bit width, or data represented by a fixed point number of any bit width. All computational circuits and storage circuits that are involved may be computational circuits and storage circuits that are capable of processing data of any type, computational circuits and storage circuits for a floating point number of any bit width, or computational circuits and storage circuits for a fixed point number of any bit width.

Alternatively, each basic processing circuit may include a data type conversion circuit, or some basic processing circuits may include a data type conversion circuit. The data type conversion circuit may be configured to convert received or transferred data from floating point data to fixed point data, and may also be configured to convert fixed point data into floating point data. The present disclosure does not restrict a form of the data type conversion circuit.

Alternatively, the vector computing unit circuit of the basic processing circuit may be configured to perform a vector computation on two vectors that have been subject to data type conversion. Of course, in in certain applications, the inner product computing unit circuit of the basic processing circuit may also be configured to perform an inner product computation on two vectors that have been subject to data type conversion, and the accumulator circuit may also be configured to accumulate results of inner product computations.

In an alternative example, two vectors may be stored in the on-chip cache and/or the register. The basic processing circuit may fetch the two vectors to perform a computation according to computational needs. The computation may include, but is not limited to: an inner product computation, a multiplication computation, an addition computation, or another computation.

In an alternative example, a result of inner product computation may be accumulated in the on-chip cache and/or the register. Technical effects of this alternative example include that data that are transferred between the basic processing circuit and the main processing circuit may be reduced, the computational efficiency may be improved, and the power consumption of data transferring may be reduced.

In an alternative example, a result of inner product computation may be transferred as a result without being accumulated. Technical effects of this alternative example include that the amount of computation in the basic processing circuit may be reduced, and the computational efficiency of the basic processing circuit may be improved.

In an alternative example, each basic processing circuit may be configured to perform inner product computations of a plurality groups of two vectors, and may also be configured to accumulate results of a plurality groups of inner product computations respectively. In an alternative example, data of the plurality groups of two vectors may be stored in the on-chip cache and/or the register. In an alternative example, the results of a plurality groups of inner product computations may be accumulated in the on-chip cache and/or the register respectively. In an alternative example, each result of a plurality groups of inner product computations may be transferred as a result without being accumulated. In another alternative example, each basic processing circuit may be configured to perform inner product computations between a same vector and a plurality of vectors respectively (one-to-many inner product, which in other words, refers to that for a plurality groups of vectors, one vector in the two vectors of each group is shared), and accumulate an inner product corresponding to each vector respectively. By using the technical solution, a same set of weights can be used for performing a plurality of computations on different input data, which may increase data reusing, reduce internal data transferring of the basic processing circuit, improve computational efficiency, and reduce power consumption.

Specifically, regarding data used for computing inner products, a data source of a shared vector and a data source of the other vector (the different vector in each group) of each group may be different: in an alternative example, when computing inner products, the shared vector of each group may be broadcast or distributed from the main processing circuit or the branch processing circuit. In an alternative example, when computing inner products, the shared vector of each group may be from the on-chip cache. In an alternative example, when computing inner products, the shared vector of each group may be from the register. In another alternative example, when computing inner products, the non-shared vector of each group may be broadcast or distributed from the main processing circuit or the branch processing circuit. In an alternative example, when computing inner products, the non-shared vector of each group may be from the on-chip cache. In an alternative example, when computing inner products, the non-shared vector of each group may be from the register. In an alternative example, when computing a plurality groups of inner products, the shared vector of each group may be saved in any count of copies in the on-chip cache and/or the register of the basic processing circuit. In an alternative example, for each groups of inner products, one copy of the shared vector may be saved correspondingly. In an alternative example, the shared vector may be saved as one copy only. Specifically, results of a plurality groups of inner product computations may be accumulated in the on-chip cache and/or the register respectively. Specifically, each result of the plurality groups of inner product computations may be transferred as a result without being accumulated. Referring to a structure shown in FIG. 1a, the structure includes a main processing circuit (capable of performing vector operation) and a plurality of basic processing circuits (capable of performing inner product operation). A technical effect of the combination is that the apparatus can not only use the basic processing circuits to perform matrix and vector multiplication, but can also use the main processing circuit to perform any other vector computations, so that the apparatus may complete more computations faster with a configuration where a limited count of hardware circuits are included. The combination may reduce a count of times that data is transferred with the external of the apparatus, improve computational efficiency, and reduce power consumption. Besides, in the chip, a data type conversion circuit may be arranged in the basic processing circuit and/or the main processing circuit, so that floating point data may be converted into fixed point data when a neural network computation is being performed, and fixed point data may also be converted into floating point data. In addition, the chip may also dynamically allocate a circuit to perform data type conversion according to the amount of computation (loads) of each circuit (mainly the main processing circuit and the basic processing circuit), which may reduce complex procedures of data computation and reduce power consumption. By dynamically allocating a circuit to perform data type conversion, the computational efficiency of the chip may not be affected. An allocation method may include but is not limited to: load balancing, load minimum allocation, and the like.

Figure 1B:
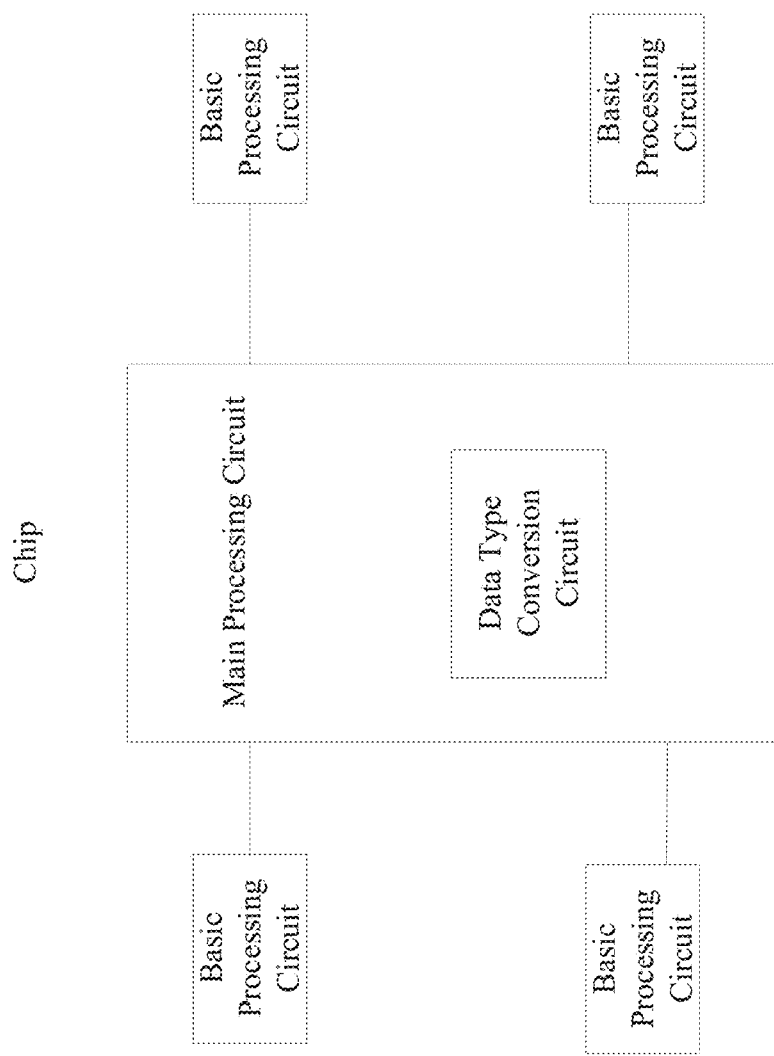
FIG. 1b is a structural diagram of other integrated circuit chip apparatus.
Figure 1C:
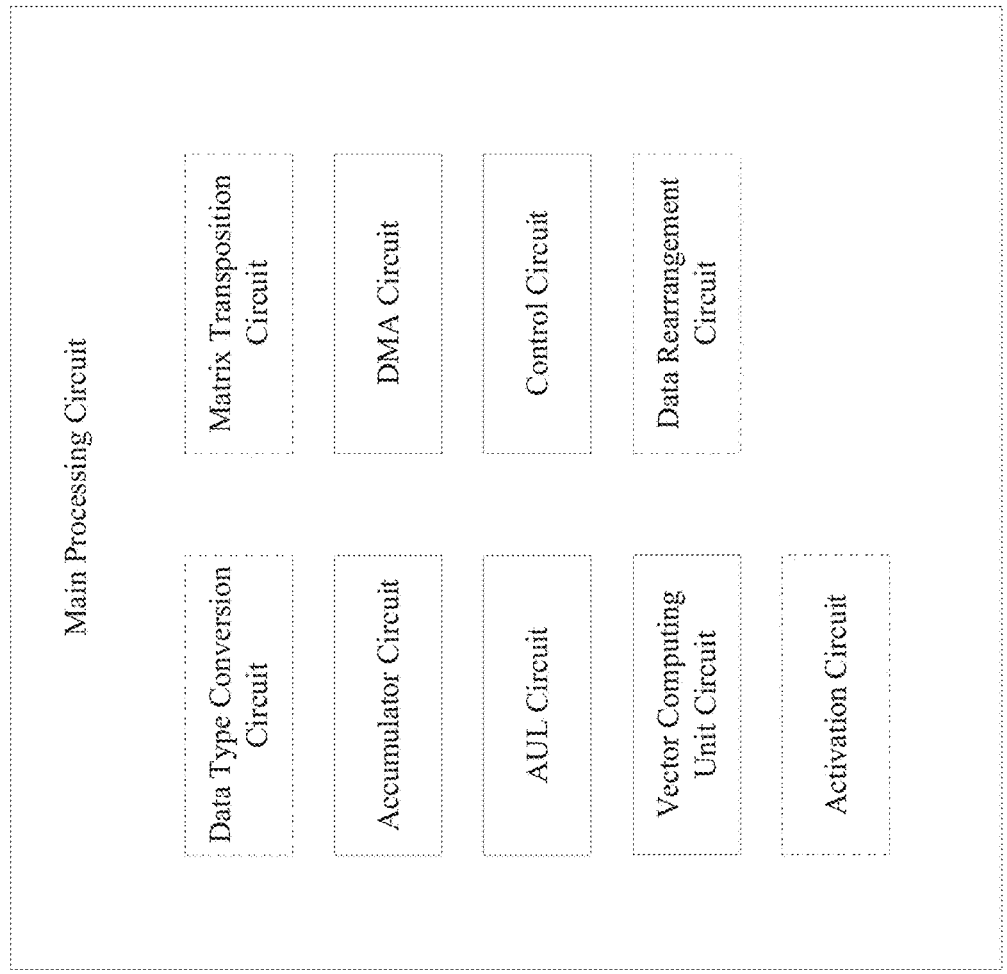
FIG. 1c is a structural diagram of a basic processing circuit.
Figure 1D:
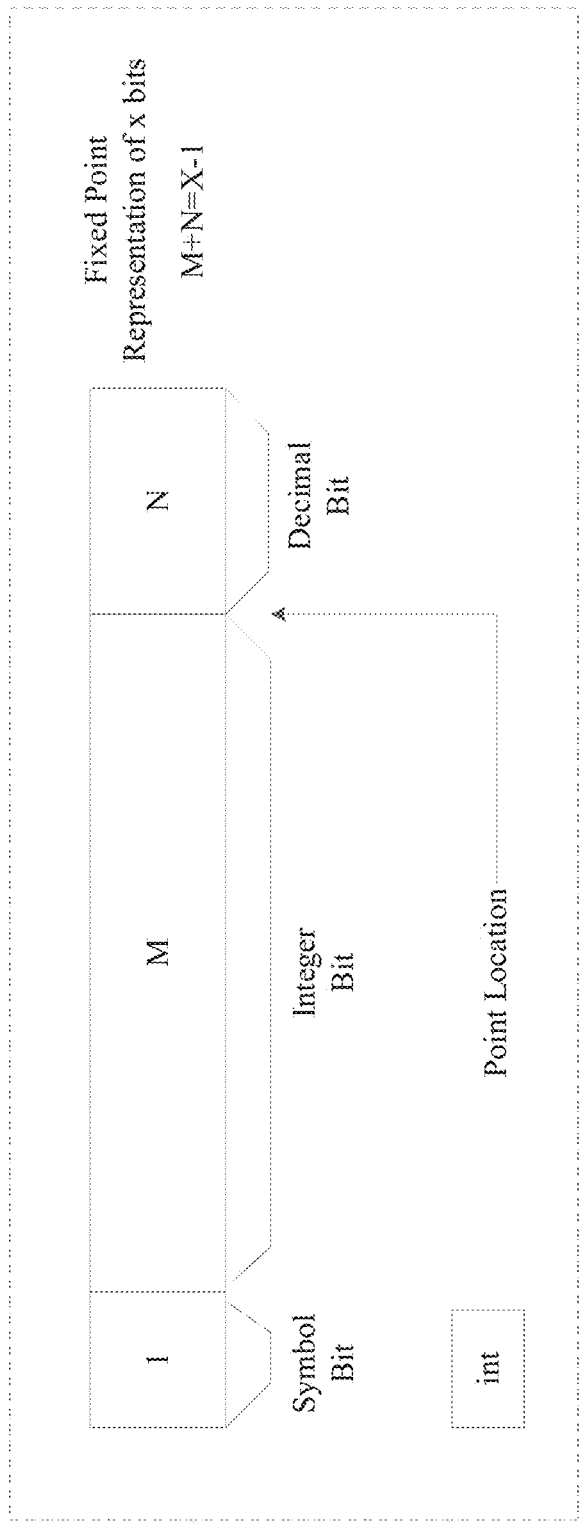
FIG. 1d is a schematic diagram of a fixed point data type.

FIG. 1d is a structural diagram of the fixed point data. FIG. 1d shows a method of representing fixed point data. For a computing system, the storage bit of one floating point data is 32 bits. For fixed point data, particularly a data representation using the floating point data shown in FIG. 1d, the storage bit of one fixed point data can be reduced to less than 16 bits, which may greatly reduce transferring overhead between computing units during conversion. In addition, for a computing unit, the storage space of data having fewer bits may be smaller, in other words, the storage overhead may be less, the amount of computations may also be reduced, and the computational overhead may be reduced. In this case, the fixed point data shown in FIG. 1d may reduce the computational overhead and storage overhead. However, data type conversion requires computational overhead, which will be referred to as conversion overhead below. For data that require a large amount of computations and a large amount of storage, conversion overhead is almost negligible compared with subsequent computational overhead, storage overhead, and transferring overhead. In this case, the present disclosure adopts a technical solution of converting data into fixed point data for data that require a large amount of computations and a large amount of storage. On the contrary, for data that require a small amount of computations and a small amount of storage, the data require less computational overhead, storage overhead, and transferring overhead. Since the precision of fixed point data is lower than the precision of floating point data, if fixed point data is used, under the premise that an amount of computations is relatively small, the fixed point data may be converted to floating point data to ensure the precision of computations. In other words, the precision of computations may be improved by increasing a small amount of overhead.

Referring to the apparatus shown in FIG. 1b, the apparatus does not include any branch processing circuit. The apparatus in FIG. 1b may include a main processing circuit and N basic processing circuits, where the main processing circuit (whose structure is shown in FIG. 1c) may be connected to the N basic processing circuits directly or indirectly. If the main processing circuit is connected to the N basic processing circuits indirectly, an alternative connection scheme is shown in FIG. 1a, where N/4 branch processing circuits may be included, and each branch processing circuit may be connected to four basic processing circuits respectively. Regarding circuits that are included in the main processing circuit and the N basic processing circuits, a description of them can be seen in the description of FIG. 1a, which is omitted here. It should be explained that the basic processing circuits may also be arranged inside the branch processing circuits, and besides, a count of basic processing circuits that are connected to each branch processing circuit may not be restricted to 4. Manufacturers can set the count according to actual needs. The main processing circuit and/or the N basic processing circuits may all include a data type conversion circuit. Specifically, it may be the main processing circuit that includes a data type conversion circuit, and may also be the N basic processing circuits or some of the basic processing circuits that include a data type conversion circuit, and may further be the main processing circuit, and the N basic processing circuits or some of the basic processing circuits that include a data type conversion circuit.

The main processing circuit may dynamically allocate an entity to perform a step of data type conversion according to a neural network computation instruction. Specifically, the main processing circuit may determine whether to perform the step of data type conversion on received data according to its loads. Specifically, a value of the loads may be set as a plurality of ranges, where each range corresponds to an entity that performs the step of data type conversion. Taking three ranges as an instance: range 1 corresponds to light loads, where the main processing circuit may perform the step of data type conversion alone; range 2 corresponds to loads between range 1 and range 3, where the main processing circuit or the N basic processing circuits may perform the step of data type conversion together; and range 3 corresponds to heavy loads, where the N basic processing circuits may perform the step of data type conversion. Data type conversion may be performed explicitly. For instance, the main processing circuit can configure a special indication or instruction, when the basic processing circuits receive the special indication or instruction, the basic processing circuits determine to perform the step of data type conversion, and when the basic processing circuits do not receive the special indication or instruction, the basic processing circuits determine not to perform the step of data type conversion. Data type conversion may also be performed implicitly. For instance, when the basic processing circuits receive data of a floating point type and determine that an inner product computation needs to be performed, the basic processing circuits convert the type of the data into a fixed point type.

A method for realizing computations by using the apparatus shown in FIG. 1a is provided below. The method of computation may be a computation method of neural networks. For instance, a forward computation of a neural network and training of a neural network. In in certain applications, according to different input data, a forward computation may perform computations such as a matrix-multiply-matrix computation, a convolution computation, an activation computation, a transformation computation. All of the above-mentioned computations may be performed by using the apparatus of FIG. 1a.

A data type conversion circuit of the main processing circuit may first convert the type of data, then the control circuit may transfer the data to the basic processing circuits for computing. For instance, the data type conversion circuit of the main processing circuit may convert a floating point number to a fixed point number that has less bit width and transfer the fixed point number to the basic processing circuits. Technical effects of this method include that the bit width of data transferred may be reduced, the total count of bits being transferred may be reduced, the basic processing circuits may achieve better efficiency with less power consumption when perform bit width fixed point computations.

If data received by the basic processing circuits receive are floating point data, after the basic processing circuits receive the data, the data type conversion circuit may first perform data type conversion, then the basic processing circuits may perform computations. For instance, the basic processing circuits receive a floating point number transferred from the main processing circuit, the data type conversion circuit converts the floating point number to a fixed point number, then the inner product computing unit circuit, the vector computing unit circuit, or the accumulator circuit of the basic processing circuits perform computations. In this way, the computational efficiency may be improved, and the power consumption may be reduced.

After the basic processing circuits obtain results by computing, the results may first be subject to data type conversion and then be transferred to the main processing circuit. For instance, a computation result which is a floating point number that is obtained by the basic processing circuits is first converted into a fixed point number having a less bit width, then the fixed point number is transferred to the main processing circuit. Technical effects of this method include that the bit width during the transferring process may be reduced, and better efficiency with less power consumption may be realized.

The main processing circuit may transfer data that are to be computed to all or some of the basic processing circuits. Taking a matrix-multiply-vector computation as an instance, the control circuit of the main processing circuit may partition matrix data to obtain each column of the data and each row of the data for serving as basic data. For instance, a m*n matrix can be partitioned into n vectors each with m rows, and the control circuit of the main processing circuit may distribute the n vectors with m rows obtained by partitioning to the plurality of basic processing circuits. For a vector, the control circuit of the main processing circuit may broadcast the whole vector to each of the basic processing circuits. If the value of m is relatively large, the control circuit may first partition an m*n matrix into x*n vectors. Taking x=2 as an instance, specifically, the matrix may be partitioned into 2n vectors, where each vector includes m/2 rows. In other words, each vector of n vectors with m rows is divided into 2 vectors evenly. Taking a first row as an instance, if a first vector of the n vectors with m rows has 1000 rows, a way to partition the first vector into 2 vectors evenly may be making previous 500 rows as a first vector and subsequent 500 rows as a second vector, then the control circuit may broadcast the two vectors for twice to the plurality of basic processing circuits.

A method for the data transferring may be broadcasting or distributing, or any other possible transferring method. After receiving data, the basic processing circuits may perform computations to obtain computation results. The basic processing circuits may transfer the computation results to the main processing circuit. The computation results may be intermediate computation results, and may also be final computation results.

The present disclosure further provides a computation of a matrix-multiply vector that is performed by using the apparatus of FIG. 1a. (the matrix-multiply vector may be a vector obtained by: performing inner product computations between each row of a matrix and a vector, and placing the obtained results according to a corresponding order.)

Figure 2A:
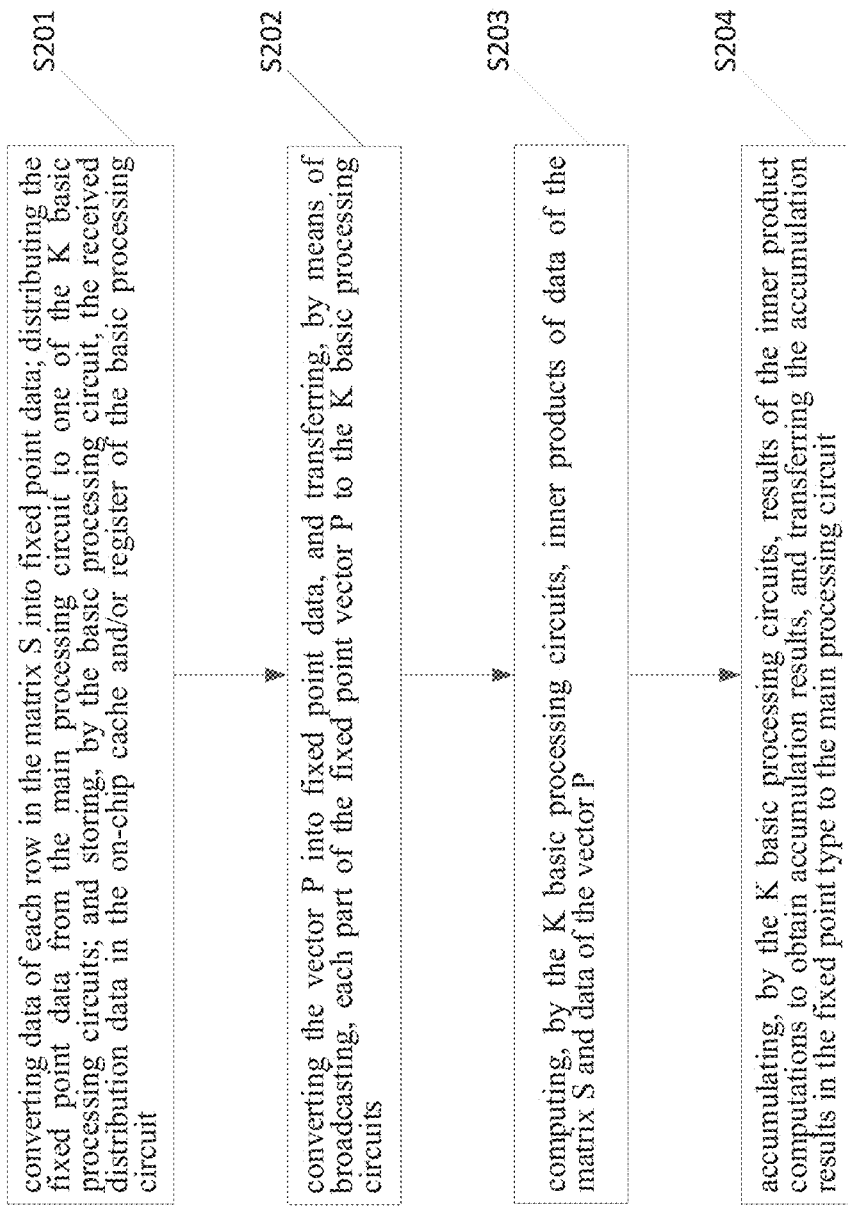
FIG. 2a is a flow chart of a matrix-multiply-vector computation.
Figure 2B:
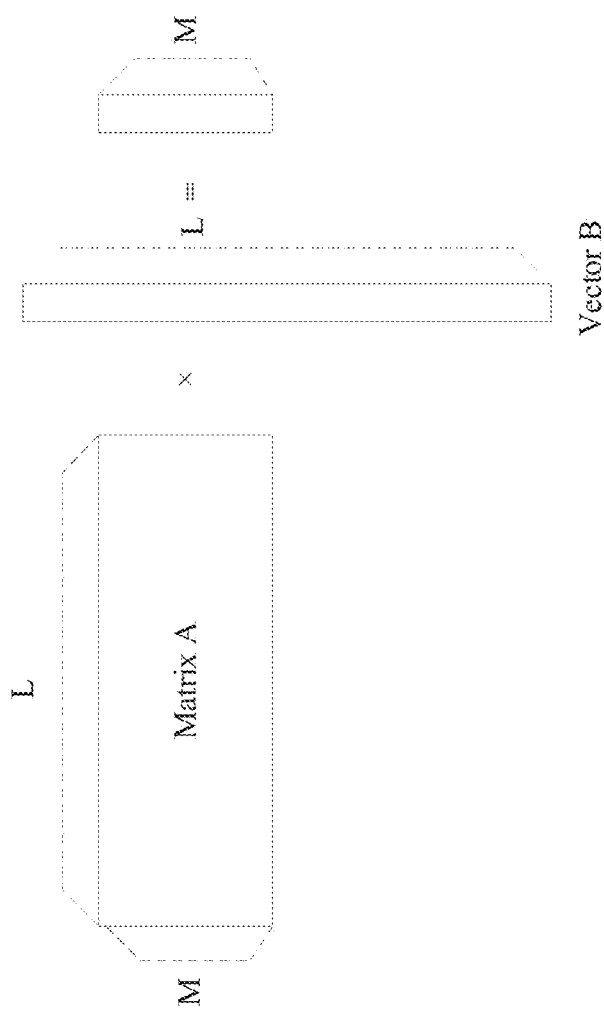
FIG. 2b is a schematic diagram of a matrix-multiply-vector computation.

Below is the description of performing multiplication of a matrix S with a size of M rows and L columns and a vector P with a length of L, which is shown in FIG. 2b (each row of the matrix S is as long as the vector P, and data of them are in one-to-one correspondence according to positions), the neural network computing apparatus has K basic processing circuits: referring to FIG. 2a, an implementation method of matrix-multiply-vector is provided, which may include: S201, converting, by the data type conversion circuit of the main processing circuit, data of each row in the matrix S into fixed point data; distributing, by the control circuit of the main processing circuit, the fixed point data to one of the K basic processing circuits; and storing, by the basic processing circuit, the received data in the on-chip cache and/or register of the basic processing circuit.

As an alternative example, M is the count of rows of the matrix S, if M<=K, the control circuit of the main processing circuit may distribute a row of the matrix S to the K basic processing circuits respectively. As an alternative example, M is the count of rows of the matrix S, if M>K, the control circuit of the main processing circuit may distribute data of one or a plurality of rows of the matrix S to each basic processing circuits respectively.

For instance, a set of rows of the matrix S that are distributed to an $i^{th}$ basic processing circuit may be referred to as Ai, which has Mi rows in total. FIG. 2d shows a computation to be performed by the $i^{th}$ basic processing circuit.

As an alternative example, for each basic processing circuit, such as in the $i^{th}$ basic processing circuit, the received data such as a matrix Ai which is transferred by means of distributing may be stored in the register and/or on-chip cache. Technical effects of the example include that data that are transferred during subsequent data distribution may be reduced, the computational efficiency may be improved, and the power consumption may be reduced.

The method may further include: S202, converting, by the data type conversion circuit of the main processing circuit, the vector P into fixed point data, and transferring by means of broadcasting, by the control circuit of the main processing circuit, each part of the vector P having a fixed point type to the K basic processing circuits.

As an alternative example, the control circuit of the main processing circuit may broadcast each part of the vector P for only once to the register or on-chip cache of each basic processing circuit, the $i^{th}$ basic processing circuit may fully reuse data of the vector P which is obtained at this time to complete an inner product computation corresponding to each row of the matrix Ai. Technical effects of the example include that the data of the vector P which are repeatedly transferred from the main processing circuit to the basic processing circuits may be reduced, the execution efficiency may be improved, and the power consumption for transferring may be reduced.

As an alternative example, the control circuit of the main processing circuit may sequentially broadcast each part of the vector P to the register or on-chip cache of each basic processing circuit, the $i^{th}$ basic processing circuit may not reuse data of the vector P which is obtained at each time, and may complete an inner product computation corresponding to each row of the matrix Ai at different times. Technical effects of the example include that the data of the vector P which is transferred at a single time in the basic processing circuits may be reduced, the capacity of the cache and/or register of the basic processing circuits may be reduced, the execution efficiency may be improved, the power consumption of transferring may be reduced, and the costs may be reduced.

As an alternative example, the control circuit of the main processing circuit may sequentially broadcast each part of the vector P to the register or on-chip cache of each basic processing circuit, the $i^{th}$ basic processing circuit may partly reuse data of the vector P which is obtained at each time to complete an inner product computation corresponding to each row of the matrix Ai. Technical effects of the example include that data that are transferred from the main processing circuit to the basic processing circuit may be reduced, data that are transferred within the basic processing circuits may be reduced, the execution efficiency may be improved, and the power consumption of transferring may be reduced.

The method may further include: S203, computing, by the inner product computing unit circuit of the K basic processing circuits, an inner product of the matrix S and the vector P, for instance, computing, by the $i^{th}$ basic processing circuit, an inner product of the data of matrix Ai and the data of the vector P; and S204, accumulating, by the accumulator circuit of the K basic processing circuits, a result of the inner product computation to obtain an accumulation result, and transferring the accumulation result in a fixed point type to the main processing circuit.

As an alternative example, a partial sum obtained from the inner product computation performed each time by the basic processing circuits may be transferred to the main processing circuit for accumulating (the partial sum refers to part of the accumulation result, for instance, if the accumulation result is F1*G1+F2*G2+F3*G3+F4*G4+F5*G5, the partial sum may be the value of F1*G1+F2*G2+F3*G3). Technical effects of the example include that computations performed within the basic processing circuits may be reduced, and the computational efficiency of the basic processing circuits may be improved.

In an alternative example, a partial sum obtained from the inner product computation performed each time by the basic processing circuits may be stored in the on-chip cache and/or the register of the basic processing circuits, and transferred to the main processing circuit after the accumulation ends. Technical effects of the example include that data which are transferred between the basic processing circuits and the main processing circuit may be reduced, the computational efficiency may be improved, and the power consumption of data transferring may be reduced.

As an alternative example, a partial sum obtained from the inner product computation performed each time by the basic processing circuits may also, in some cases, be stored in the on-chip caching circuit and/or the register of the basic processing circuits for accumulating, and in some cases, be transferred to the main processing circuit for accumulating, then be transferred to the main processing circuit after the accumulation ends. Technical effects of the example include that data which are transferred between the basic processing circuits and the main processing circuit may be reduced, the computational efficiency may be improved, the power consumption of data transferring may be reduced, computations performed within the basic processing circuits may be reduced, and the computational efficiency of the basic processing circuits may be improved.

Figure 2C:
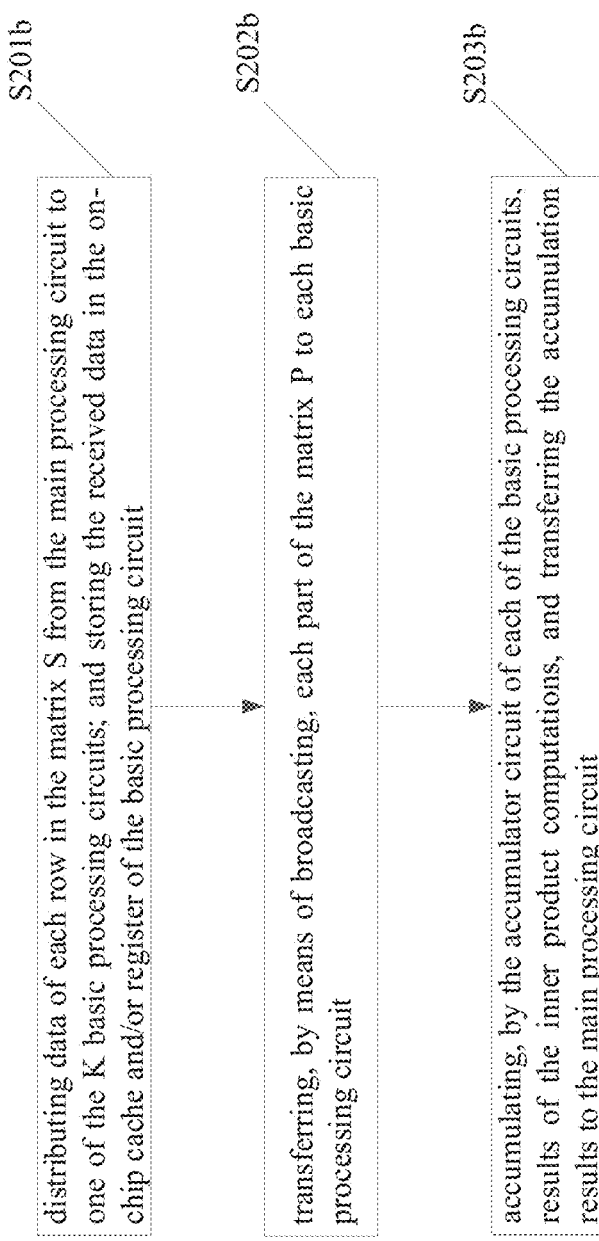
FIG. 2c is a flow chart of a matrix-multiply-matrix computation.
Figure 2D:
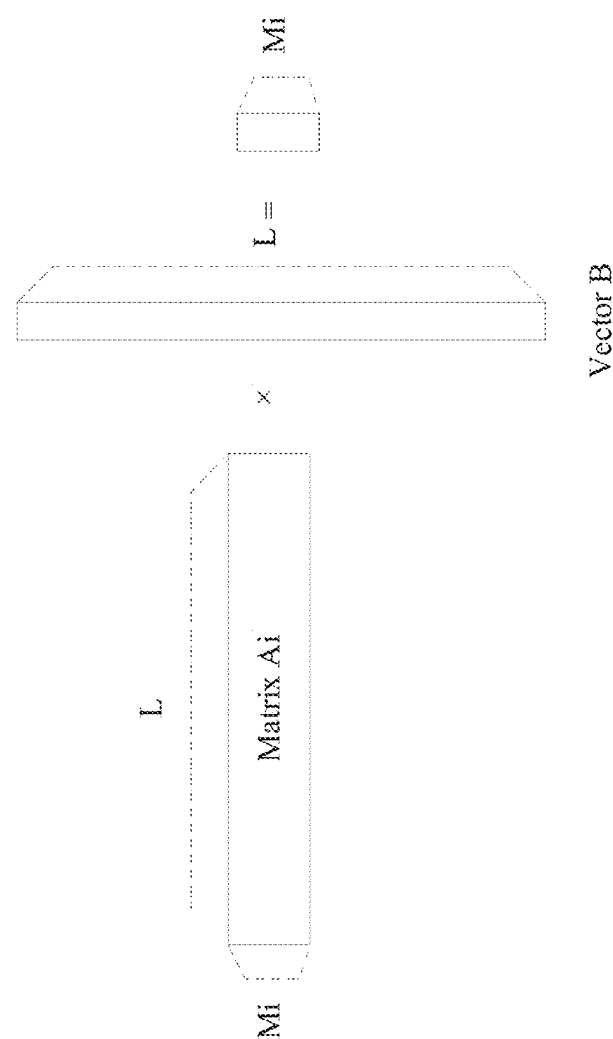
FIG. 2d is a schematic diagram showing a matrix Ai being multiplied by a vector B.

FIG. 2c is a flow chart of using the apparatus of FIG. 1a to perform a matrix-multiply-matrix computation.

Figure 2E:
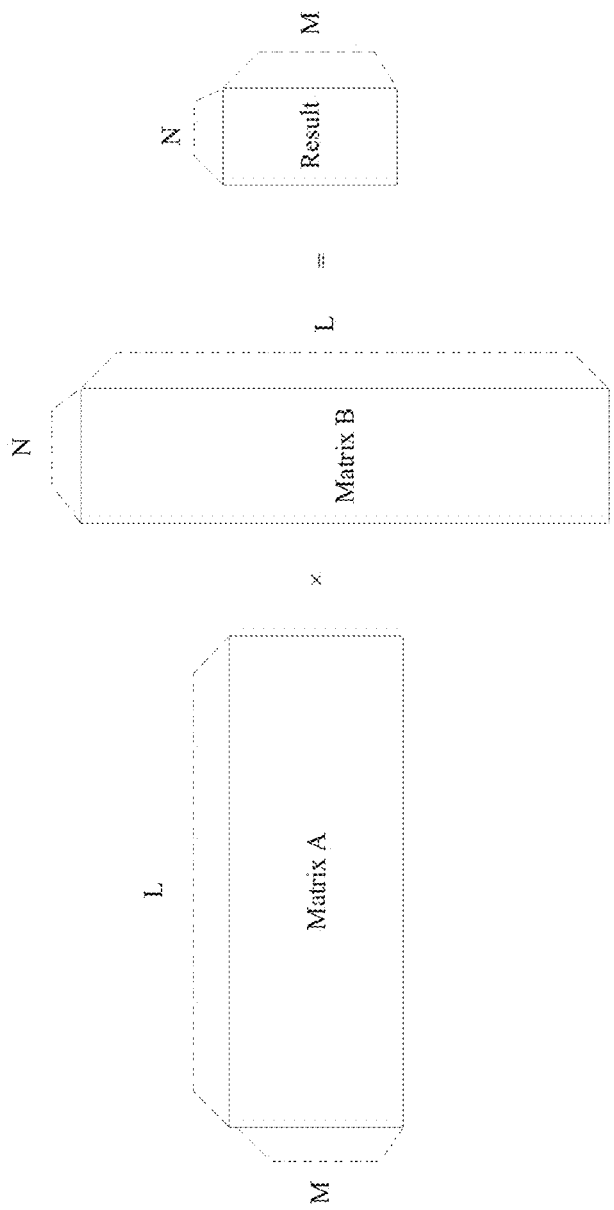
FIG. 2e is a schematic diagram showing a matrix A being multiplied by a vector B.

Below is a description of performing multiplication of a matrix S with a size of M rows and L columns and a matrix P with a size of L rows and N columns (each row of the matrix S is as long as each column of the matrix P, which is as shown in FIG. 2e), and the neural network computing apparatus has K basic processing circuits: the method may further include: S201b, distributing, by the control circuit of the main processing circuit, data of each row in the matrix S to one of the K basic processing circuits; and storing, by the basic processing circuit, the received data in the on-chip cache and/or register. As an alternative example, M is the count of rows of the matrix S, if M<=K, the control circuit of the main processing circuit may distribute a row of the matrix S to M basic processing circuits respectively. As an alternative example, M is the count of rows of the matrix S, if M>K, the control circuit of the main processing circuit may distribute data of one or a plurality of rows of the matrix S to each basic processing circuits respectively.

Figure 2F:
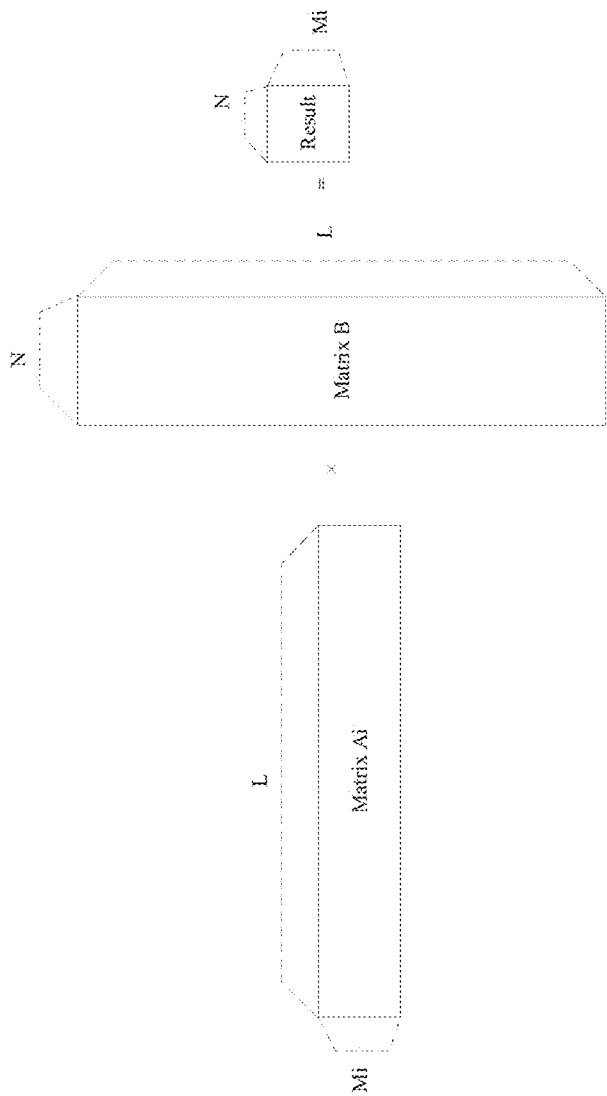
FIG. 2f is a schematic diagram showing a matrix Ai being multiplied by a matrix B.

In a case where Mi rows of the matrix S are distributed to an $i^{th}$ basic processing circuit, a set of the Mi rows can be referred to as Ai. FIG. 2f shows a computation to be performed by the $i^{th}$ basic processing circuit.

As an alternative example, in each of the basic processing circuits, for instance, in the $i^{th}$ basic processing circuit: the matrix Ai distributed by the main processing circuit may be received and stored in the register and/or on-chip cache of the $i^{th}$ basic processing circuit. Technical effects of the example include that data that are transferred afterwards may be reduced, the computational efficiency may be improved, and the power consumption may be reduced.

The method may further include: S202b, transferring by means of broadcasting, by the control circuit of the main processing circuit, each part of the matrix P to each basic processing circuits.

As an alternative example, each part of the matrix P may be broadcast for only once to the register or on-chip cache of each basic processing circuit, the $i^{th}$ basic processing circuit may fully reuse data of the matrix P which is obtained at this time to complete an inner product computation corresponding to each row of the matrix Ai. The reusing mentioned in the example may be repeatedly using data by the basic processing circuits during computation, for instance, reusing data of the matrix P may be using the data of the matrix P for a plurality of times.

As an alternative example, the control circuit of the main processing circuit may sequentially broadcast each part of the matrix P to the register or on-chip cache of each basic processing circuit, the $i^{th}$ basic processing circuit may not reuse the data of the matrix P which is obtained at each time, and may complete an inner product computation corresponding to each row of the matrix Ai at different times.

As an alternative example, the control circuit of the main processing circuit may sequentially broadcast each part of the matrix P to the register or on-chip cache of each basic processing circuit, the $i^{th}$ basic processing circuit may partially reuse the data of the matrix P which is obtained at each time to complete an inner product computation corresponding to each row of the matrix Ai. In an alternative example, each of the basic processing circuits, for instance, the $i^{th}$ basic processing circuit, may compute an inner product of the data of the matrix Ai and the data of the matrix P.

The method may include Step S203b: accumulating, by the accumulator circuit of each of the basic processing circuits, a result of the inner product computation, and transferring an accumulation result to the main processing circuit.

As an alternative example, the basic processing circuits may transfer a partial sum obtained from each inner product computation to the main processing circuit for accumulating. In an alternative example, a partial sum obtained from the inner product computation performed each time by the basic processing circuits may be stored in the on-chip caching circuit and/or the register of the basic processing circuits, and transferred to the main processing circuit after the accumulation ends. As an alternative example, a partial sum obtained from the inner product computation performed each time by the basic processing circuits may also, in some cases, be stored in the on-chip caching circuit and/or the register of the basic processing circuits for accumulating, and in some cases, be transferred to the main processing circuit for accumulating, then be transferred to the main processing circuit after the accumulation ends.

Figure 3A:
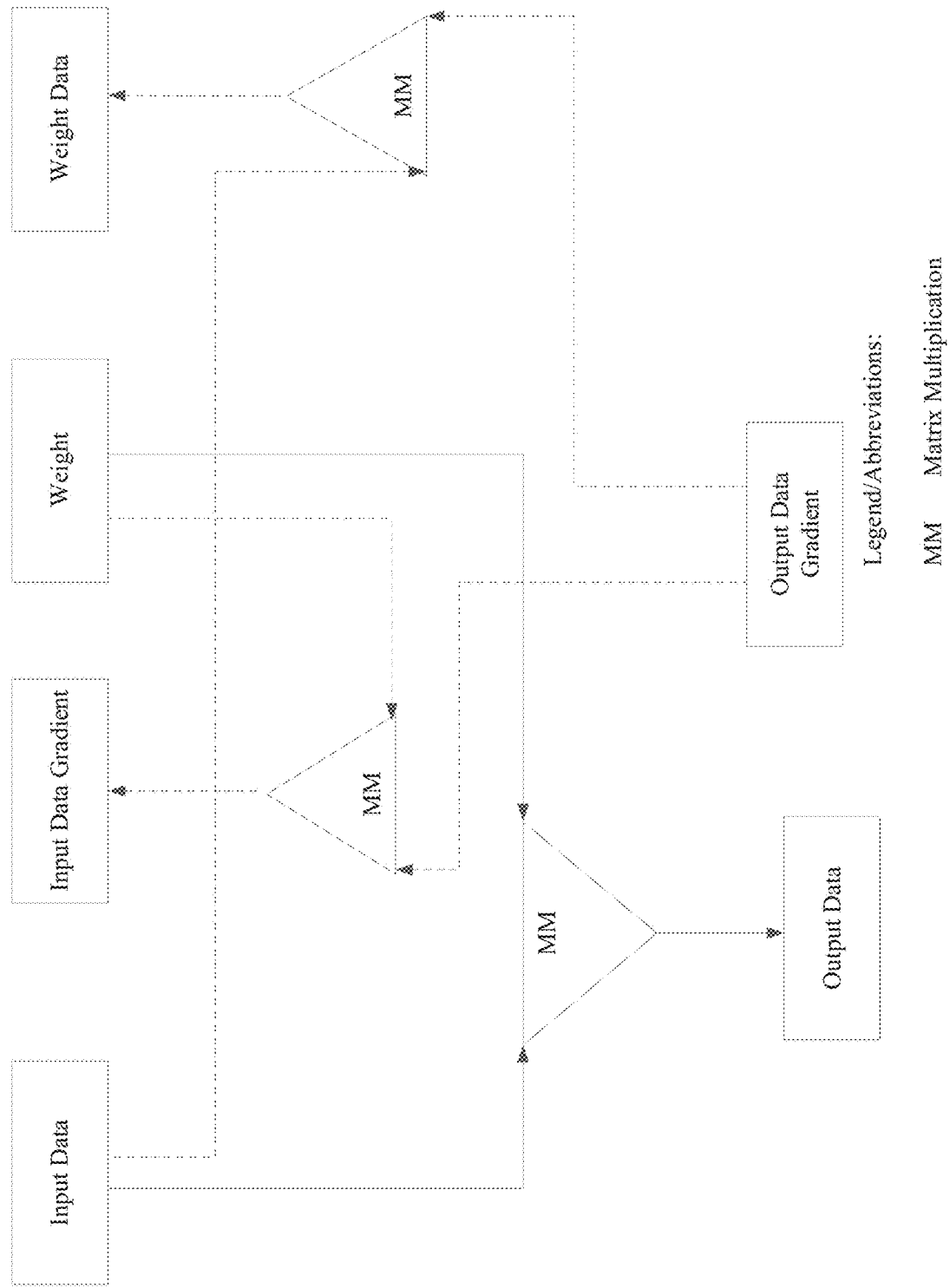
FIG. 3a is a schematic diagram of neural network training.

FIG. 3a shows a fully connected computation performed by using the apparatus of FIG. 1a: if input data of a fully connected layer is a vector (in other words, a case when input of a neural network is a single sample), a weight matrix of the fully connected layer serves as the matrix S, an input vector serves as the vector P, a matrix-multiply-vector computation as shown in FIG. 2a may be performed by following the method one of the apparatus.

If the input data of the fully connected layer is a matrix (in other words, a case when the input of the neural network is a plurality of samples serving as a batch), the weight matrix of the fully connected layer serves as the matrix S, the input vector serves as the matrix P, or the weight matrix of the fully connected layer serves as the matrix P, and the input vector serves as the matrix S. A matrix-multiply-matrix computation as shown in FIG. 2d may be performed by following the method of the apparatus.

Figure 3B:
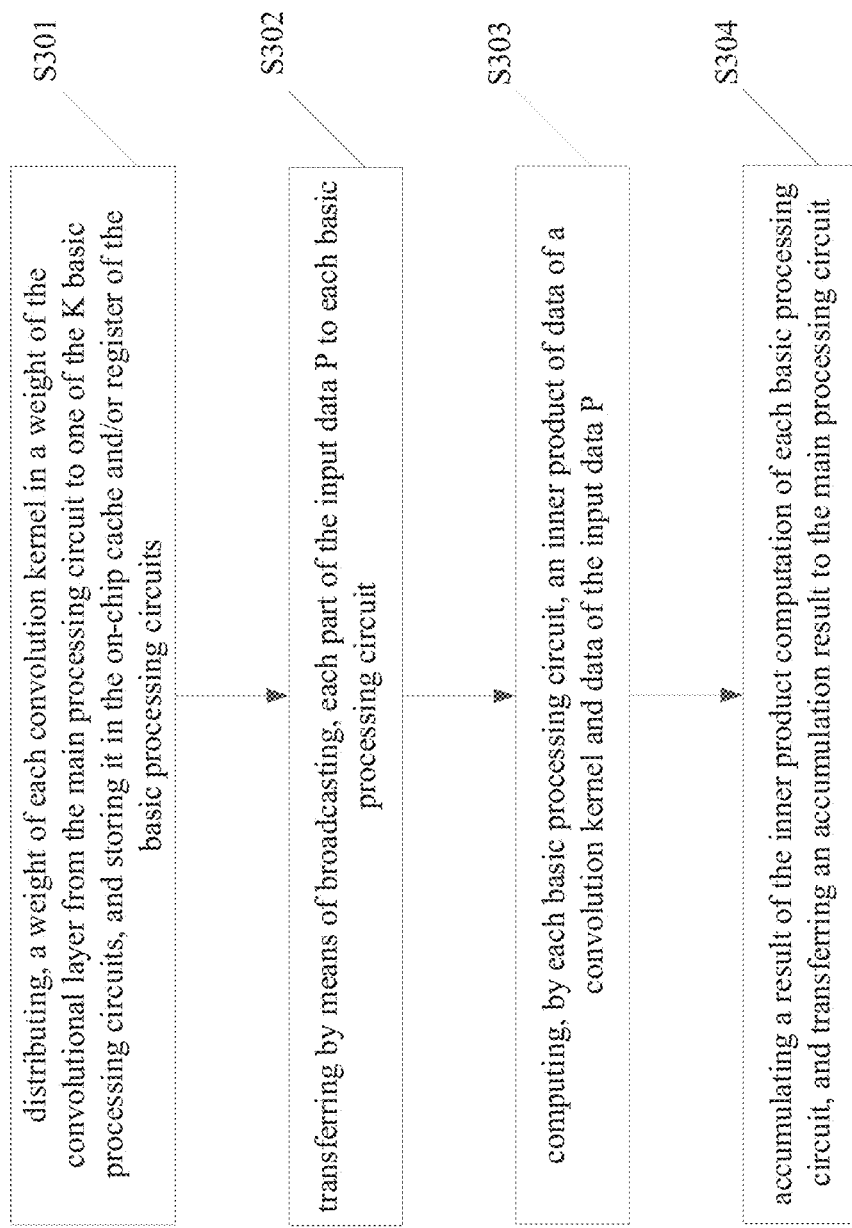
FIG. 3b is a schematic diagram of a convolution computation.

FIG. 3b is a flow chart of using the apparatus of FIG. 1a to perform a convolution computation: for a convolutional layer, let a count of convolution kernels of the layer be M; the method may further include S301: distributing, by the control circuit of the main processing circuit, a weight of each convolution kernel in a weight of the convolutional layer to one of the K basic processing circuits, and storing it in the on-chip cache and/or register of the basic processing circuits. As an alternative example, if the count of the convolution kernels M<=K, the control circuit of the main processing circuit may distribute a weight of a convolution kernel to M basic processing circuits respectively. As an alternative example, if the count of the convolution kernels M>K, the control circuit of the main processing circuit may distribute weights of one or a plurality of convolution kernels to each basic processing circuits respectively.

Mi convolution kernels are distributed to an $i^{th}$ basic processing circuit in total, and a set of the Mi convolution kernels is referred to as Ai.

As an alternative example, in each of the basic processing circuits, for instance, in the $i^{th}$ basic processing circuit: storing the convolution kernel weights Ai distributed by the main processing circuit in the register and/or on-chip cache.

The method may further include: S302, transferring by means of broadcasting, by the control circuit of the main processing circuit, each part of the input data P to each basic processing circuit. As an alternative example, the control circuit of the main processing circuit may broadcast each part of the input data P for only once to the register or on-chip cache of each basic processing circuit, the $i^{th}$ basic processing circuit may fully reuse data of the input data P which is obtained at this time to complete an inner product computation corresponding to each convolution kernel of the Ai. As an alternative example, the control circuit of the main processing circuit may sequentially broadcast each part of the input data P to the register or on-chip cache of each basic processing circuit, the $i^{th}$ basic processing circuit may not reuse the data of the input data P which is obtained at each time, and may complete an inner product computation corresponding to each convolution kernel of the Ai at different times. As an alternative example, the control circuit of the main processing circuit may sequentially broadcast each part of the input data P to the register or on-chip cache of each basic processing circuit, the $i^{th}$ basic processing circuit may partially reuse the data of the input data P which is obtained at each time to complete an inner product computation corresponding to each convolution kernel of the Ai.

The method may further include: S303, computing, by each basic processing circuit, an inner product of a convolution kernel and the input data P, for instance, computing, by the $i^{th}$ basic processing circuit, an inner product of each convolution kernel of the Ai and the data of the input data P; S304: accumulating, by the accumulator circuit of each basic processing circuit, a result of the inner product computation, and transferring an accumulation result to the main processing circuit. As an alternative example, the basic processing circuits may transfer a partial sum obtained from each inner product computation to the main processing circuit for accumulating. In an alternative example, the basic processing circuits may store a partial sum obtained from the inner product computation performed each time in the on-chip cache and/or register of the basic processing circuits, and transfer to the main processing circuit after the accumulation ends. As an alternative example, in some cases, the basic processing circuits may also store a partial sum obtained from the inner product computation performed each time in the on-chip cache and/or the register of the basic processing circuits for accumulating, and in some cases, transfer to the main processing circuit for accumulating, and then transfer to the main processing circuit after the accumulation ends.

Alternatively, the present disclosure further provides a method of using the apparatus shown in FIG. 1a to update a weight, including: using the vector computing unit circuit of the main processing circuit to realize a function of weight updating during neural network training, specifically, the weight updating refers to a method of using a gradient of the weight to update the weight.

In an alternative example, the vector computing unit circuit of the main processing circuit may be used to perform addition and subtraction computations on the weight and the gradient of the weight, which are two vectors, to obtain a computation result, and the computation result is an updated weight.

In an alternative example, the vector computing unit circuit of the main processing circuit may be used to perform addition and subtraction computations on the weight and the gradient of the weight, which are two vectors, to obtain a computation result, and the computation result is an updated weight.

Figure 4A:
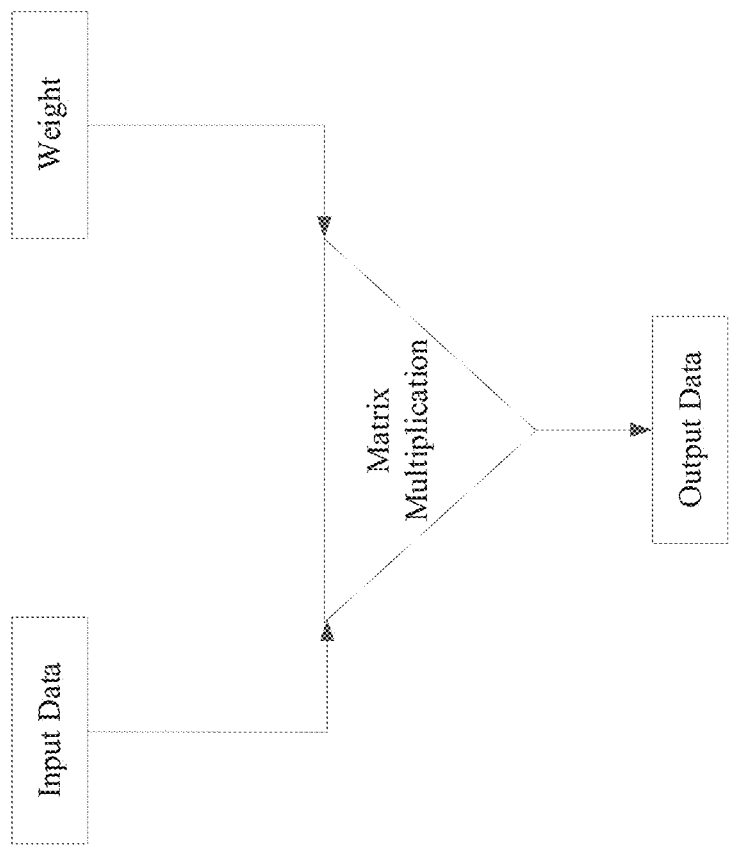
FIG. 4a is a schematic diagram of a forward computation of a neural network.
Figure 4B:
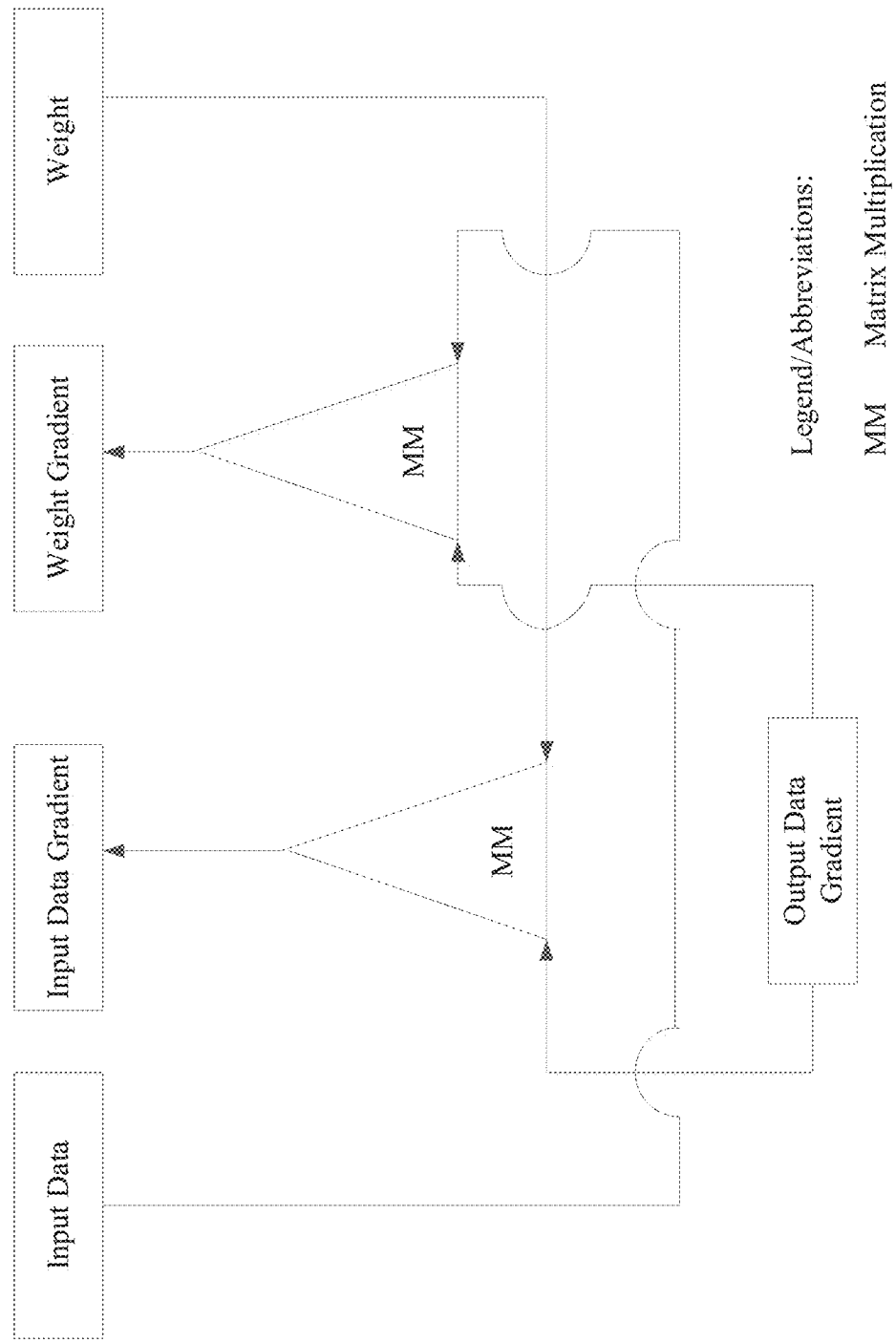
FIG. 4b is a schematic diagram of a back computation of a neural network.

In an alternative example, the gradient of the weight may first be used for computing to obtain a group of momentum, then the momentum and the weight may be used to perform addition and subtraction computations to obtain an updated weight; alternatively, the present disclosure may further include a method of using the apparatus shown in FIG. 1a to realize a back computation of a fully connected layer: the back computation of the fully connected layer may be divided into two parts, as shown in FIG. 4a, an arrow with continuous line represents a process of a forward computation of the fully connected layer, and FIG. 4b shows a process of back computation of the fully connected layer.

The back computations of the fully connected layer as shown in FIG. 4a and FIG. 4b may be performed by using the apparatus of FIG. 1a and the matrix-multiply-matrix method of FIG. 2c.

Alternatively, the present disclosure may further include using the apparatus of FIG. 1a to perform a back operation of a convolutional layer. The back computation of the convolutional layer may be divided into two parts, as shown in FIG. 5a, an arrow with continuous line represents a process of a forward computation of the convolutional layer, and FIG. 5b shows a process of the back computation of the convolutional layer.

Figure 5A:
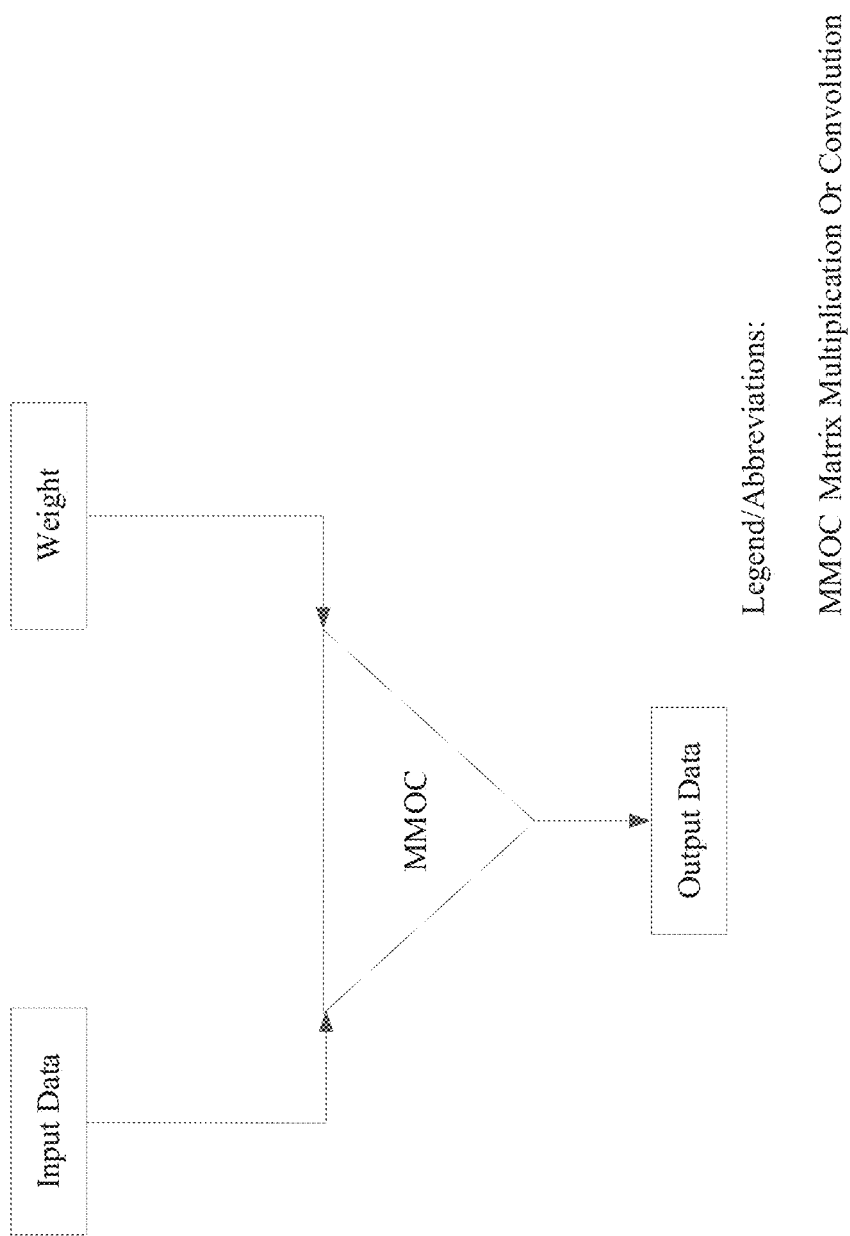
FIG. 5a is a schematic diagram of another forward computation of a neural network.
Figure 5B:
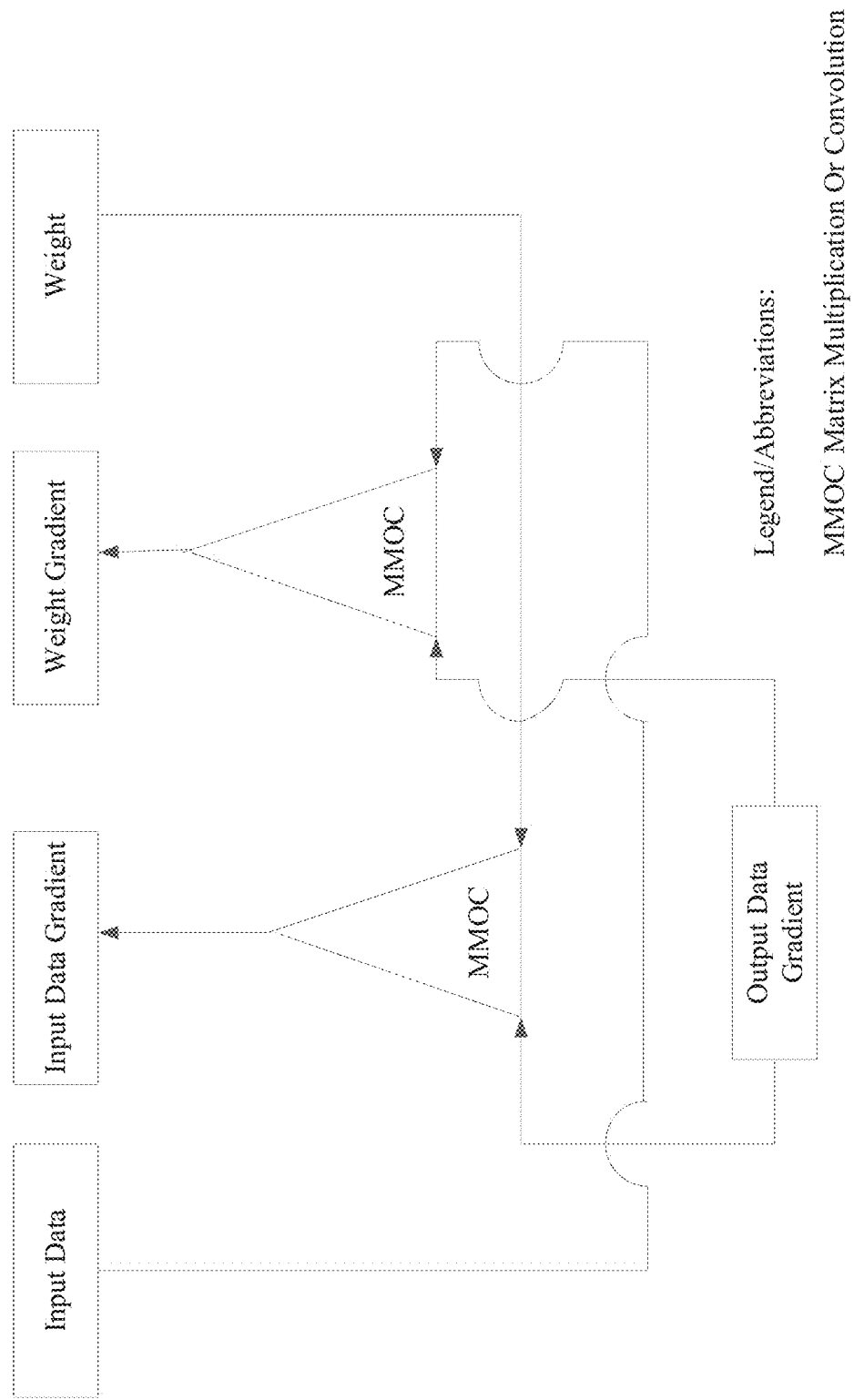
FIG. 5b is a schematic diagram of another back computation of a neural network.

The back computations of the convolutional layers as shown in FIG. 5a and FIG. 5b may be performed by using the apparatus of FIG. 1a and the method of FIG. 3b.

Alternatively, the present disclosure may further include a method of using the apparatus shown in FIG. 1a to realize a BLAS (Basic Linear Algebra Subprograms) function:

A GEMM computation refers to a computation of matrix-matrix multiplication in a BLAS library. A common representation of the computation is C=alpha*op(S)*op(P)+beta*C, where S and P are two input matrices, C is an output matrix, alpha and beta are scalars, op represents an operation performed on the matrix S or P, in addition, other supporting integers may be used as parameters to explain the width and height of the matrices S and P; alternatively, the present disclosure may further include a step of using the apparatus shown in FIG. 1a to realize the GEMM computation, including: performing, by the data type conversion circuit of the main processing circuit, data type conversion on the matrix S and the matrix P; performing, by the conversion circuit of the main processing circuit, corresponding op operation on the matrix S and the matrix P respectively; as an alternative example, op may be a matrix transposition operation; the matrix transposition circuit of the main processing circuit may be used to realize the matrix transposition operation. In an alternative example, after the op operation of the matrix S and the matrix P is performed, the data type conversion circuit of the main processing circuit may perform data type conversion operation. In other words, the data type conversion circuit may convert the data types of op(S) and op(P) from floating point data into fixed point data, then perform a matrix multiplication computation as shown in FIG. 2c.

As an alternative example, op of a matrix may be null, and the op operation may not be performed. The apparatus of FIG. 1a and the matrix-multiply-matrix computation method of FIG. 2c may be used to perform a matrix multiplication computation between op(S) and op(P); the arithmetic and logic unit of the main processing circuit may be used to perform an operation of multiplying each value in a result of op(S)*op(P) by alpha. As an alternative example, in case when alpha is 1, the operation of multiplying by alpha may not be performed; the arithmetic and logic unit of the main processing circuit may be used to realize a computation of beta*C. As an alternative example, in case when beta is 1, the operation of multiplying by beta may not be performed. The vector computing unit circuit of the main processing circuit may be used to realize a step of adding corresponding positions of matrices alpha*op(S)*op(P) and beta*C to obtain a result of a GEMM computation.

As an alternative example, in case when beta is 0, the operation may not be performed. A GEMV computation refers to a computation of matrix-vector multiplication in a BLAS library. A common representation of the computation is C=alpha*op(S)*P+beta*C, where S is an input matrix, P is an input vector, C is an output vector, alpha and beta are scalars, and op represents an operation performed on the matrix S. Alternatively, the present disclosure may further include a step of using the apparatus shown in FIG. 1a to realize the GEMV computation, including: performing, by the data type conversion circuit of the main processing circuit, data type conversion on the input matrix S and the input matrix P; performing, by the conversion circuit of the main processing circuit, a corresponding op operation on the input matrix S. In an alternative example, op may be a matrix transposition operation, and the conversion circuit of the main processing circuit may be used to realize the matrix transposition operation. In an alternative example, when op of a matrix can be null, the transposition operation of the matrix may not be performed.

Furthermore, the apparatus of FIG. 1a and the matrix-multiply-vector computation method of FIG. 2b may be used to perform a matrix-vector multiplication computation between the matrix op(S) and the vector P. Specifically, the arithmetic and logic unit of the main processing circuit may be used to perform an operation of multiplying each value in a result of op(S)*P by alpha. In an alternative example, when alpha is 1, the operation of multiplying by alpha may not be performed; the arithmetic and logic unit of the main processing circuit may be used to perform a computation of beta*C. As an alternative example, in case when beta is 1, the operation of multiplying by beta may not be performed; and the vector computing unit circuit of the main processing circuit may be used to realize a step of adding corresponding positions of matrices alpha*op(S)*P and beta*C to obtain a result of GEMV. As an alternative example, in case when beta is 0, the operation of adding may not be performed.

Alternatively, the present disclosure may further include a method of using the apparatus shown in FIG. 1a to realize an activation function, where the method may include: inputting a vector by using the activation circuit of the main processing circuit, and obtaining an activation vector of the vector by computing. In an alternative example, the activation circuit of the main processing circuit may obtain a numerical value for each value of an input vector through an activation function (input of the activation function is a numerical value, and output is also a numerical value) by computing, and output the numerical value to a corresponding position of an output vector. In an alternative example, the activation function may be: y=max(m, x), where x is an input numerical value, y is an output numerical value, and m is a constant. In an alternative example, the activation function may be: y=tanh(x), where x is an input numerical value, and y is an output numerical value. In an alternative example, the activation function may be: y=sigmoid(x), where x is an input numerical value, y is an output numerical value. In an alternative example, the activation function may be a piecewise linear function; and in an alternative example, the activation function may be a function of randomly inputting a number and outputting a number.

In an alternative example, a source of the input vector may include (but is not limited to): an external data source of the apparatus. In an alternative example, the input data may be from a computation result of matrix-multiply-vector performed by the apparatus. In an alternative example, the input data may be from a computation result of matrix-multiply-matrix performed by the apparatus, or a computation result of the main processing circuit of the apparatus; and in an alternative example, the input data may be from a computation result obtained after the main processing circuit of the apparatus is biased.

It should be explained that the activation operation may be realized by the arithmetic and logic unit and the accumulator circuit of the main processing circuit, and may also be realized by adding an activation circuit separately to the main processing circuit.

Alternatively, the present disclosure may further use the apparatus shown in FIG. 1a to realize a computation of giving a bias: the vector computing unit circuit of the main processing circuit may be used to realize a function of adding two vectors together or adding two matrices together. The vector computing unit circuit of the main processing circuit may be used to realize a function of adding a vector to each row of a matrix, or to each column of a matrix.

In an alternative example, the matrix may be from a result of a matrix-multiply-matrix computation performed by the apparatus.

In an alternative example, the matrix may be from a result of a matrix-multiply-vector computation performed by the apparatus.

In an alternative example, the matrix may be from data received from the external by the main processing circuit of the apparatus.

In an alternative example, the vector may be from data received from the external by the main processing circuit of the apparatus.

In the example of the present disclosure, data sources of the matrix and/or the vector may include but is not limited to the above-mentioned data sources.

Alternatively, the present disclosure may further use the apparatus shown in FIG. 1a to realize data type conversion: specifically, the data type conversion circuit of the main processing circuit may be used to realize data type conversion.

In an alternative example, the data type conversion circuit of the main processing circuit may be used to realize data type conversion of a group of data. In an alternative example, a form of data type conversion may include but is not limited to: converting a floating point number to a fixed point number, converting a fixed point number to a floating point number, and the like.

The present disclosure further provides a chip. The chip may include a computing apparatus, where the computing apparatus may include a main processing circuit and a plurality of basic processing circuits.

Data involved in the main processing circuit may be data of any data type. In an alternative example, it may be data represented by a floating point number of any bit width, or data represented by a fixed point number of any bit width.

All computational circuits and storage circuits that are involved may be computational circuits and storage circuits that are capable of processing data of any type. In an alternative example, they may be computational circuits and storage circuits for a floating point number of any bit width, or computational circuits and storage circuits for a fixed point number of any bit width.

In an alternative example, the main processing circuit may include a data type conversion circuit.

In an alternative example, the main processing circuit may include a vector computing unit. Further, the main processing circuit may further include a data input interface that is configured to receive input data.

In an alternative example, a source of the received data may be: the external of the neural network computational circuit apparatus, or some or all of the basic processing circuits of the neural network computational circuit apparatus.

In an alternative example, the data input interface may be plural. Specifically, the main processing circuit may further include a data output interface of output data.

In an alternative example, the output data may be transferred to: the external of the neural network computational circuit apparatus, or some or all of the basic processing circuits of the neural network computational circuit apparatus.

In an alternative example, the data output interface may be plural.

In an alternative example, the main processing circuit may include an on-chip cache and/or register.

In an alternative example, the main processing circuit may include a computing unit that is configured to perform data computations.

In an alternative example, the main processing circuit may include an arithmetic computing unit.

In an alternative example, the main processing circuit may include a vector computing unit that can perform computations on a group of data simultaneously. Specifically, the arithmetic computation and/or vector computation may be computations of any type which may include but is not limited to: addition, subtraction, multiplication, and division between two numbers; addition, subtraction, multiplication, and division between a number and a constant; exponential computations, power computations, logarithm computations, and various nonlinear computations performed on a number; comparison computations and logical computations performed on two numbers; and the like. The arithmetic computation and/or vector computation may further be: addition, subtraction, multiplication, and division between two vectors; addition, subtraction, multiplication, and division between each element in a vector and a constant; exponential computations, power computations, logarithm computations, and various nonlinear computations performed on each element in a vector; comparison computations and logical computations performed on every two corresponding elements in a vector, and the like.

In an alternative example, the main processing circuit may include a data rearrangement unit that is configured to transfer data to the basic processing circuits by following a certain order, or rearrange data in situ by following a certain order.

In an alternative example, the order for data arrangement may include: changing the order of dimensions of a multi-dimensional data block; and the order for data arrangement may further include: partitioning a data block so as to send to different basic processing circuits.

The computing apparatus may further include a plurality of basic processing circuits, where each basic processing circuit may be configured to obtain an inner product of two vectors by computing, and a method of computing may be: receiving, by a basic processing circuit, two groups of numbers, multiplying elements in the two groups of numbers correspondingly, and accumulating the results of multiplication; and outputting the result of the inner product, where the result may be output according to the position of the basic processing circuit, may be transferred to another basic processing circuit, and may also be transferred directly to the main processing circuit.

Data involved in the basic processing circuits may be data of any data type. In an alternative example, it may be data represented by a floating point number of any bit width, or data represented by a fixed point number of any bit width. All computational circuits and storage circuits that are involved may be computational circuits and storage circuits that are capable of processing data of any type. In an alternative example, they may be computational circuits and storage circuits for a floating point number of any bit width, or computational circuits and storage circuits for a fixed point number of any bit width.

In an alternative example, a basic processing circuit may include a data type conversion circuit.

In an alternative example, a basic processing circuit may include a vector computing unit that is configured to perform data type conversion. Further, a basic processing circuit may further include a storage unit composed of an on-chip cache and/or register. Still further, a basic processing circuit may further include one or more data input interfaces that are configured to receive data.

In an alternative example, a basic processing circuit may include two data input interfaces, and one or a plurality of data may be obtained respectively from the two data input interfaces at each time. In an alternative example, a basic processing circuit may receive input data from the data input interfaces, and store the input data in the register and/or on-chip cache; and a source of data received by the data input interfaces may be: other basic processing circuits and/or the main processing circuit.

The main processing circuit of the neural network computing computational circuit apparatus, the other basic processing circuits of the neural network computational circuit apparatus (the neural network computational circuit apparatus may have a plurality of basic processing circuits) may be a neural network computational circuit apparatus including one or a plurality of data output interfaces that are configured to transfer output data.

In an alternative example, the neural network computational circuit apparatus may transfer one or a plurality of data via the data output interface. Specifically, data transferred via the data output interface may be one or more of: data received from the data input interface, data stored in the on-chip cache and/or register, a computation result of multiplier, a computation result of accumulator, or a computation result of inner product computing unit.

In an alternative example, the neural network computational circuit apparatus may include three data output interfaces, where two data output interfaces may correspond to the two data input interfaces, and a third data output interface may be configured to output computation results. Specifically, the above-mentioned data sources and where data may be transferred may determine a connection of the basic processing circuits in the neural network computational circuit apparatus.

Alternatively, the main processing circuit of the neural network computing computational circuit apparatus, the other basic processing circuits of the neural network computational circuit apparatus (the neural network computational circuit apparatus may have a plurality of basic processing circuits) may include an arithmetic computational circuit, where the arithmetic computational circuit may be one or more of: one or a plurality of multiplier circuits, one or a plurality of accumulator circuits, and one or a plurality of circuits that are configured to perform inner product computations of two groups of numbers.

In an alternative example, the multiplier circuit may be configured to perform multiplication of two numbers, a result of the multiplication may be stored in the on-chip cache and/or register, and may also be accumulated in the register and/or the on-chip cache.

In an alternative example, the arithmetic computational circuit may be configured to perform inner product computations of two groups of data, a result of the computations may be stored in the on-chip cache and/or register, and may also be accumulated in the register and/or the on-chip cache. In an alternative example, the accumulator circuit may be configured to perform accumulation computations of data, and the data may also be accumulated in the register and/or the on-chip cache. Specifically, data accumulated in the accumulator circuit may be one or more of: data received from the data input interface, data stored in the on-chip cache and/or register, a computation result of multiplier, a computation result of accumulator, or a computation result of inner product computing unit.

It should be explained that the "data input interface" and "data output interface" used in the description of the basic processing circuits refer to a data input interface and a data output interface of each basic processing circuit, rather than a data input interface and a data output interface of the whole apparatus.

Figure 1E:
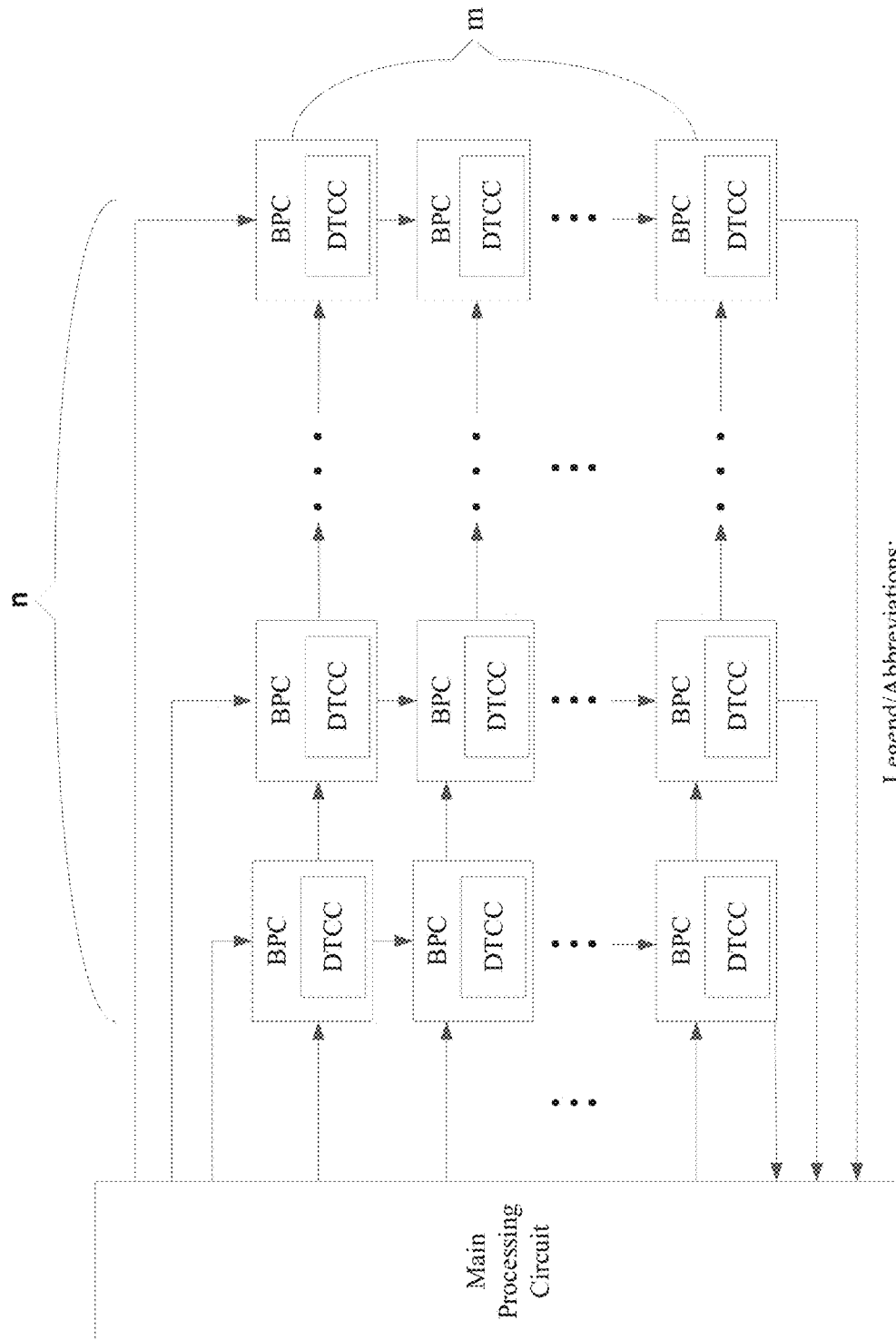
FIG. 1e is a structural diagram of integrated circuit chip apparatus.

Referring to FIG. 1e which shows integrated circuit chip apparatus provided by the present disclosure, the integrated circuit chip apparatus may include: a main processing circuit and a plurality of basic processing circuits, where the plurality of basic processing circuits are arranged in a form of array (an m*n array), the value range of m and n is an integer greater than or equal to 1, and at least one of m and n is greater than or equal to 2. For the plurality of basic processing circuits that are arranged in the form of m*n array, each basic processing circuit may be connected to an adjacent basic processing circuit, and the main processing circuit may be connected to k basic processing circuits of the plurality of basic processing circuits, where the k basic processing circuits may be: n basic processing circuits in a first row, n basic processing circuits in an $m^{th}$ row, and/or m basic processing circuits in a first column. In the integrated circuit chip apparatus shown in FIG. 1e, the main processing circuit and/or the plurality of basic processing circuits may include a data type conversion circuit, and specifically, some basic processing circuits of the plurality of basic processing circuits may include a data type conversion circuit. For instance, in an alternative example, the k basic processing circuits may be configured with a data type conversion circuit. In this way, the n basic processing circuits may perform a step of data type conversion on data of the m basic processing circuits of a current column. This configuration may improve computational efficiency and reduce power consumption. For the n basic processing circuits in the first row, since they are the first to receive data sent from the main processing circuit, by converting the received data into fixed point data, computations performed by subsequent basic processing circuits and data transferred by the subsequent basic processing circuits may be reduced. Similarly, configuring the m basic processing circuits of the first column with a data type conversion circuit may also have a technical effect of fewer computations and less power consumption. In addition, according to the structure, the main processing circuit may use a dynamic data transferring strategy. For instance, the main processing circuit may broadcast data to the m basic processing circuits of the first column, and distribute data to the n basic processing circuits of the first row. A technical effect of the example is that by transferring different data to the basic processing circuits via different data input ports, the basic processing circuit may know the type of data merely according to a receiving port of the data without the need of distinguishing the type of the received data.

The main processing circuit may be configured to perform neural network computations in series, and transfer data to the basic processing circuits that are connected to the main processing circuit; and the computations may include but is not limited to: accumulation computations, ALU computations, activation computations, and the like.

The plurality of basic processing circuits may be configured to perform neural network computations in parallel according to data transferred, and transfer computation results to the main processing circuit through the basic processing circuits that are connected to the main processing circuit. The neural network computations that are performed in parallel may include but is not limited to: inner product computations, matrix or vector multiplication computations, and the like.

The main processing circuit may include: a data transferring circuit, a data receiving circuit or interface, where a data distribution circuit and a data broadcasting circuit may be integrated in the data transferring circuit. In in certain applications, the data distribution circuit and the data broadcasting circuit may be set independently. Data for broadcasting refers to the data that need to be sent to each basic processing circuit. Data for distribution refers to the data that need to be sent to some basic processing circuit selectively. Specifically, taking a convolution computation as an instance, since convolutional input data of the convolution computation needs to be sent to all basic processing circuits, the convolutional input data is data for broadcasting. Since a convolution kernel needs to be sent to some basic data blocks selectively, the convolution kernel are data for distribution. A method for selecting a basic processing circuit to distribute data may be determined by the main processing circuit according to the loads and other allocation methods. A method for broadcasting refers to transferring data for broadcasting to each basic processing circuit by means of broadcasting. In some embodiments, the data for broadcasting may be transferred to each basic processing circuit by broadcasting for once or a plurality of times. The times of broadcasting are not restricted in the example of the present disclosure. A method for distributing refers to selectively transferring data for distribution to some basic processing circuits.

The main processing circuit (as shown in FIG. 1c) may include a register and/or on-chip caching circuit, and the main processing circuit may further include: a control circuit, a vector computing unit circuit, an ALU (Arithmetic and Logic Unit) circuit, an accumulator circuit, a DMA (Direct Memory Access) circuit, and the like. Of course, in in certain applications, the main processing circuit may further include a conversion circuit (e.g., a matrix transposition circuit), a data rearrangement circuit, an activation circuit, or the like.

Each basic processing circuit may include a basic register and/or a basic on-chip caching circuit; each basic processing circuit may further include one or more of an inner product computing unit circuit, a vector computing unit circuit, an accumulator circuit, and the like. The inner product computing unit circuit, the vector computing unit circuit, and the accumulator circuit may all be integrated circuits, and the inner product computing unit, the vector computing unit circuit, and the accumulator circuit may also be circuits that are set independently.

Alternatively, the accumulator circuit of the n basic processing circuits of the $m^{th}$ row may be configured to perform accumulation computations of inner product computations. Since the basic processing circuits of the $m^{th}$ row can receive multiplication results of all basic processing circuits of a current column, by using the n basic processing circuits of the $m^{th}$ row to perform accumulation computations of inner product computations, computing resources may be effectively allocated, and the power consumption may be reduced. This technical scheme may be particularly suitable for a case where m is relatively large.

The main processing circuit may configure a circuit to perform data type conversion. Specifically, a circuit may be configured in an explicit manner or an implicit manner. For the explicit manner, the main processing circuit can configure a special indication or instruction for confirming to perform data type conversion, and if the basic processing circuits do not receive the special indication or instruction, the basic processing circuits determine not to perform data type conversion. Data type conversion may also be performed implicitly. For instance, when the basic processing circuits receive floating point data and determine that an inner product computation needs to be performed, the basic processing circuits may convert the data into fixed point data. For the manner of configuring explicitly, the special indication or instruction may configure a descending sequence. Every time after passing a basic processing circuit, the value of the descending sequence may reduce by 1. The basic processing circuits may read the value of the descending sequence, if the value is greater than zero, the basic processing circuits may perform data type conversion, and if the value is equal to or less than zero, the basic processing circuits may not perform data type conversion. This configuration is set according to the basic processing circuits arranged in the form of the array. For instance, for the m basic processing circuits of the $i^{th}$ column, the main processing circuit requires the 5 basic processing circuits at the front to perform data type conversion, in this case, the main processing circuit sends a special instruction that includes a descending sequence, where an initial value of the descending sequence may be 5. Every time after passing a basic processing circuit, the value of the descending sequence reduces by 1. At a fifth basic processing circuit, the value of the descending sequence is 1, and at a sixth basic processing circuit, the value of the descending sequence is 0. At this point, the sixth basic processing circuit may not perform the data type conversion. By using this method, the main processing circuit may dynamically configure an execution subject and a count of execution times of data type conversion.

Figure 1F:
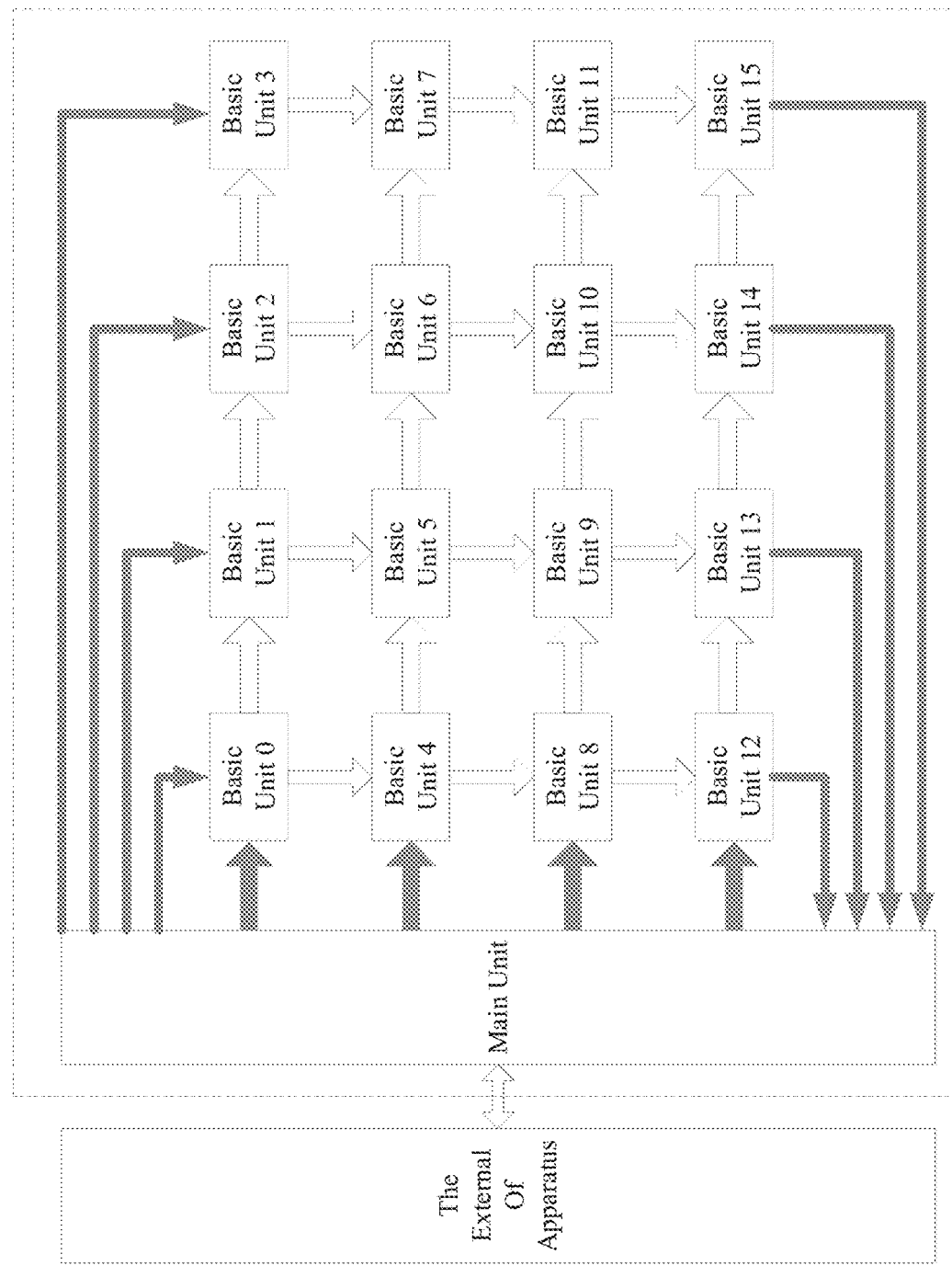
FIG. 1f is a structural diagram of other integrated circuit chip apparatus.

An example of the present disclosure provides an integrated circuit chip apparatus. The integrated circuit chip apparatus may include a main processing circuit (may also be referred to as a main unit) and a plurality of basic processing circuit (may also be referred to as basic units). A structure of the example is shown in FIG. 1f, where inside a dashed box is an internal structure of the neural network computing apparatus, a gray arrow indicates a data transferring path between the main processing circuit and the basic processing circuits, and an outlined arrow indicates a data transferring path between the respective basic processing circuits (adjacent basic processing circuits) in the basic processing circuit array. The length and width of the basic processing circuit array may also be different. In other words, the values of m and n may be different, and may be the same. The values are not restricted in the present disclosure.

Figure 1G:
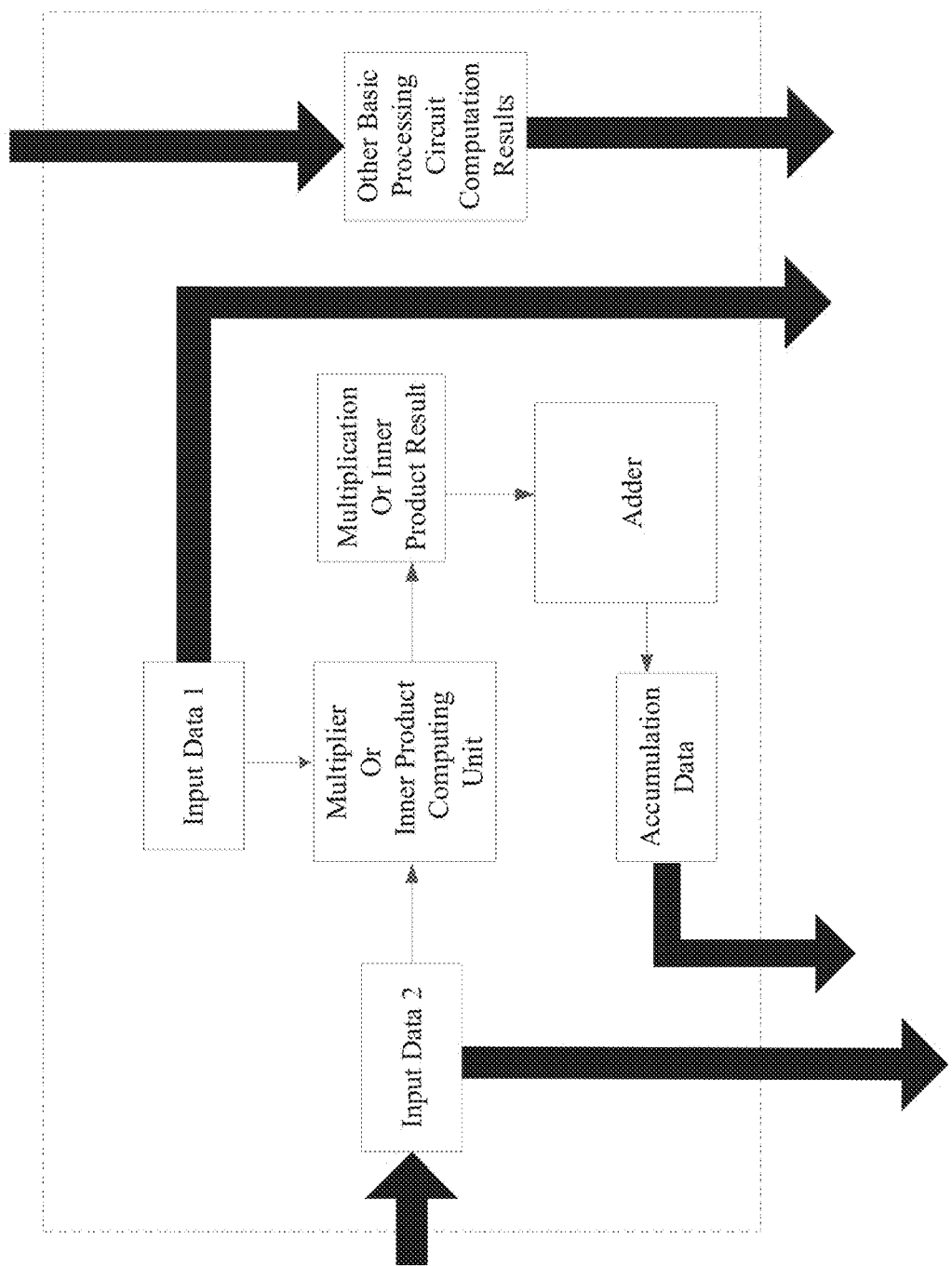
FIG. 1g is a structural diagram of a basic processing circuit.

FIG. 1g shows a circuit structure of a basic processing circuit. A dashed box in the figure indicates the border of the basic processing circuit, a thick arrow that intersects the dashed box indicates a data input pathway and a data output pathway (the arrow pointing to the internal of the dashed box is the input pathway, and the arrow pointing to the external of the dashed box is the output pathway); a rectangular box inside the dashed box indicates a storage unit circuit (register and/or on-chip cache) including input data 1, input data 2, a result of multiplication or inner product, and accumulation data; and a diamond-shaped box indicates a computing unit circuit including a multiplier or inner product computing unit, and an adder.

In the present disclosure, the neural network computing apparatus may include a main processing circuit and 16 basic processing circuits (the 16 basic processing circuit are given by way of illustration, other number may be used in in certain applications).

In the present example, a basic processing circuit may have two data input interfaces, two data output interfaces; in the following description of the present example, a horizontal input interface (a horizontal arrow pointing to a present unit as shown in FIG. 1f) is referred to as an input 0, a vertical input interface (a vertical arrow pointing to a present unit as shown in FIG. 1f) is referred to as an input 1; a horizontal data output interface (a horizontal arrow pointing away from a present unit as shown in FIG. 1f) is referred to as an output 0, a vertical data output interface (a vertical arrow pointing away from a present unit as shown in FIG. 1f) is referred to as an output 1.

The data input interface and the data output interface may be connected to different units respectively which may include the main processing circuit and other basic processing circuits; in the present example, inputs 0 of the four basic processing circuits 0, 4, 8, 12 (see FIG. 1f for the numbers) are connected to the data output interface of the main processing circuit; in the present example, inputs 1 of the four basic processing circuits 0, 1, 2, 3 are connected to the data output interface of the main processing circuit; in the present example, outputs 1 of basic processing circuits 12,13,14,15 are connected to the data input interface of the main processing circuit; connections of the output interfaces of the basic processing circuits and the input interfaces of other basic processing circuits of the present example can be seen in FIG. 1f, which will be omitted here; specifically, an output interface S1 of a S unit is connected to an input interface P1 of a P unit, which indicates that the P unit can receive data that the S unit sends to the S1 interface via the P1 interface.

The present example may include a main processing circuit, where the main processing circuit may be connected to external apparatus (in other words, an input interface and an output interface both exist), some data output interfaces of the main processing circuit may be connected to the data input interfaces of some basic processing circuits; and some data input interfaces of the main processing circuit may be connected to the data output interfaces of some basic processing circuits.

An example of the present disclosure provides a method of using integrated circuit chip apparatus: data involved in the method provided by the present disclosure may be data of any data type. For instance, the data may be data represented by a floating point number of any bit width, or data represented by a fixed point number of any bit width.

FIG. 1d is a structural diagram of the fixed point data. FIG. 1d shows a method of representing fixed point data. For a computing system, the storage bit of one floating point data is 32 bits. For fixed point data, particularly a data representation using the floating point data shown in FIG. 1d, the storage bit of one fixed point data can be reduced to less than 16 bits, which may greatly reduce transferring overhead between computing units during conversion. In addition, for a computing unit, the storage space of data having fewer bits may be smaller, in other words, the storage overhead may be less, the amount of computations may also be reduced, and the computational overhead may be reduced. In this case, the fixed point data shown in FIG. 1d may reduce the computational overhead and storage overhead. However, data type conversion requires computational overhead, which will be referred to as conversion overhead below. For data that require a large amount of computations and a large amount of storage, conversion overhead is almost negligible compared with subsequent computational overhead, storage overhead, and transferring overhead. In this case, the present disclosure adopts a technical solution of converting data into fixed point data for data that require a large amount of computations and a large amount of storage. On the contrary, for data that require a small amount of computations and a small amount of storage, the data require less computational overhead, storage overhead, and transferring overhead. Since the precision of fixed point data is lower than the precision of floating point data, if fixed point data is used, under the premise that an amount of computations is relatively small, the fixed point data may be converted to floating point data to ensure the precision of computations. In other words, the precision of computations may be improved by increasing a small amount of overhead.

Alternatively, a computation that needs to be completed in the basic processing circuits may be performed according to the following method: the main processing circuit may perform data type conversion on data, then transfer the data to the basic processing circuits for computing (for instance, the main processing circuit may convert a floating point number to a fixed point number that has less bit width and transfer the fixed point number to the basic processing circuits. Technical effects of doing so include that the bit width of data transferred may be reduced, the total count of bits being transferred may be reduced, the basic processing circuits may achieve better efficiency with less power consumption when performing bit width fixed point computations).

After the basic processing circuits receive the data, the basic processing circuits may first perform data type conversion before performing computations (for instance, the basic processing circuits receive a floating point number transferred from the main processing circuit, then the basic processing circuits convert the floating point number to a fixed point number for performing computations. In this way, the computational efficiency may be improved, and the power consumption may be reduced).

After the basic processing circuits obtain results by computing, the results may first be subject to data type conversion and then be transferred to the main processing circuit (for instance, computation results of a floating point number that are obtained by the basic processing circuits may first be converted into fixed point numbers having less bit width, then the fixed point numbers are transferred to the main processing circuit. Technical effects of this method include that the bit width during the transferring process may be reduced, and better efficiency with less power consumption may be realized).

Figure 2G:
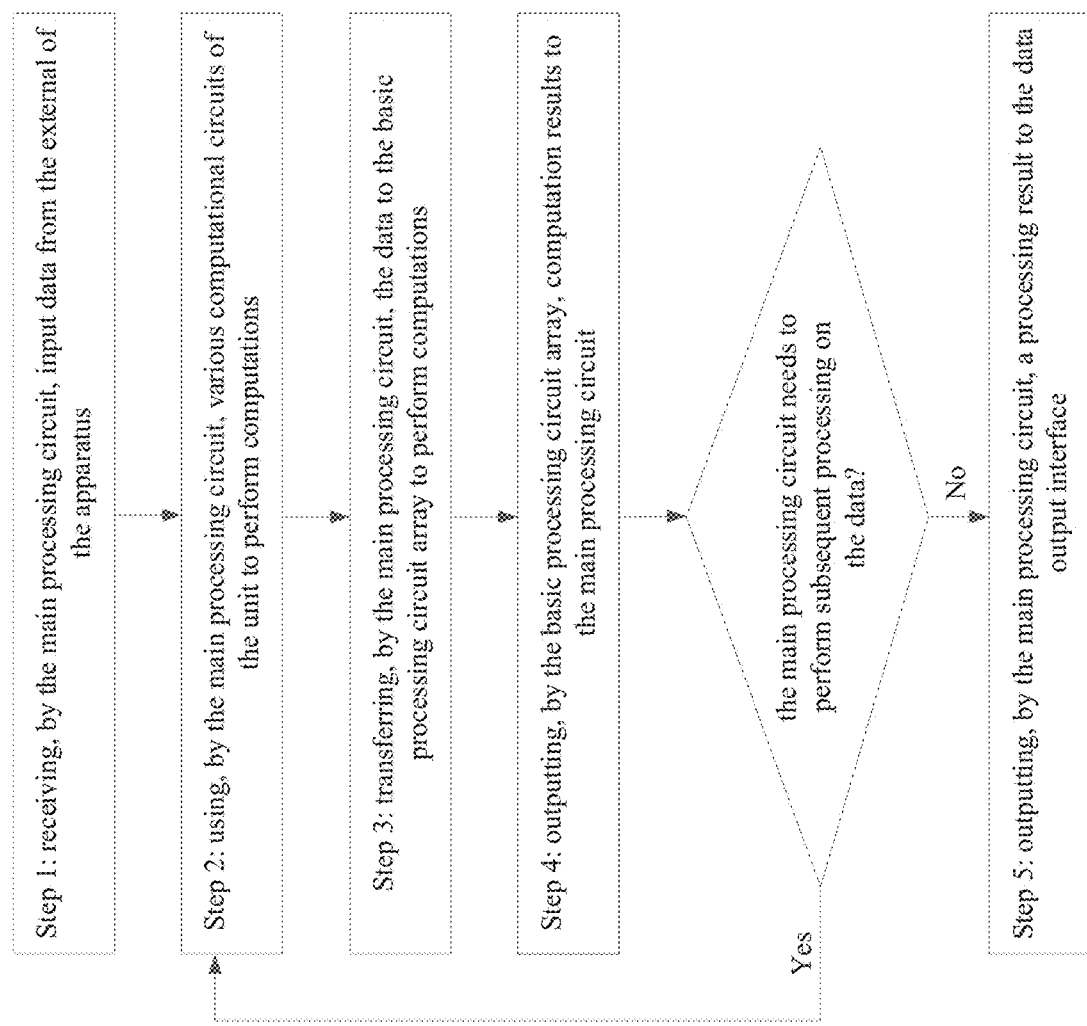
FIG. 2g is a schematic diagram showing a usage of a basic processing circuit.
Figure 2H:
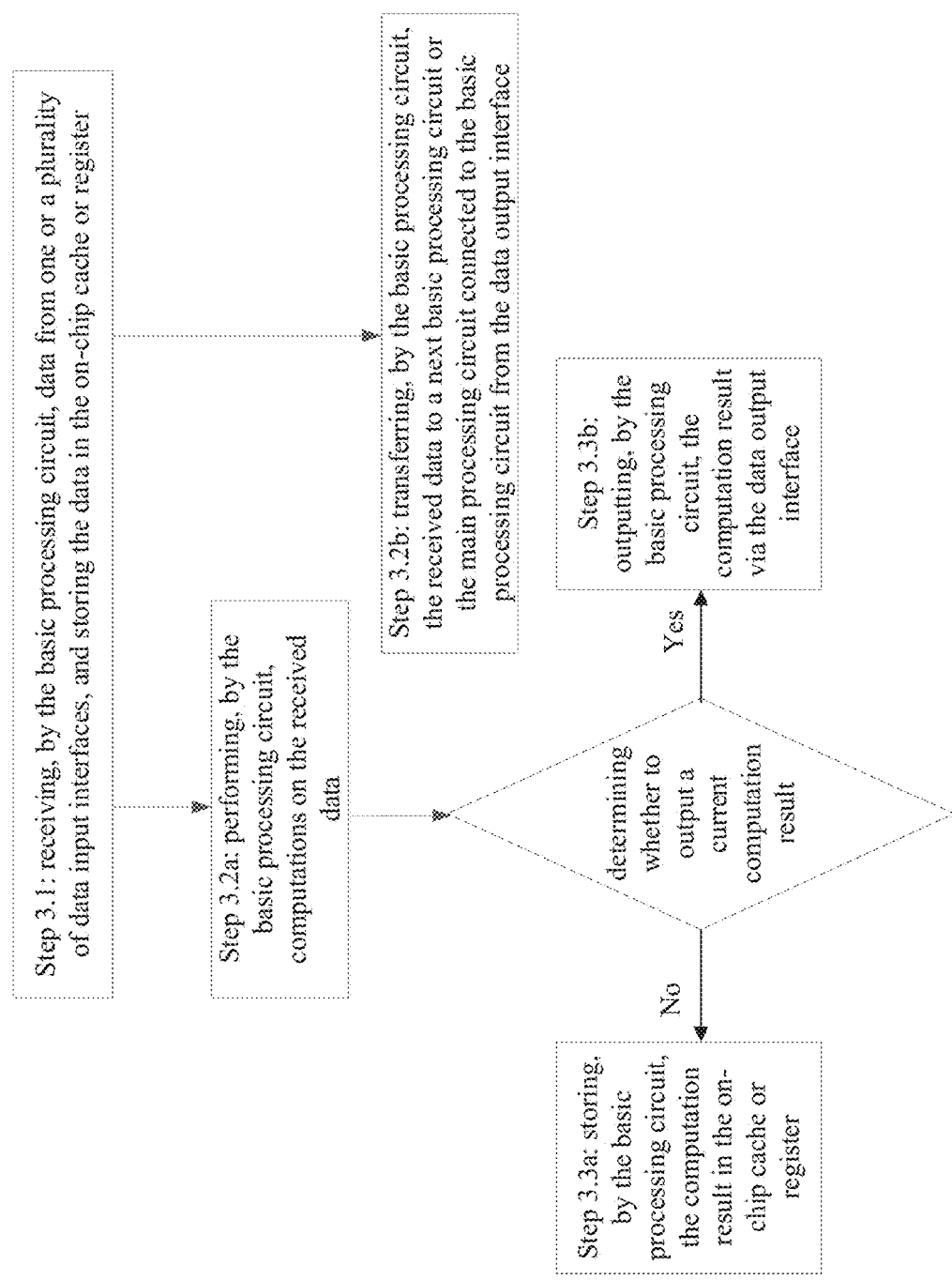
FIG. 2h is a schematic diagram showing data transferring by a main processing circuit.
Figure 21:
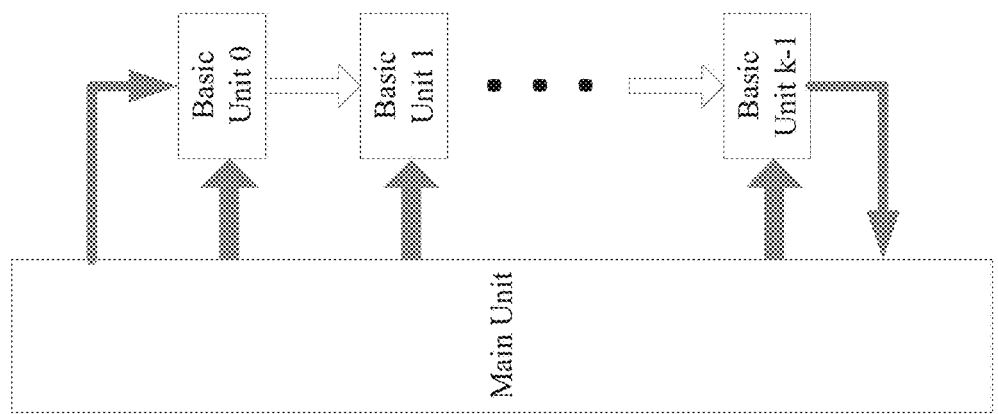

Specifically, a method of using the basic processing circuits (as shown in FIG. 2g) may include: step 1: receiving, by the main processing circuit, input data to be computed from the external of the apparatus; step 2: using, by the main processing circuit, various computational circuits of the unit such as the vector computational circuit, the inner product computing unit circuit, and the accumulator circuit to perform computations on the data; step 3: transferring (as shown in FIG. 2h), by the main processing circuit via the data output interface, the data to a basic processing circuit array (a set of all the basic processing circuits is referred to as a basic processing circuit array); performing, by the basic processing circuit array, computations on the data; a method of transferring data here may be transferring the same data to some basic processing circuits directly, which in other words, may be a method of sequentially broadcasting; and a method of transferring data here may also be transferring different data to different basic processing circuits, which in other words, may be a method of distributing.

Alternatively, as shown in FIG. 2h, the step 3 may further include: step 3.1: receiving, by the basic processing circuits, data from one or a plurality of data input interfaces, and storing the data in the on-chip cache or register; step 3.2a: after the basic processing circuits receive the data, computing, by the basic processing circuits, to obtain a computation result, and determining whether to output the computation result; alternatively, if the basic processing circuits determine not to output the computation result, step 3.3a: storing, by the basic processing circuits, the computation results in the on-chip cache or register; if the basic processing circuits determine to output the computation results, step 3.3b: outputting, by the basic processing circuits, the computation results (the computation results may be intermediate results or final computation results) via the data output interface.

Alternatively, after the step 3.1, the method may further include: after the basic processing circuits receive the data, outputting the data by the basic processing circuits via the data output interface of the unit; for instance, the basic processing circuits may transfer the received data to other basic processing circuits that have not directly received data from the main processing circuit.

The method may further include step 4: outputting, by the basic processing circuit array, the computation result to the main processing circuit; and receiving, by the main processing circuit, output data returned by the basic processing circuit array; alternatively, the main processing circuit may continue to process the data received from the basic processing circuit array (such as accumulating or activation operating); when the main processing circuit does not need to continue to process the data or finishes processing the data, a step 5 may be performed, which is: transferring, by the main processing circuit, a processing result to the external of the apparatus via the data output interface.

The circuit apparatus may be used to perform matrix-multiply-vector computations, where the matrix-multiply-vector may be a vector obtained by: performing inner product computations between each row of a matrix and a vector, and placing the obtained results according to a corresponding order.

Below is a description of performing multiplication of a matrix S with a size of M rows and L columns and a vector P with a length of L, which is shown in FIG. 2b.

The present method may use all or some basic processing circuits of the neural network computing apparatus. It is assumed that K basic processing circuits are used; the main processing circuit may transfer data in all or some rows of the matrix S to each basic processing circuit of the k basic processing circuits; and in an alternative example, each time, a control circuit of the main processing circuit may transfer a number or some numbers of data in a row of the matrix S to a basic processing circuit. For instance, transferring a number at each time may be: for a basic processing circuit, a $1^{st}$ number in a $3^{rd}$ row may be transferred at a $1^{st}$ time, a $2^{nd}$ number in the $3^{rd}$ row may be transferred at a $2^{nd}$ time, a $3^{rd}$ number in the $3^{rd}$ row may be transferred at a $3^{rd}$ time, . . . ; or transferring some numbers at each time may be: first two numbers ($1^{st}$ and $2^{nd}$ numbers) in a $3^{rd}$ row may be transferred at a $1^{st}$ time, a $3^{rd}$ number and a $4^{th}$ number in the $3^{rd}$ row may be transferred at a $2^{nd}$ time, a $5^{th}$ number and a $6^{th}$ number in the $3^{rd}$ row may be transferred at a $3^{rd}$ time, . . . . In an alternative example, each time, the control circuit of the main processing circuit may transfer a number or some numbers of some rows of the matrix S to some basic processing circuits. For instance, for a basic processing circuit, $1^{st}$ numbers in a $3^{rd}$, $4^{th}$, and $5^{th}$ rows may be transferred at a $1^{st}$ time, $2^{nd}$ numbers in the $3^{rd}$, $4^{th}$, and $5^{th}$ rows may be transferred at a $2^{nd}$ time, $3^{rd}$ numbers in the $3^{rd}$, $4^{th}$, and $5^{th}$ rows may be transferred at a $3^{rd}$ time, . . . ; or first two numbers in a $3^{rd}$, $4^{th}$, and $5^{th}$ rows may be transferred at a $1^{st}$ time, $3^{rd}$ numbers and $4^{th}$ numbers in the $3^{rd}$, $4^{th}$, and $5^{th}$ rows may be transferred at a $2^{nd}$ time, $5^{th}$ numbers and $6^{th}$ numbers in the $3^{rd}$, $4^{th}$, and $5^{th}$ rows may be transferred at a $3^{rd}$ time, . . . .

The control circuit of the main processing circuit may transfer data in the vector P to a zeroth basic processing circuit successively; after receiving the data of the vector P, the zeroth basic processing circuit may transfer the data to a next basic processing circuit that is connected to the zeroth basic processing circuit, which is a basic processing circuit 1; specifically, some basic processing circuits cannot obtain data required for computations directly from the main processing circuit, for instance, the basic processing circuit 1 in FIG. 2i, which only has one data input interface that is connected to the main processing circuit, in this case, the basic processing circuit 1 can only obtain data of the matrix S directly from the main processing circuit, and has to depend on the basic processing circuit 0 for data of the vector P, similarly, after the basic processing circuit 1 receives the data, the basic processing circuit 1 may continue to output the data of the vector P to a basic processing circuit 2.

Each basic processing circuit performs computations on the received data, where the computations may include, but is not limited to: an inner product computation, a multiplication computation, an addition computation, and the like. In an alternative example, each time, the basic processing circuit may perform multiplication on one or a plurality of groups of two data, then accumulate a result in the register and/or on-chip cache. In an alternative example, each time, the basic processing circuit may compute an inner product of one or a plurality of groups of two vectors, then accumulate a result in the register and/or on-chip cache; after the basic processing circuit obtains a result by computing, the basic processing circuit may output the result through the data output interface (in other words, transfer to another basic processing circuit that is connected to the basic processing circuit). In an alternative example, the computation result may be a final result or an intermediate result of an inner product computation.

Furthermore, after the basic processing circuit receives a computation result from another basic processing circuit, the basic processing circuit may transfer the data to yet another basic processing circuit that is connected to the basic processing circuit or to the main processing circuit; the main processing circuit may receive an inner product computation result transferred by each basic processing circuit, and process (which may be an accumulation computation, an activation computation, or the like) the result to obtain a final result.

Figure 2J:
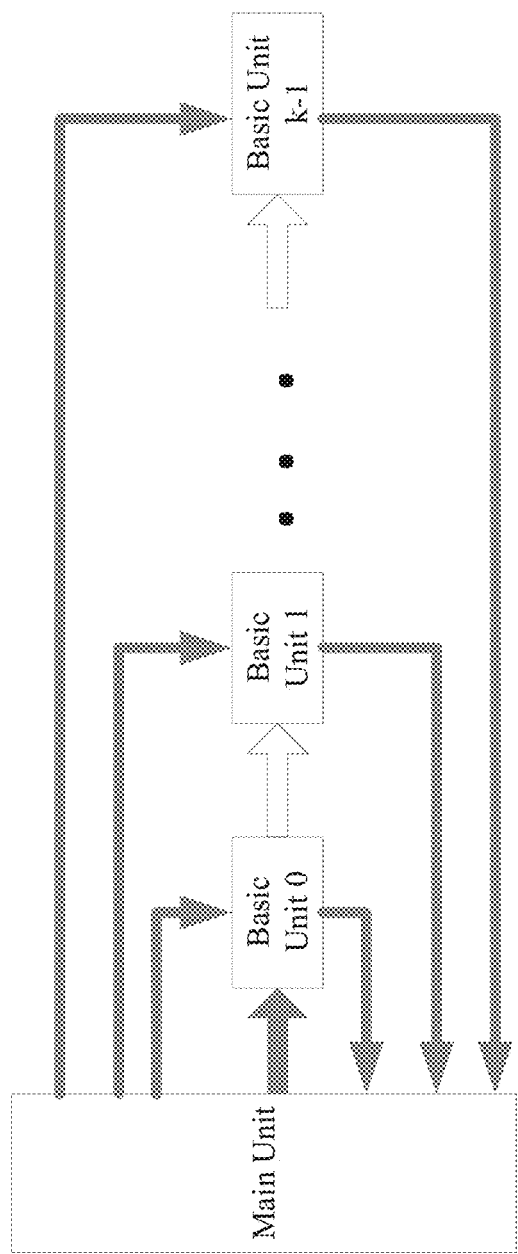
FIG. 2j is a structural diagram of other integrated circuit chip apparatus.

Alternatively, the following describes an example of using the computing apparatus to realize a matrix-multiply-vector computation:

In an alternative example, a plurality of basic processing circuits used in the method may be arranged according to a manner shown in FIG. 2i or FIG. 2j.

As shown in FIG. 2b, a data type conversion circuit of the main processing circuit may convert the matrix S and the matrix P into fixed point data; and the control circuit of the main processing circuit may divide M rows of data of the matrix S into K groups. An $i^{th}$ basic processing circuit may be responsible for the computation of an $i^{th}$ group (a set of rows in the group of data is referred to as Ai). A method of grouping the M rows of data is any grouping method without repeated allocation.

In an alternative example, the following grouping method may be used: allocating a $j^{th}$ row to a (j % K)$^{th}$ (where % denotes a computation of taking a remainder) basic processing circuit.

As an alternative example, in a case where rows cannot be grouped evenly, some rows may be grouped evenly first, and the remaining rows may be allocated in any manner.

Specifically, the method of matrix-multiply-vector may include: each time, the control circuit of the main processing circuit may successively transfer data of some or all rows in the matrix S to corresponding basic processing circuits.

In an alternative example, each time, the control circuit of the main processing circuit may transfer one or a plurality of data in a row of data of an $i^{th}$ group of data Mi that the $i^{th}$ basic processing circuit is responsible for to the $i^{th}$ basic processing circuit.

In an alternative example, each time, the control circuit of the main processing circuit may transfer one or a plurality of data in each row of some or all rows of the $i^{th}$ group of data Mi that the $i^{th}$ basic processing circuit is responsible for to the $i^{th}$ basic processing circuit.

The control circuit of the main processing circuit may successively transfer data in the vector P to the first basic processing circuit.

In an alternative example, each time, the control circuit of the main processing circuit may transfer one or a plurality of data in the vector P.

After the $i^{th}$ basic processing circuit receives the data of the vector P, the $i^{th}$ basic processing circuit may transfer the data of the vector P to a $i+1^{th}$ basic processing circuit that is connected to the $i^{th}$ basic processing circuit; after each basic processing circuit receives one or a plurality of data from one or a plurality of rows of the matrix S and one or a plurality of data from the vector P, the basic processing circuit may perform computations (include but is not limited to multiplication or addition).

In an alternative example, each time, the basic processing circuit may perform multiplication of one or a plurality of groups of two data, then accumulate a result in the register and/or on-chip cache. In an alternative example, each time, the basic processing circuit may compute an inner product of one or a plurality of groups of two vectors, then accumulate a result in the register and/or on-chip cache. In an alternative example, data received by the basic processing circuit may be an intermediate result, where the intermediate result may be stored in the register and/or on-chip cache; and furthermore, the basic processing circuit may transfer a local computation result to another basic processing circuit or to the main processing circuit.

In an alternative example, corresponding to a structure shown in FIG. 2i, only the output interface of a last basic processing circuit in each column is connected to the main processing circuit, in this case, only the last basic processing circuit may directly transfer a local computation result to the main processing circuit, computation results of other basic processing circuits may all need to be transferred to a subsequent basic processing circuit, and then be transferred by the subsequent basic processing circuit to a basic processing circuit after the subsequent basic processing circuit, until the computation results are transferred to the last basic processing circuit. The last basic processing circuit may accumulate a local computation result with received results from another basic processing circuit of a present column to obtain an intermediate result, and transfer the intermediate result to the main processing circuit. Of course, the last basic processing circuit may also transfer results of other basic processing circuits of the present column and a local processing result directly to the main processing circuit.

In an alternative example, corresponding to a structure of FIG. 2j, each basic processing circuit has an output interface that is connected to the main processing circuit, in this case, each basic processing circuit can transfer a local computation result to the main processing circuit directly. After the basic processing circuit receives a computation result from another basic processing circuit, the basic processing circuit may transfer the data to yet another basic processing circuit that is connected to the basic processing circuit or to the main processing circuit. The main processing circuit may receive a result of M inner product computations to be used as a computation result of matrix-multiply-vector.

Alternatively, the present disclosure may use the circuit apparatus to perform a matrix-multiply-matrix computation, which is as follows:

below is a description of performing multiplication of a matrix S with a size of M rows and L columns and a matrix P with a size of L rows and N columns, where each row of the matrix S is as long as each column of the matrix P, which is as shown in FIG. 2e. The method may use the above-mentioned apparatus. An example as shown in FIG. 1f is as follow: performing, by the data type conversion circuit of the main processing circuit, data type conversion on the matrix S and the matrix P; alternatively, the control circuit of the main processing circuit may transfer data of some or all rows of the matrix S to basic processing circuits that are directly connected to the main processing circuit via horizontal data input interfaces (for instance, gray vertical data pathways at the top of FIG. 1f). In an alternative example, each time, the control circuit of the main processing circuit may transfer a number or some numbers of data in a row of the matrix S to a basic processing circuit, for instance, for a basic processing circuit, a $1^{st}$ number in a $3^{rd}$ row may be transferred at a $1^{st}$ time, a $2^{nd}$ number in the $3^{rd}$ row may be transferred at a $2^{nd}$ time, a $3^{rd}$ number in the $3^{rd}$ row may be transferred at a $3^{rd}$ time, . . . ; or first two numbers in a $3^{rd}$ row may be transferred at a $1^{st}$ time, a $3^{rd}$ number and a $4^{th}$ number in the $3^{rd}$ row may be transferred at a $2^{nd}$ time, a $5^{th}$ number and a $6^{th}$ number in the $3^{rd}$ row may be transferred at a $3^{rd}$ time, . . . . In an alternative example, each time, the control circuit of the main processing circuit may transfer a number or some numbers of some rows of data of the matrix S to a basic processing circuit, for instance, for a basic processing circuit, $1^{st}$ numbers in a $3^{rd}$, $4^{th}$, and $5^{th}$ rows may be transferred at a $1^{st}$ time, $2^{nd}$ numbers in the $3^{rd}$, $4^{th}$, and $5^{th}$ rows may be transferred at a $2^{nd}$ time, $3^{rd}$ numbers in the $3^{rd}$, $4^{th}$, and $5^{th}$ rows may be transferred at a $3^{rd}$ time, . . . ; or first two numbers in a $3^{rd}$, $4^{th}$, and $5^{th}$ rows may be transferred at a $1^{st}$ time, $3^{rd}$ numbers and $4^{th}$ numbers in the $3^{rd}$, $4^{th}$, and $5^{th}$ rows may be transferred at a $2^{nd}$ time, $5^{th}$ numbers and $6^{th}$ numbers in the $3^{rd}$, $4^{th}$, and $5^{th}$ rows may be transferred at a $3^{rd}$ time, . . . .

The control circuit of the main processing circuit may transfer data of some or all columns of the matrix P to basic processing circuits that are directly connected to the main processing circuit via vertical data input interfaces (for instance, gray horizontal data pathways on the left of the basic processing circuit array shown in FIG. 1f). In an alternative example, each time, the control circuit of the main processing circuit may transfer a number or some numbers of a column of the matrix P to a basic processing circuit; for instance, for a basic processing circuit, a $1^{st}$ number in a $3^{rd}$ column may be transferred at a $1^{st}$ time, a $2^{nd}$ number in the $3^{rd}$ column may be transferred at a $2^{nd}$ time, a $3^{rd}$ number in the $3^{rd}$ column may be transferred at a $3^{rd}$ time, . . . ; or first two numbers in a $3^{rd}$ column may be transferred at a $1^{st}$ time, a $3^{rd}$ number and a $4^{th}$ number in the $3^{rd}$ column may be transferred at a $2^{nd}$ time, a $5^{th}$ number and a $6^{th}$ number in the $3^{rd}$ column may be transferred at a $3^{rd}$ time, . . . . In an alternative example, each time, the control circuit of the main processing circuit may transfer a number or some numbers of some columns of data of the matrix P to a basic processing circuit, for instance, for a basic processing circuit, $1^{st}$ numbers in a $3^{rd}$, $4^{th}$, and $5^{th}$ columns may be transferred at a $1^{st}$ time, $2^{nd}$ numbers in the $3^{rd}$, $4^{th}$, and $5^{th}$ columns may be transferred at a $2^{nd}$ time, $3^{rd}$ numbers in the $3^{rd}$, $4^{th}$, and $5^{th}$ columns may be transferred at a $3^{rd}$ time, . . . ; or first two numbers in a $3^{rd}$, $4^{th}$, and $5^{th}$ columns may be transferred at a $1^{st}$ time, $3^{rd}$ numbers and $4^{th}$ numbers in the $3^{rd}$, $4^{th}$, and $5^{th}$ columns may be transferred at a $2^{nd}$ time, $5^{th}$ numbers and $6^{th}$ numbers in the $3^{rd}$, $4^{th}$, and $5^{th}$ columns may be transferred at a $3^{rd}$ time, . . . ; and after the basic processing circuit receives the data of the matrix S, the basic processing circuit may transfer the data to a subsequent basic processing circuit that is connected to the basic processing circuit via a horizontal data output interface of the basic processing circuit (for instance, horizontal data pathways filled in white at the center of the basic processing circuit array shown in FIG. 1f). After the basic processing circuit receives the data of the matrix P, the basic processing circuit may transfer the data to a subsequent basic processing circuit that is connected to the basic processing circuit via a vertical data output interface of the basic processing circuit (for instance, vertical data pathways filled in white at the center of the basic processing circuit array shown in FIG. 1f).

Then, each basic processing circuit performs computations on received data.

In an alternative example, each time, the basic processing circuit may perform multiplication of one or a plurality of groups of two data, then accumulate a result in the register and/or on-chip cache. In an alternative example, each time, the basic processing circuit may compute an inner product of one or a plurality of groups of two vectors, then accumulate a result in the register and/or on-chip cache; furthermore, after the basic processing circuit obtains a result by computing, the basic processing circuit may output the result through the data output interface.

In an alternative example, the computation result may be a final result or an intermediate result of an inner product computation; specifically, if the basic processing circuit has an output interface that is directly connected to the main processing circuit, the basic processing circuit may output the result via the interface, if no, the basic processing circuit may output the result towards a basic processing circuit that can output to the main processing circuit directly. For instance, in FIG. 1$f$, basic processing circuits at a bottom row can transfer results to the main processing circuit, and other basic processing circuits may transfer results downwards via vertical output interfaces.

Furthermore, after the basic processing circuit receives a computation result from another basic processing circuit, the basic processing circuit may transfer the data to yet another basic processing circuit that is connected to the basic processing circuit or to the main processing circuit; specifically, the basic processing circuit may output a result towards a direction to the main processing circuit, for instance, in FIG. 1$f$, the basic processing circuits at a bottom row can transfer results to the main processing circuit, and other basic processing circuits may transfer results downwards via vertical output interfaces; the main processing circuit may receive an inner product computation result transferred by each basic processing circuit to obtain an output result.

Alternatively, the present disclosure further provides an example of method of matrix-multiply-matrix, which is as follows: the method uses a basic processing circuit array arranged according to the manner shown in FIG. 1$f$. It is assumed that there are h rows and w columns. The method may include: performing, by the data type conversion circuit of the main processing circuit, data type conversion on the matrix S and the matrix P; the control circuit of the main processing circuit may divide h rows of data of the matrix S into h groups. An $i^{th}$ basic processing circuit may be responsible for the computation of an $i^{th}$ group (a set of rows in the group of data is referred to as Hi); a method of grouping the h rows of data is any grouping method without repeated allocation.

In an alternative example, the following allocation method may be used: the control circuit of the main processing circuit allocates a $j^{th}$ row to a j % $K^{th}$ basic processing circuit; as an alternative example, in a case where rows cannot be grouped evenly, some rows may be grouped evenly first, and the remaining rows may be allocated in any manner.

The control circuit of the main processing circuit may divide W columns of data of the matrix P into w groups. The $i^{th}$ basic processing circuit may be responsible for the computation of an $i^{th}$ group (a set of rows in the group of data is referred to as Wi); a method of grouping the W columns of data is any grouping method without repeated allocation. In an alternative example, the following allocation method may be used: the control circuit of the main processing circuit allocates a $j^{th}$ row to a j % $w^{th}$ basic processing circuit; as an alternative example, in a case where columns cannot be grouped evenly, some columns may be grouped evenly first, and the remaining columns may be allocated in any manner.

Alternatively, the control circuit of the main processing circuit may transfer data in all or some rows of the matrix S to each basic processing circuit in each row of the basic processing circuit array. In an alternative example, each time, the control circuit of the main processing circuit may transfer one or a plurality of data in a row of data of an $i^{th}$ group of data Hi that a $1^{st}$ basic processing circuit of an $i^{th}$ row of the basic processing circuit array is responsible for to the $1^{st}$ basic processing circuit. In an alternative example, each time, the control circuit of the main processing circuit may transfer one or a plurality of data in each row of some or all rows of the $i^{th}$ group of data Hi that the $1^{st}$ basic processing circuit of the $i^{th}$ row of the basic processing circuit array is responsible for to the $1^{st}$ basic processing circuit; alternatively, the control circuit of the main processing circuit may transfer data in some or all columns of the matrix P to a $1^{st}$ basic processing circuit in each column of the basic processing circuit array. In an alternative example, each time, the control circuit of the main processing circuit may transfer one or a plurality of data in a column of data of an $i^{th}$ group of data Wi that a $1^{st}$ basic processing circuit of the basic processing circuit array is responsible for to the $1^{st}$ basic processing circuit. In an alternative example, each time, the control circuit of the main processing circuit may transfer one or a plurality of data in each column of some or all columns of an $i^{th}$ group of data Ni that the $i^{th}$ basic processing circuit of the basic processing circuit array is responsible for to the $i^{th}$ basic processing circuit; and after the basic processing circuit receives the data of the matrix S, the basic processing circuit may transfer the data to a subsequent basic processing circuit that is connected to the basic processing circuit via a horizontal data output interface of the basic processing circuit (for instance, horizontal data pathways filled in white at the center of the basic processing circuit array shown in FIG. 1$f$). After the basic processing circuit receives the data of the matrix P, the basic processing circuit may transfer the data to a subsequent basic processing circuit that is connected to the basic processing circuit via a vertical data output interface of the basic processing circuit (for instance, vertical data pathways filled in white at the center of the basic processing circuit array shown in FIG. 1$f$).

Furthermore, each basic processing circuit performs computations on received data. In an alternative example, each time, the basic processing circuit may perform multiplication of one or a plurality of groups of two data, then accumulate a result in the register and/or on-chip cache. In an alternative example, each time, the basic processing circuit may compute an inner product of one or a plurality of groups of two vectors, then accumulate a result in the register and/or on-chip cache; yet furthermore, after the basic processing circuit obtains a result by computing, the basic processing circuit may output the result through the data output interface. In an alternative example, the computation result may be a final result or an intermediate result of an inner product computation; specifically, if the basic processing circuit has an output interface that is directly connected to the main processing circuit, the basic processing circuit may output the result via the interface, if no, the basic processing circuit may output the result towards a basic processing circuit that can output to the main processing circuit directly, for instance, basic processing circuits at a bottom row can transfer results to the main processing circuit directly, and other basic processing circuits may transfer results downwards via vertical output interfaces.

Still furthermore, after the basic processing circuit receives a computation result from another basic processing circuit, the basic processing circuit may transfer the data to yet another basic processing circuit that is connected to the basic processing circuit or to the main processing circuit; specifically, the basic processing circuit may output the result towards a direction to the main processing circuit. For instance, the basic processing circuits at the bottom row can transfer results to the main processing circuit, and other basic processing circuits may transfer results downwards via vertical output interfaces.

Furthermore, the main processing circuit may receive an inner product computation result transferred by each basic processing circuit to obtain an output result.

The words "horizontal", "vertical", and the like used in the description above are only for the purpose of explaining the example shown in FIG. 1f. In in certain applications, it is only needed to ensure that "horizontal" and "vertical" interfaces of each unit represent two different interfaces.

Alternatively, the present disclosure can use the circuit apparatus to perform a fully connected computation: if input data of a fully connected layer is a vector (in other words, a case where input of a neural network is a single sample), a weight matrix of the fully connected layer serves as a matrix S, an input vector serves as a vector P, a matrix-multiply-vector computation may be performed according to the method of the apparatus; if the input data of the fully connected layer is a matrix (in other words, a case where the input of the neural network is a plurality of sample), the weight matrix of the fully connected layer serves as the matrix S, the input vector serves as a matrix P, or the weight matrix of the fully connected layer serves as the matrix P, and the input vector serves as the matrix S. A computation may be performed according to the matrix-multiply-matrix computation of the apparatus.

Figure 3C:
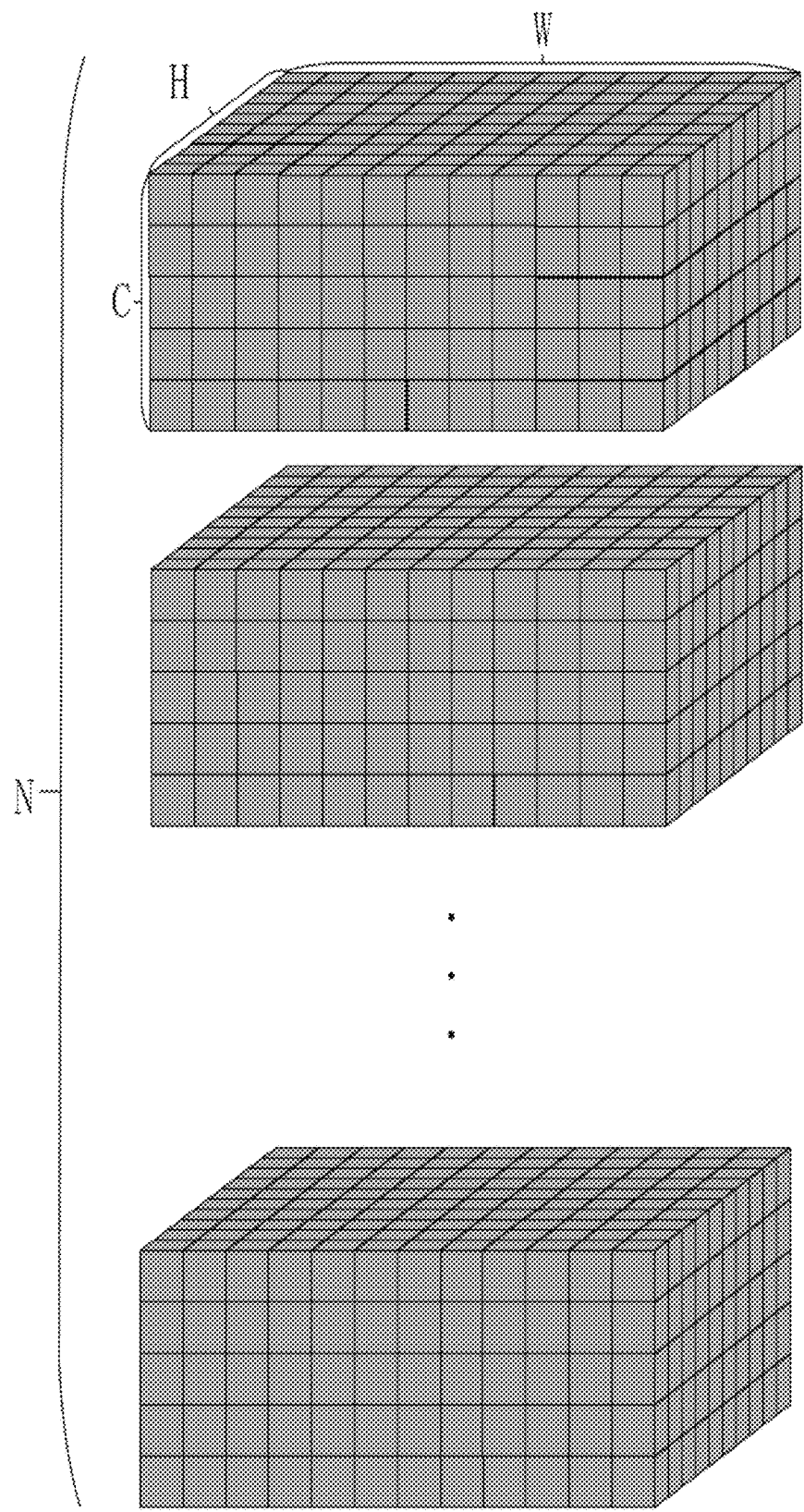
FIG. 3c is a schematic diagram of convolution input data.
Figure 3E:
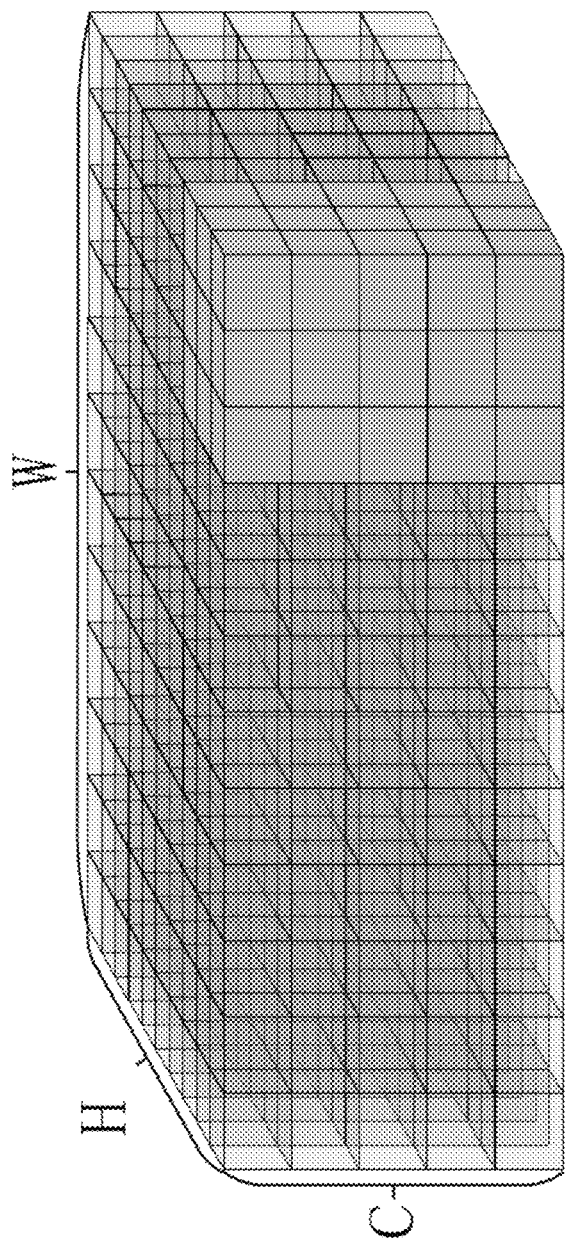
FIG. 3e is a schematic diagram of a computation window of a three-dimensional data block of input data.
Figure 3F:
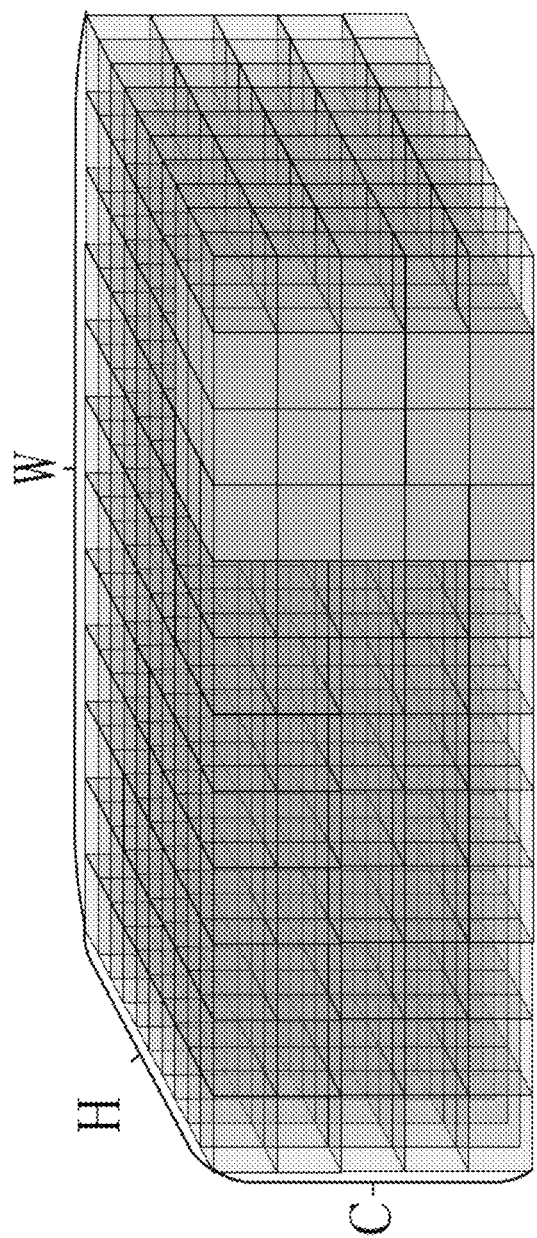
FIG. 3f is a schematic diagram of another computation window of a three-dimensional data block of input data.
Figure 3G:
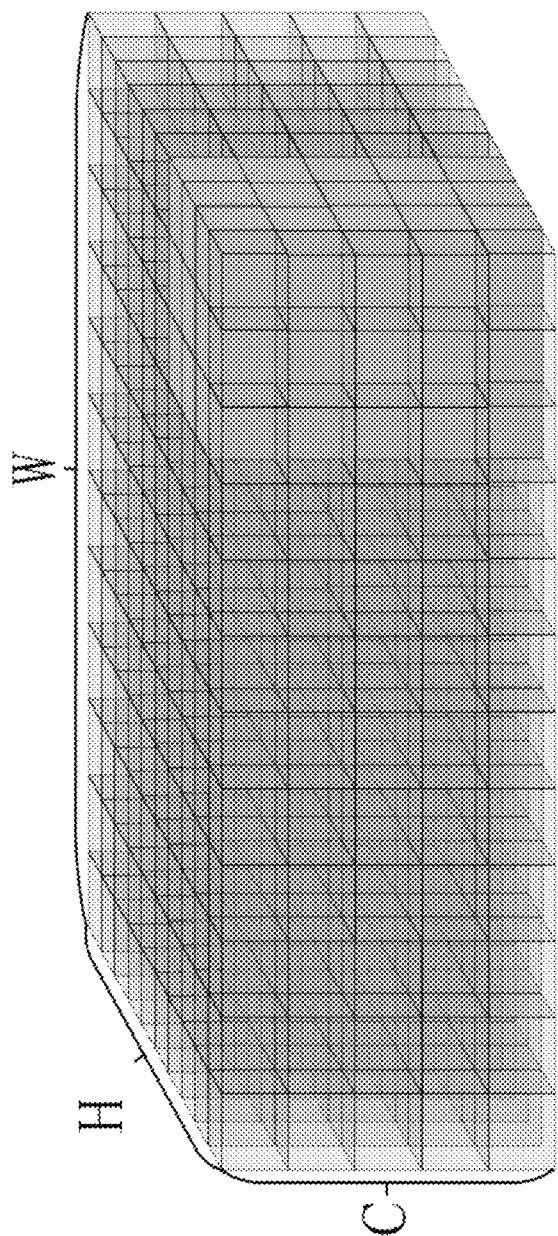
FIG. 3g is a schematic diagram of yet another computation window of a three-dimensional data block of input data.

Alternatively, the present disclosure can use the circuit apparatus to perform a convolution computation: the following is a description of the convolution computation, a block in the drawing below represents one data, input data is shown by FIG. 3c (N samples, each sample has C channels, and a feature map of each channel has a height of H and a width of W), and a weight, which is a convolution kernel, is shown by FIG. 3d (with M convolution kernels, and each convolution kernel has C channels with a height being KH and a width being KW). For the N samples of the input data, rules for convolution computations are the same. Below is an explanation of a process of performing a convolution computation on a sample. Each of the M convolution kernels may be subject to the same computation on a sample, each convolution kernel may obtain a plane feature map by computations, and the M convolution kernels may obtain M plane feature maps by computations (for a sample, output of convolution is M feature maps), for a convolution kernel, an inner product computation may be performed on each plane of a sample, and the convolution kernel may slide in a direction of H and a direction of W, for instance, FIG. 3e is a figure showing that a convolution kernel performs an inner product computation at a position at lower right corner of a sample of input data; FIG. 3f shows a position of convolution sliding leftwards for one grid, and FIG. 3g shows a position of convolution sliding upwards for one grid.

The method is explained by using the apparatus of FIG. 1f; the data type conversion circuit of the main processing circuit may convert data in some or all convolution kernels of the weight to fixed point data, the control circuit of the main processing circuit may transfer data of some or all convolution kernels of the weight to basic processing circuits that are directly connected to the main processing circuit via horizontal data input interfaces (for instance, gray vertical data pathways at the top of FIG. 1f). In an alternative example, each time, the control circuit of the main processing circuit may transfer a number or some numbers of data in a convolution kernel of the weight to a basic processing circuit, for instance, for a basic processing circuit, a $1^{st}$ number in a $3^{rd}$ row may be transferred at a $1^{st}$ time, a $2^{nd}$ number in the $3^{rd}$ row may be transferred at a $2^{nd}$ time, a $3^{rd}$ number in the $3^{rd}$ row may be transferred at a $3^{rd}$ time, . . . , or first two numbers in a $3^{rd}$ row may be transferred at a $1^{st}$ time, a $3^{rd}$ number and a $4^{th}$ number in the $3^{rd}$ row may be transferred at a $2^{nd}$ time, a $5^{th}$ number and a $6^{th}$ number in the $3^{rd}$ row may be transferred at a $3^{rd}$ time, . . . ; another case in an alternative example may be that, each time, the control circuit of the main processing circuit may transfer a number or some numbers of data of some convolution kernels of the weight to a basic processing circuit, for instance, for a basic processing circuit, $1^{st}$ numbers in a $3^{rd}$, $4^{th}$, and $5^{th}$ rows may be transferred at a $1^{st}$ time, $2^{nd}$ numbers in the $3^{rd}$, $4^{th}$, and $5^{th}$ rows may be transferred at a $2^{nd}$ time, $3^{rd}$ numbers in the $3^{rd}$, $4^{th}$, and $5^{th}$ rows may be transferred at a $3^{rd}$ time, . . . , or first two numbers in a $3^{rd}$, $4^{th}$, and $5^{th}$ rows may be transferred at a $1^{st}$ time, $3^{rd}$ numbers and $4^{th}$ numbers in the $3^{rd}$, $4^{th}$, and $5^{th}$ rows may be transferred at a $2^{nd}$ time, $5^{th}$ numbers and $6^{th}$ numbers in the $3^{rd}$, $4^{th}$, and $5^{th}$ rows may be transferred at a $3^{rd}$ time, . . . ; the control circuit of the main processing circuit may divide input data according to positions of convolution, and may transfer data of some or all positions of convolution in the input data to the basic processing circuits that are directly connected to the main processing circuit via the vertical data input interfaces (for instance, the gray horizontal data pathways on the left of the basic processing circuit array shown in FIG. 1f). In an alternative example, each time, the control circuit of the main processing circuit may transfer a number or some numbers of data of a position of convolution in the input data to a basic processing circuit; for instance, for a basic processing circuit, a $1^{st}$ number in a $3^{rd}$ column may be transferred at a $1^{st}$ time, a $2^{nd}$ number in the $3^{rd}$ column may be transferred at a $2^{nd}$ time, a $3^{rd}$ number in the $3^{rd}$ column may be transferred at a $3^{rd}$ time, . . . , or first two numbers in a $3^{rd}$ column may be transferred at a $1^{st}$ time, a $3^{rd}$ number and a $4^{th}$ number in the $3^{rd}$ column may be transferred at a $2^{nd}$ time, a $5^{th}$ number and a $6^{th}$ number in the $3^{rd}$ column may be transferred at a $3^{rd}$ time, . . . .

Another case in an alternative example may be that, each time, the control circuit of the main processing circuit may transfer a number or some numbers of data of some positions of convolution in the input data to a basic processing circuit, for instance, for a basic processing circuit, $1^{st}$ numbers in a $3^{rd}$, $4^{th}$, and $5^{th}$ columns may be transferred at a $1^{st}$ time, $2^{nd}$ numbers in the $3^{rd}$, $4^{th}$, and $5^{th}$ columns may be transferred at a $2^{nd}$ time, $3^{rd}$ numbers in the $3^{rd}$, $4^{th}$, and $5^{th}$ columns may be transferred at a $3^{rd}$ time, . . . , or first two numbers in a $3^{rd}$, $4^{th}$, and $5^{th}$ columns may be transferred at a $1^{st}$ time, $3^{rd}$ numbers and $4^{th}$ numbers in the $3^{rd}$, $4^{th}$, and $5^{th}$ columns may be transferred at a $2^{nd}$ time, $5^{th}$ numbers and $6^{th}$ numbers in the $3^{rd}$, $4^{th}$, and $5^{th}$ columns may be transferred at a $3^{rd}$ time, . . . .

After the basic processing circuit receives the data of the weight, the basic processing circuit may transfer the data to a subsequent basic processing circuit that is connected to the basic processing circuit via a horizontal data output interface of the basic processing circuit (for instance, horizontal data pathways filled in white at the center of the basic processing circuit array shown in FIG. 1f); after the basic processing circuit receives the input data, the basic processing circuit may transfer the data to a subsequent basic processing circuit that is connected to the basic processing circuit via a vertical data output interface of the basic processing circuit (for instance, vertical data pathways filled in white at the center of the basic processing circuit array shown in FIG. 1f); furthermore, each basic processing circuit performs computations on received data. In an alternative example, each time, the basic processing circuit may perform multiplication of one or a plurality of groups of two data, then accumulate a result in the register and/or on-chip cache. In an alternative example, each time, the basic processing circuit may compute an inner product of one or a plurality of groups of two vectors, then accumulate a result in the register and/or on-chip cache; yet furthermore, after the basic processing circuit obtains a result by computing, the basic processing circuit may output the result through the data output interface. In an alternative example, the computation result may be a final result or an intermediate result of an inner product computation; specifically, if the basic processing circuit has an output interface that is directly connected to the main processing circuit, the basic processing circuit may output the result via the interface, if no, the basic processing circuit may output the result towards a basic processing circuit that can output to the main processing circuit directly. For instance, in FIG. 1f, basic processing circuits at a bottom row can transfer results to the main processing circuit, and other basic processing circuits may transfer results downwards via vertical output interfaces.

After the basic processing circuit receives a computation result from another basic processing circuit, the basic processing circuit may transfer the data to yet another basic processing circuit that is connected to the basic processing circuit or to the main processing circuit; specifically, the basic processing circuit may output a result towards a direction to the main processing circuit (for instance, basic processing circuits at a bottom row can transfer results to the main processing circuit directly, and other basic processing circuits may transfer results downwards via vertical output interfaces); and the main processing circuit may receive an inner product computation result transferred by each basic processing circuit to obtain an output result.

Alternatively, the present disclosure provides a method of using the circuit apparatus to perform an operation of giving a bias, which may include: the vector computing unit circuit of the main processing circuit may be used to realize a function of adding two vectors together or adding two matrices together; and the vector computing unit circuit of the main processing circuit may be used to realize a function of adding a vector to each row of a matrix, or to each column of a matrix.

In an alternative example, the matrix may be from a result of a matrix-multiply-matrix computation performed by the apparatus. In an alternative example, the vector may be from a result of a matrix-multiply-vector computation performed by the apparatus; and in an alternative example, the matrix may be from data received from the external by the main processing circuit of the apparatus.

In an alternative example, the vector may be from data received from the external by the main processing circuit of the apparatus.

It should be understood that data sources of the matrix and/or the vector may include but are not limited to the above-mentioned data sources.

Alternatively, the present disclosure provides a method of using the circuit apparatus to perform an activation function computation, where the method which may include: using the activation circuit of the main processing circuit to input a vector, and obtain an activation vector of the vector by computing.

In an alternative example, the activation circuit of the main processing circuit may obtain a numerical value for each value of an input vector through an activation function (input of the activation function is a numerical value, and output is also a numerical value) by computing, and output the numerical value to a corresponding position of an output vector. In an alternative example, the activation function may be: $y=\max(m, x)$, where x is an input numerical value, y is an output numerical value, and m is a constant. In an alternative example, the activation function may be: $y=\tanh(x)$, where x is an input numerical value, and y is an output numerical value. In an alternative example, the activation function may be: $y=\text{sigmoid}(x)$, where x is an input numerical value, y is an output numerical value. In an alternative example, the activation function may be a piecewise linear function; and in an alternative example, the activation function may be a function of randomly inputting a number and outputting a number.

In an alternative example, a source of the input vector may include (but is not limited to): an external data source of the apparatus.

In an alternative example, the input data may be from a computation result of matrix-multiply-vector performed by the apparatus.

In an alternative example, the input data may be from a computation result of matrix-multiply-matrix performed by the apparatus, or a computation result of the main processing circuit of the apparatus In an alternative example, the input data may be from a computation result obtained after the main processing circuit of the apparatus is biased.

Alternatively, the present disclosure provides a method of using the apparatus to realize BLAS (Basic Linear Algebra Subprograms), where the method may include: a GEMM computation refers to a computation of matrix-matrix multiplication in a BLAS library. A common representation of the computation is $C=\text{alpha}*\text{op}(S)*\text{op}(P)+\text{beta}*C$, where A and B are two input matrices, C is an output matrix, alpha and beta are scalars, op represents an operation performed on the matrix S or P, in addition, other supporting integers may be used as parameters to explain the width and height of the matrices A and B; specifically, a step of using the apparatus to realize the GEMM computation may be: before performing an op operation, the main processing circuit may perform data type conversion on the input matrix S and the matrix P; the conversion circuit of the main processing circuit may perform corresponding op operations on the matrix S and the matrix P respectively. In an alternative example, op may be a matrix transposition operation which may be realized by using a vector computation function or data rearrangement function of the main processing circuit (it has been mentioned that the main processing circuit has a data rearrangement circuit), and in in certain applications, the op may also be realized through the conversion circuit directly, taking the matrix transposition operation as an instance, the op operation may be realized by the matrix transposition circuit directly.

As an alternative example, op of a matrix may be null, and the op operation of the matrix may not be performed; the computation method of matrix-multiply-matrix may be used to perform a matrix multiplication computation between op(S) and op(P); the arithmetic and logic circuit of the main processing circuit may be used to perform an operation of multiplying each value in a result of op(S)*op(P) by alpha; as an alternative example, in case when alpha is 1, the operation of multiplying by alpha may not be performed; the arithmetic and logic circuit of the main processing circuit may be used to realize a computation of beta*C; as an alternative example, in case when beta is 1, the operation of multiplying by beta may not be performed; the arithmetic and logic circuit of the main processing circuit may be used to realize a step of adding corresponding positions of matrices alpha*op(S)*op(P) and beta*C together; as an alternative example, in case when beta is 0, the operation of adding may not be performed.

Alternatively, a GEMV computation refers to a computation of matrix-vector multiplication in a BLAS library. A common representation of the computation is C=alpha*op(S)*P+beta*C, where S is an input matrix, P is an input vector, C is an output vector, alpha and beta are scalars, and op represents an operation performed on the matrix S; specifically, a step of using the apparatus to realize the GEMV computation may be: before performing an op operation, the main processing circuit may perform data type conversion on the input matrix S and the matrix P; the conversion circuit of the main processing circuit may perform a corresponding op operation on the matrix S; as an alternative example, op may be a matrix transposition operation; the matrix transposition circuit of the main processing circuit may be used to realize the matrix transposition operation; as an alternative example, op of a matrix may be null, and the op operation may not be performed; the computation method of matrix-multiply-vector may be used to perform a matrix-vector multiplication between the matrix op(S) and the vector op(P); the arithmetic and logic circuit of the main processing circuit may be used to perform an operation of multiplying each value in a result of op(S)*P by alpha; as an alternative example, in case when alpha is 1, the operation of multiplying by alpha may not be performed; the arithmetic and logic circuit of the main processing circuit may be used to realize a computation of beta*C; as an alternative example, in case when beta is 1, the operation of multiplying by beta may not be performed; the arithmetic and logic circuit of the main processing circuit may be used to realize a step of adding corresponding positions of matrices alpha*op(S)*P and beta*C together; and as an alternative example, in case when beta is 0, the operation of adding may not be performed.

Alternatively, the present disclosure provides a method of realizing data type conversion, where the method may include: the data type conversion circuit of the main processing circuit may be used to realize data type conversion.

In an alternative example, a form of data type conversion may include but is not limited to: converting a floating point number to a fixed point number, converting a fixed point number to a floating point number, and the like.

Alternatively, the present disclosure provides a method of updating a weight, where the method may include: using the vector computing unit circuit of the main processing circuit to realize a function of weight updating during neural network training, specifically, the weight updating refers to a method of using a gradient of the weight to update the weight.

In an alternative example, the vector computing unit circuit of the main processing circuit may be used to perform addition and subtraction computations on the weight and the gradient of the weight, which are two vectors, to obtain a computation result, and the computation result is an updated weight.

In an alternative example, the vector computing unit circuit of the main processing circuit may be used to perform addition and subtraction computations on the weight and the gradient of the weight, which are two vectors, to obtain a computation result, and the computation result is an updated weight.

In an alternative example, the gradient of the weight may first be used for computing to obtain a group of momentum, then the momentum and the weight may be used to perform addition and subtraction computations to obtain an updated weight.

Alternatively, the present disclosure further provides a method of realizing a back computation of a fully connected layer, where the method may include: the back computation of the fully connected layer may be divided into two parts, as shown in FIG. 4a. FIG. 4a shows a process of a forward computation of the fully connected layer.

Alternatively, the present disclosure may realize a back operation of a convolutional layer, which is as follows: the back computation of the convolutional layer may be divided into two parts, FIG. 4a shows a process of a forward computation of the convolutional layer, and FIG. 4b shows a process of the back computation of the convolutional layer.

The back computations of the convolutional layers as shown in FIG. 4a and FIG. 4b may be performed by using the apparatus of FIG. 1e and the apparatus of FIG. 1f. When performing a forward computation or a back computation which in fact is a plurality of computations of a neural network, the plurality of computations may include but is not limited to one or more of: matrix-multiply-matrix, matrix-multiply-vector, convolution computation, activation computation, and the like.

FIG. 4a shows a forward computation of neural network provided by an example of the present disclosure, where each layer may use input data and a weight of the layer to obtain corresponding output data by performing computations according to a computation rule designated by a type of the layer; the forward computation (also referred to as inference) of a neural network is a process of obtaining output data by processing input data of each layer in a layer by layer manner, and performing computations, which has the following characteristics:

1) input of a layer:

input of a layer may be input data of a neural network;

input of a layer may be output data of another layer;

input of a layer may be output of the present layer at a last time (corresponding to a case of a recurrent neural network);

a layer may obtain input from a plurality of above-mentioned input sources simultaneously;

2) output of a layer:

output of a layer may serve as an output result of a neural network;

output of a layer may be input of another layer;

output of a layer may be input of the present layer at a next time (corresponding to a case of a recurrent neural network);

output of a layer may output a result to the plurality of above-mentioned output directions.

Specifically, a type of a computation of a layer in the neural network may include but is not limited to:

a convolutional layer (in other words, a convolution computation is to be performed);

a fully connected layer (in other words, a fully connected computation is to be performed);

a normalization layer: including a LRN (Local Response Normalization) layer, a BN (Batch Normalization) layer, and other types;

a pooling layer; and an activation layer: including but is not limited to the following types: a Sigmoid layer, a ReLU layer, a PReLu layer, a LeakyReLu layer, and a Tanh layer.

Alternatively, FIG. 4b shows a back computation of a layer of a neural network provided by the present disclosure. Two parts of computations may need to be performed in the back computation of each layer: a first part is to compute a gradient (a weight that is used in a weight updating step to update a weight of a current layer) of a weight by using a output data gradient that may be in a sparse representation and input data that may be in a sparse representation, and a second part is to compute an input data gradient (to be used as output data of a next layer in the back computation so that the back computation can be performed) by using an output data gradient that may be in a sparse representation and a weight that may be in a sparse representation; the back computation may follow an order that is opposite to an order of a forward computation to transfer a gradient reversely from a last layer.

In an alternative example, an output data gradient obtained from the back computation of a layer may be from: a gradient returned by a last lost function (or cost function) of the neural network; an input data gradient of another layer; or, an input data gradient of the present layer at a last time (corresponding to a case of a recurrent neural network).

Further, a layer may obtain an output data gradient from a plurality of above-mentioned sources simultaneously.

After the back computation of the neural network is completed, a gradient of a weight of each layer is obtained. In this step, a first input cache and a second input cache may be configured to store a weight and a gradient of the weight of a layer, then use the gradient of the weight in a computing unit to update the weight.

The above-mentioned computation is a computation of a layer of the neural network. For a multi-layer neural network, a realization may be that, in a forward computation, after the forward computation of a previous layer of the artificial neural network is completed, a computation instruction of a next layer may use output data obtained by a computing unit as input data of the next layer to perform a computation (or perform some operations on the output data then use the output data as input data of the next layer), at the same time, replace a weight with a weight of the next layer. In a back computation, after the back computation of a previous layer of the artificial neural network is completed, a computation instruction of a next layer may use an input data gradient obtained by a computing unit as an output data gradient of the next layer to perform a computation (or perform some operations on the input data gradient then use the input data gradient as output data gradient of the next layer), at the same time, replace a weight with a weight of the next layer. (Shown in FIG. 4a and FIG. 4b. FIG. 4b shows the back computation and FIG. 4a shows the forward computation)

Alternatively, the present disclosure may further realize a method of representing fixed point data, which is as follows: the method of fixed point conversion refers to converting a data representation of a data block in a network into a data representation having a fixed position for the decimal point (a manner of placing 0/1 bit of data that are mapped to circuit apparatus).

As an alternative example, a plurality groups of data may constitute a plurality of data blocks. The plurality of data blocks as a whole may be represented in the fixed point type by following the same fixed point representation method.

FIG. 1d shows a method of representing a fixed point data structure having few digits according to an example of the present disclosure. The position of 1 Bit represents symbol, the position of M represents an integer part, and the position of N represents a decimal part. Compared with a 32-bit floating point number representation, the present disclosure uses a fixed point data representation having few digits. In addition to fewer bits, for data of the same layer and the same type in a neural network, such as all weight data of a first convolutional layer, the present disclosure further sets a flag bit, which is the point location, to mark the position of the decimal point. In this way, the precision of a data representation and the representable data range may be adjusted according to the distribution of actual data.

A floating point number may be represented in 32 bits. The present disclosure uses a floating point number to realize a representation. In this way, bits of a numerical value may be reduced, less data may need to be transferred, and data of computations may be reduced.

Specifically, input data is shown by FIG. 3c (N samples, each sample has C channels, and a feature map of each channel has a height of H and a width of W), and a weight, which is a convolution kernel, is shown by FIG. 3d (with M convolution kernels, and each convolution kernel has C channels with a height being KH and a width being KW). For the N samples of the input data, rules for convolution computations are the same. Below is an explanation of a process of performing a convolution computation on a sample. Each of the M convolution kernels may be subject to the same computation on a sample, each convolution kernel may obtain a plane feature map by computations, and the M convolution kernels may obtain M plane feature maps by computations (for a sample, output of convolution is M feature maps), for a convolution kernel, an inner product computation may be performed on each plane of a sample, and the convolution kernel may slide in a direction of H and a direction of W, for instance, FIG. 3e is a figure showing that a convolution kernel performs an inner product computation at a position at lower right corner of a sample of input data; FIG. 3f shows a position of convolution sliding leftwards for one grid, and FIG. 3g shows a position of convolution sliding upwards for one grid.

If a first computation is a convolution computation, the input data may be convolution input data, and the weight data may be a convolution kernel. Accordingly, a first complexity may be calculated as first complexity=$\alpha$*C*kH*kW*M*N*W*C*H, where $\alpha$ is a convolution coefficient greater than 1; C, kH, kW, and M are values of four dimensions of the convolution kernel, and N, W, C, and H are values of four dimensions of the convolution input data. If the first complexity is greater than a preset threshold, the main processing circuit may determine whether the convolution input data and the convolution kernel are floating point data. If the convolution input data and the convolution kernel are floating point data, the main processing circuit may convert the convolution input data and the convolution kernel into fixed point data, and then perform convolution computations on the convolution input data and the convolution kernel according to the fixed point data type.

Specifically, the convolution may be processed by using the chip structure shown in FIG. 1a or FIG. 3d. When the first complexity is greater than the preset threshold, the data type conversion circuit of the main processing circuit (or may be referred to as main unit) may convert data in some or all convolution kernels of the weight to fixed point data, the control circuit of the main processing circuit may transfer data of some or all convolution kernels of the weight to basic processing circuits (or may be referred to as basic unit) that are directly connected to the main processing circuit via horizontal data input interfaces (for instance, gray vertical data pathways at the top of FIG. 1f). I. In an alternative example, each time, the control circuit of the main processing circuit may transfer a number or some numbers of data in a convolution kernel of the weight to a basic processing circuit, for instance, for a basic processing circuit, a $1^{st}$ number in a $3^{rd}$ row may be transferred at a $1^{st}$ time, a $2^{nd}$ number in the $3^{rd}$ row may be transferred at a $2^{nd}$ time, a $3^{rd}$ number in the $3^{rd}$ row may be transferred at a $3^{rd}$ time, . . . , or first two numbers in a $3^{rd}$ row may be transferred at a $1^{st}$ time, a $3^{rd}$ number and a $4^{th}$ number in the $3^{rd}$ row may be transferred at a $2^{nd}$ time, a $5^{th}$ number and a $6^{th}$ number in the $3^{rd}$ row may be transferred at a $3^{rd}$ time, . . . . Another alternative example may be that, each time, the control circuit of the main processing circuit may transfer a number or some numbers of data of some convolution kernels of the weight to a basic processing circuit, for instance, for a basic processing circuit, $1^{st}$ numbers in a $3^{rd}$, $4^{th}$, and $5^{th}$ rows may be transferred at a $1^{st}$ time, $2^{nd}$ numbers in the $3^{rd}$, $4^{th}$, and $5^{th}$ rows may be transferred at a $2^{nd}$ time, $3^{rd}$ numbers in the $3^{rd}$, $4^{th}$, and $5^{th}$ rows may be transferred at a $3^{rd}$ time, . . . , or first two numbers in a $3^{rd}$, $4^{th}$, and $5^{th}$ rows may be transferred at a $1^{st}$ time, $3^{rd}$ numbers and $4^{th}$ numbers in the $3^{rd}$, $4^{th}$, and $5^{th}$ rows may be transferred at a $2^{nd}$ time, $5^{th}$ numbers and $6^{th}$ numbers in the $3^{rd}$, $4^{th}$, and $5^{th}$ rows may be transferred at a $3^{rd}$ time, . . . .

The control circuit of the main processing circuit may divide input data according to positions of convolution, and may transfer data of some or all positions of convolution in the input data to the basic processing circuits that are directly connected to the main processing circuit via the vertical data input interfaces (for instance, the gray horizontal data pathways on the left of the basic processing circuit array shown in FIG. 1f). In an alternative example, each time, the control circuit of the main processing circuit may transfer a number or some numbers of data of a position of convolution in the input data to a basic processing circuit; for instance, for a basic processing circuit, a $1^{st}$ number in a $3^{rd}$ column may be transferred at a $1^{st}$ time, a $2^{nd}$ number in the $3^{rd}$ column may be transferred at a $2^{nd}$ time, a $3^{rd}$ number in the $3^{rd}$ column may be transferred at a $3^{rd}$ time, . . . , or first two numbers in a $3^{rd}$ column may be transferred at a $1^{st}$ time, a $3^{rd}$ number and a $4^{th}$ number in the $3^{rd}$ column may be transferred at a $2^{nd}$ time, a $5^{th}$ number and a $6^{th}$ number in the $3^{rd}$ column may be transferred at a $3^{rd}$ time, . . . ; another case in an alternative example may be that, each time, the control circuit of the main processing circuit may transfer a number or some numbers of data of some positions of convolution in the input data to a basic processing circuit; for instance, for a basic processing circuit, $1^{st}$ numbers in a $3^{rd}$, $4^{th}$, and $5^{th}$ columns may be transferred at a $1^{st}$ time, $2^{nd}$ numbers in the $3^{rd}$, $4^{th}$, and $5^{th}$ columns may be transferred at a $2^{nd}$ time, $3^{rd}$ numbers in the $3^{rd}$, $4^{th}$, and $5^{th}$ columns may be transferred at a $3^{rd}$ time, . . . , or first two numbers in a $3^{rd}$, $4^{th}$ and $5^{th}$ columns may be transferred at a $1^{st}$ time, $3^{rd}$ numbers and $4^{th}$ numbers in the $3^{rd}$, $4^{th}$, and $5^{th}$ columns may be transferred at a $2^{nd}$ time, $5^{th}$ numbers and $6^{th}$ numbers in the $3^{rd}$, $4^{th}$, and $5^{th}$ columns may be transferred at a $3^{rd}$ time, . . . .

After the basic processing circuit receives the data of the weight, the basic processing circuit may transfer the data to a subsequent basic processing circuit that is connected to the basic processing circuit via a horizontal data output interface of the basic processing circuit (for instance, horizontal data pathways filled in white at the center of the basic processing circuit array shown in FIG. 1f); after the basic processing circuit receives the input data, the basic processing circuit may transfer the data to a subsequent basic processing circuit that is connected to the basic processing circuit via a vertical data output interface of the basic processing circuit (for instance, vertical data pathways filled in white at the center of the basic processing circuit array shown in FIG. 1f); furthermore, each basic processing circuit performs computations on received data. In an alternative example, each time, the basic processing circuit may perform multiplication of one or a plurality of groups of two data, then accumulate a result in the register and/or on-chip cache. In an alternative example, each time, the basic processing circuit may compute an inner product of one or a plurality of groups of two vectors, then accumulate a result in the register and/or on-chip cache; after the basic processing circuit obtains a result by computing, the basic processing circuit may output the result through the data output interface. In an alternative example, the computation result may be a final result or an intermediate result of an inner product computation; specifically, if the basic processing circuit has an output interface that is directly connected to the main processing circuit, the basic processing circuit may output the result via the interface, if no, the basic processing circuit may output the result towards a basic processing circuit that can output to the main processing circuit directly (for instance, in FIG. 1f, basic processing circuits at a bottom row can transfer results to the main processing circuit directly, and other basic processing circuits may transfer results downwards via vertical output interfaces).

After the basic processing circuit receives a computation result from another basic processing circuit, the basic processing circuit may transfer the data to yet another basic processing circuit that is connected to the basic processing circuit or to the main processing circuit; specifically, the basic processing circuit may output a result towards a direction to the main processing circuit (for instance, basic processing circuits at a bottom row can transfer results to the main processing circuit directly, and other basic processing circuits may transfer results downwards via vertical output interfaces); and the main processing circuit may receive an inner product computation result transferred by each basic processing circuit to obtain an output result.

Referring to FIG. 2e, which shows a matrix-multiply-matrix computation, the first computation may be: a matrix-multiply-matrix computation, where the input data may be a first matrix in the matrix-multiply-matrix computation, and the weight data may be a second matrix in the matrix-multiply-matrix computation. Accordingly, the first complexity may be calculated as first complexity=$\beta*F*G*E*F$, where $\beta$ is a matrix coefficient greater than or equal to 1, F and G are row and column values of the first matrix, and E and F are row and column values of the second matrix. If the first complexity is greater than the preset threshold, the main processing circuit may determine whether the first matrix and the second matrix are floating point data. If the first matrix and the second matrix are floating point data, the main processing circuit may convert the first matrix and the second matrix into fixed point data, and then perform a matrix-multiply-matrix computation on the first matrix and the second matrix according to the fixed point data type.

Figure 4C:
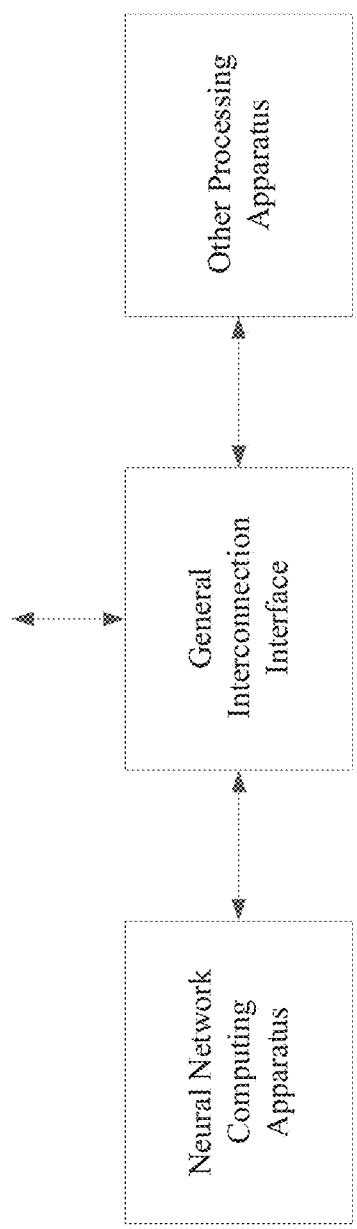
FIG. 4c is a structural diagram of a processing apparatus according to the disclosure.
Figure 4D:
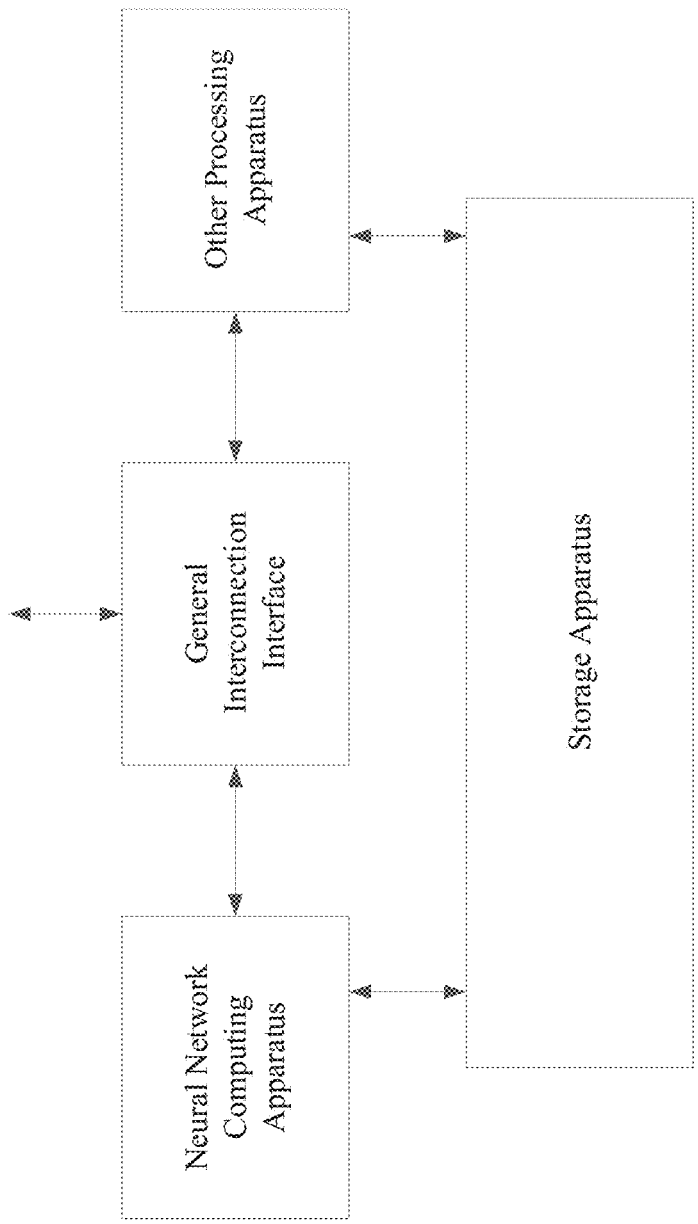
FIG. 4d is another structural diagram of a processing apparatus according to the disclosure.
Figure 4E:
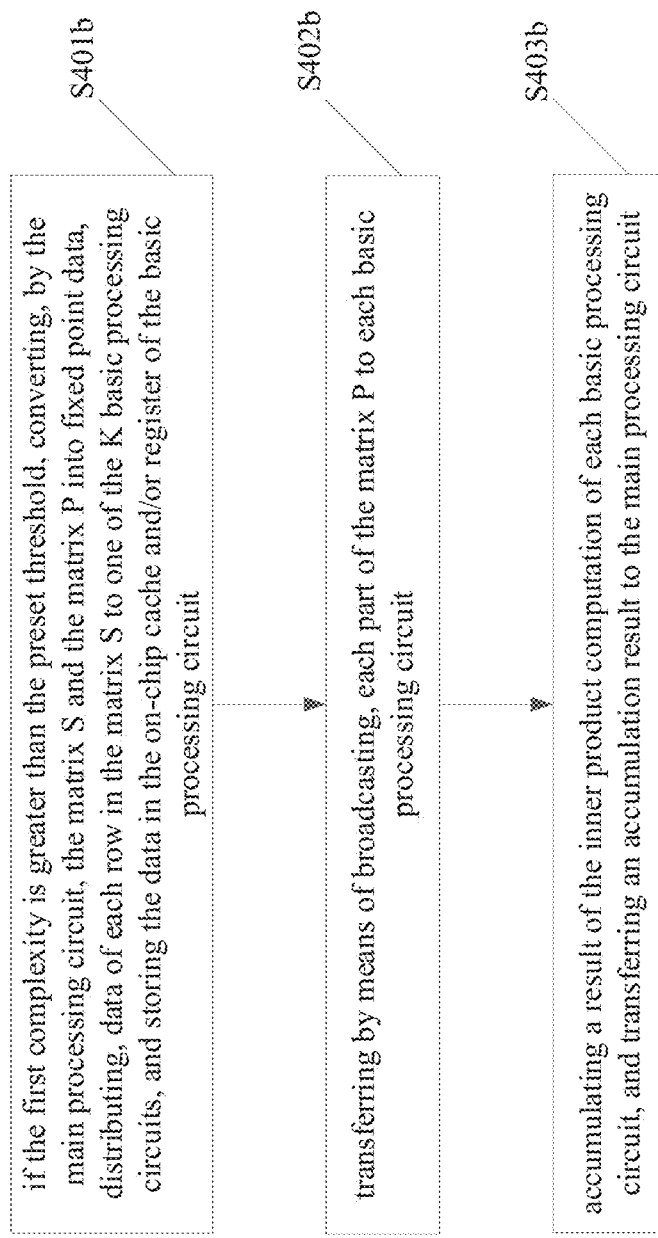
FIG. 4e is a method flow chart of a matrix-multiply-matrix computation.

FIG. 4e is a flow chart of using the apparatus of FIG. 1e to perform a matrix-multiply-matrix computation. Below is a description of performing multiplication of a matrix S with a size of M rows and L columns and a matrix P with a size of L rows and N columns, where each row of the matrix S is as long as each column of the matrix P. As shown in FIG. 3f, the neural network computing apparatus has K basic processing circuits. The method may include: S401b, if the first complexity is greater than the preset threshold, converting, by the main processing circuit, the matrix S and the matrix P into fixed point data; distributing, by the control circuit of the main processing circuit, data of each row in the matrix S to one of the K basic processing circuits; storing, by the basic processing circuit, the received data in the on-chip cache and/or register. Specifically, the data may be transferred to basic processing circuits that are directly connected to the main processing circuit.

As an alternative example, M is the count of rows of the matrix S, if M<=K, the control circuit of the main processing circuit may distribute a row of the matrix S to M basic processing circuits respectively; and as an alternative example, M is the count of rows of the matrix S, if M>K, the control circuit of the main processing circuit may distribute data of one or a plurality of rows of the matrix S to each basic processing circuits respectively.

In a case where Mi rows of the matrix S are distributed to an $i^{th}$ basic processing circuit, a set of the Mi rows can be referred to as Ai. FIG. 3g shows a computation to be performed by the $i^{th}$ basic processing circuit.

As an alternative example, in each of the basic processing circuits, for instance, in the $i^{th}$ basic processing circuit: the matrix Ai distributed by the main processing circuit may be received and stored in the register and/or on-chip cache of the $i^{th}$ basic processing circuit. Technical effects of the example include that data transferred afterwards may be reduced, the computational efficiency may be improved, and the power consumption may be reduced.

The method may include S402b: transferring by means of broadcasting, by the control circuit of the main processing circuit, each part of the matrix P to each basic processing circuit;

As an alternative example, each part of the matrix P may be broadcast for only once to the register or on-chip cache of each basic processing circuit, the $i^{th}$ basic processing circuit may fully reuse data of the matrix P which is obtained at this time to complete an inner product computation corresponding to each row of the matrix Ai. The reusing mentioned in the example may be repeatedly using data by the basic processing circuits during computation, for instance, reusing data of the matrix P may be using the data of the matrix P for a plurality of times.

As an alternative example, the control circuit of the main processing circuit may sequentially broadcast each part of the matrix P to the register or on-chip cache of each basic processing circuit, the $i^{th}$ basic processing circuit may not reuse the data of the matrix P which is obtained at each time, and may complete an inner product computation corresponding to each row of the matrix Ai at different times; as an alternative example, the control circuit of the main processing circuit may sequentially broadcast each part of the matrix P to the register or on-chip cache of each basic processing circuit, the $i^{th}$ basic processing circuit may partially reuse the data of the matrix P which is obtained at each time to complete an inner product computation corresponding to each row of the matrix Ai; and in an alternative example, each of the basic processing circuits, for instance, the $i^{th}$ basic processing circuit, may compute an inner product of the data of the matrix Ai and the data of the matrix P.

The method may further include S403b: accumulating, by the accumulator circuit of each of the basic processing circuits, a result of the inner product computation, and transferring an accumulation result to the main processing circuit.

As an alternative example, the basic processing circuits may transfer a partial sum obtained from each inner product computation to the main processing circuit for accumulating. In an alternative example, a partial sum obtained from the inner product computation performed each time by the basic processing circuits may be stored in the on-chip caching circuit and/or the register of the basic processing circuits, and transferred to the main processing circuit after the accumulation ends; and as an alternative example, a partial sum obtained from the inner product computation performed each time by the basic processing circuits may also, in some cases, be stored in the on-chip caching circuit and/or the register of the basic processing circuits for accumulating, and in some cases, be transferred to the main processing circuit for accumulating, then be transferred to the main processing circuit after the accumulation ends.

FIG. 2d is a schematic diagram of a matrix-multiply-vector computation. The first computation may be: a matrix-multiply-vector computation, where the input data may be a first matrix in the matrix-multiply-vector computation, and the weight data may be a vector in the matrix-multiply-vector computation. Accordingly, the first complexity may be calculated as first complexity=$\beta*F*G*F$, where $\beta$ is a matrix coefficient greater than or equal to 1, F and G are row and column values of the first matrix, and F is a column value of the vector. If the first complexity is greater than the preset threshold, the main processing circuit may determine whether the first matrix and the vector are floating point data. If the first matrix and the vector are floating point data, the main processing circuit may convert the first matrix and the vector into fixed point data, and then perform a matrix-multiply-vector computation on the first matrix and the vector according to the fixed point data type.

Figure 4F:
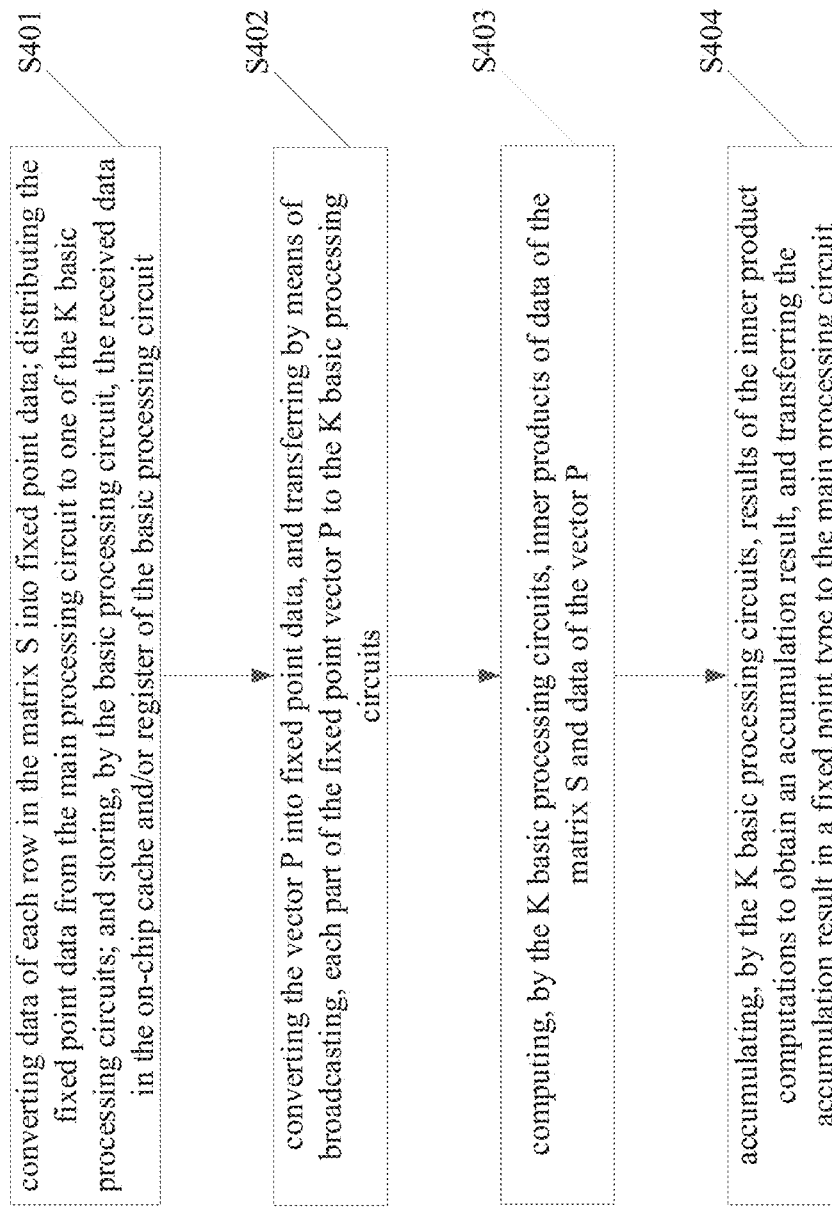
FIG. 4f is a method flow chart of a matrix-multiply-vector computation.

FIG. 4f shows an implementation method of matrix-multiply-vector, which may include: S401, converting, by the data type conversion circuit of the main processing circuit, data of each row in the matrix S into fixed point data; distributing, by the control circuit of the main processing circuit, the fixed point data to one of the K basic processing circuits; and storing, by the basic processing circuit, the received data in the on-chip cache and/or register of the basic processing circuit; as an alternative example, M is the count of rows of the matrix S, if M<=K, the control circuit of the main processing circuit may distribute a row of the matrix S to the K basic processing circuits respectively; and as an alternative example, M is the count of rows of the matrix S, if M>K, the control circuit of the main processing circuit may distribute data of one or a plurality of rows of the matrix S to each basic processing circuits respectively.

A set of rows of the matrix S that are distributed to an $i^{th}$ basic processing circuit may be referred to as Ai, which has Mi rows in total. FIG. 3e shows a computation to be performed by the $i^{th}$ basic processing circuit.

As an alternative example, for each basic processing circuit, such as in the $i^{th}$ basic processing circuit, the received data such as a matrix Ai which is transferred by means of distributing may be stored in the register and/or on-chip cache. Technical effects of the example include that data that are transferred afterwards by means of distributing may be reduced, the computational efficiency may be improved, and the power consumption may be reduced.

The method may further include S402: converting, by the data type conversion data type conversion circuit of the main processing circuit, the vector P into fixed point data, and transferring by means of broadcasting, by the control circuit of the main processing circuit, each part of the vector P having a fixed point type to the K basic processing circuits; as an alternative example, the control circuit of the main processing circuit may broadcast each part of the vector P for only once to the register or on-chip cache of each basic processing circuit, the $i^{th}$ basic processing circuit may fully reuse data of the vector P which is obtained at this time to complete an inner product computation corresponding to each row of the matrix Ai. Technical effects of the example include that the data of the vector P which are repeatedly transferred from the main processing circuit to the basic processing circuits may be reduced, the execution efficiency may be improved, and the power consumption for transferring may be reduced.

As an alternative example, the control circuit of the main processing circuit may sequentially broadcast each part of the vector P to the register or on-chip cache of each basic processing circuit, the $i^{th}$ basic processing circuit may not reuse data of the vector P which is obtained at each time, and may complete an inner product computation corresponding to each row of the matrix Ai at different times. Technical effects of the example include that the data of the vector P which is transferred at a single time in the basic processing circuits may be reduced, the capacity of the cache and/or register of the basic processing circuits may be reduced, the execution efficiency may be improved, the power consumption of transferring may be reduced, and the costs may be reduced.

As an alternative example, the control circuit of the main processing circuit may sequentially broadcast each part of the vector P to the register or on-chip cache of each basic processing circuit, the $i^{th}$ basic processing circuit may partly reuse data of the vector P which is obtained at each time to complete an inner product computation corresponding to each row of the matrix Ai. Technical effects of the example include that the data transferred from the main processing circuit to the basic processing circuits may be reduced, the data that are transferred within the basic processing circuits may be reduced, the execution efficiency may be improved, and the power consumption of transferring may be reduced.

The method may further include S403: computing, by the inner product computing unit circuit of the K basic processing circuits, an inner product of the matrix S and the vector P, for instance, computing, by the $i^{th}$ basic processing circuit, an inner product of the data of matrix Ai and the data of the vector P.

The method may further include S404: accumulating, by the accumulator circuit of the K basic processing circuits, a result of the inner product computation to obtain an accumulation result, and transferring the accumulation result in a fixed point type to the main processing circuit.

As an alternative example, a partial sum obtained from the inner product computation performed each time by the basic processing circuits may be transferred to the main processing circuit for accumulating (the partial sum refers to part of the accumulation result, for instance, if the accumulation result is F1*G1+F2*G2+F3*G3+F4*G4+F5*G5, the partial sum may be the value of F1*G1+F2*G2+F3*G3). Technical effects of the example include that computations performed within the basic processing circuits may be reduced, and the computational efficiency of the basic processing circuits may be improved.

In an alternative example, a partial sum obtained from the inner product computation performed each time by the basic processing circuits may be stored in the on-chip caching circuit and/or the register of the basic processing circuits, and transferred to the main processing circuit after the accumulation ends. Technical effects of the example include that data transferred between the basic processing circuits and the main processing circuit may be reduced, the computational efficiency may be improved, and the power consumption of data transferring may be reduced.

As an alternative example, a partial sum obtained from the inner product computation performed each time by the basic processing circuits may also, in some cases, be stored in the on-chip caching circuit and/or the register of the basic processing circuits for accumulating, and in some cases, be transferred to the main processing circuit for accumulating, then be transferred to the main processing circuit after the accumulation ends. Technical effects of the example include that data transferred between the basic processing circuits and the main processing circuits may be reduced, the computational efficiency may be improved, the power consumption of data transferring may be reduced, computations performed within the basic processing circuits may be reduced, and the computational efficiency of the basic processing circuits may be improved.

The present disclosure further provides an integrated circuit chip apparatus which may be configured to perform a forward computation of a neural network, where the neural network may include a plurality of layers, and the apparatus may include a processing circuit and an external interface; the external interface may be configured to receive a first operation instruction; and the processing circuit may be configured to parse the first operation instruction to obtain a first computation and corresponding input data and weight data of the first operation instruction which are included in an $i^{th}$ layer of the forward computation, where i may be 1, if 1 is 1, the input data may be original input data, and when i is greater than or equal to 2, the input data can be output data of a previous layer, such as output data of $i$-$1^{th}$ layer.

The processing circuit may further be configured to determine a first complexity of a first computation according to the input data, the weight data, and the first computation, and determine a first data type of the input data and the weight data when performing the first computation according to the first complexity, where the first data type may include: a floating point type or a fixed point type.

The processing circuit may further be configured to perform the first computation included in an $i^{th}$ layer of the forward computation on the input data and the weight data according to the first data type.

Figure 1H:
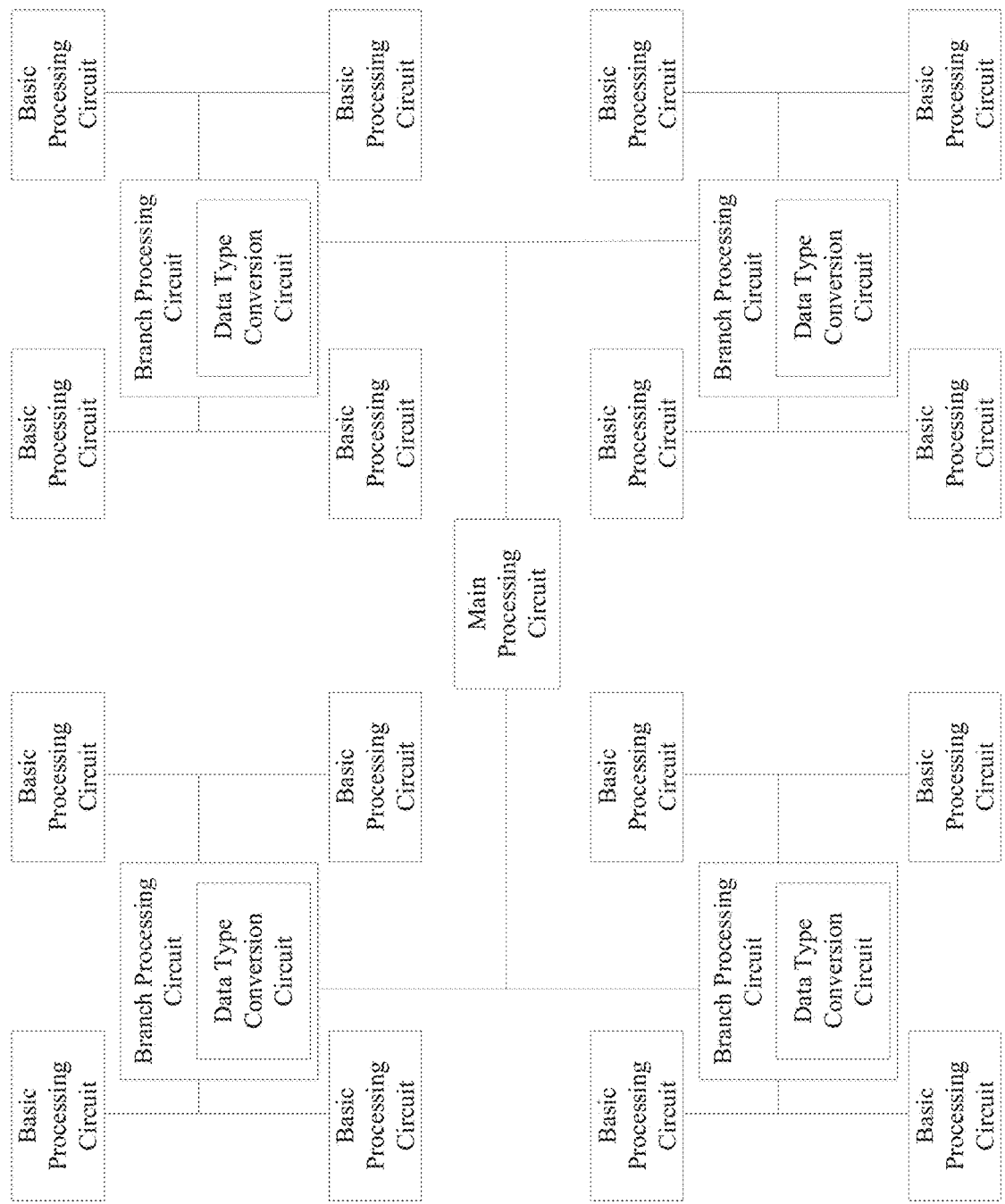
FIG. 1h is a structural diagram of integrated circuit chip apparatus.
Figure 11:
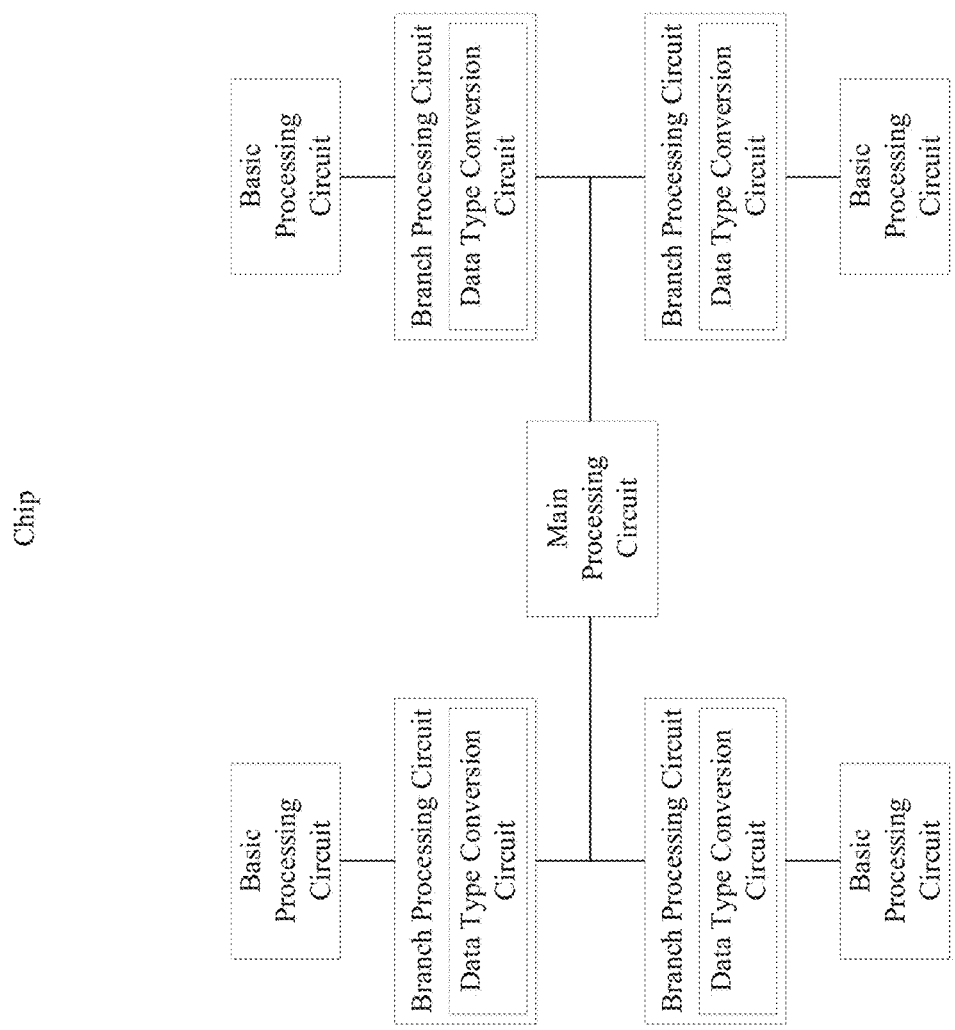

FIG. 1h is a structural diagram of integrated circuit chip apparatus. As shown in FIG. 1a, the chip apparatus may include a main processing circuit, a basic processing circuit, and a branch processing circuit. Specifically, the integrated circuit chip apparatus may include: a main processing circuit, k branch circuits (as shown in FIG. 1h, k=4, in in certain applications, k may be other numerical value such as 8 and 16), and k groups of basic processing circuits, where the main processing circuit may be connected to the k branch circuits respectively, each of the k branch circuits may correspond to each group of the k groups of basic processing circuits, and one group of basic processing circuits may include at least one basic processing circuit; as shown in FIG. 1h, the branch circuit may include: a data type conversion circuit that may be configured to convert data between a floating point data type and a fixed point data type; the main processing circuit may be configured to perform neural network computations in series, and transfer data to the k branch circuits that are connected to the main processing circuit; the k branch circuits may be configured to forward the data transferred between the main processing circuit and the k groups of basic processing circuits, and determine whether to turn on the data type conversion circuits according to computations of the data transferred; the data type conversion circuit may be configured to convert the data transferred; and the k basic processing circuits may be configured to perform neural network computations in parallel according to the data transferred or converted data transferred, and transfer a computation result to the main processing circuit.

In an alternative example, as shown in FIG. 1a, the main processing circuit may also include: a data type conversion circuit, where the data type conversion circuit may be configured to convert received or transferred data from floating point data to fixed point data. Of course, in in certain applications, the data type conversion circuit may also convert fixed point data into floating point data. The present disclosure does not restrict a form of the data type conversion circuit.

Referring to apparatus shown in FIG. 1i, in the apparatus, a branch processing circuit may be connected to a main processing circuit separately. The apparatus shown in FIG. 1i may include a main processing circuit and N basic processing circuits, where the main processing circuit (whose structure is shown in FIG. 1c) may be connected to the N basic processing circuits directly or indirectly. If the main processing circuit is connected to the N basic processing circuits indirectly, an alternative connection scheme is shown in FIG. 1h, where N/4 branch processing circuits may be included, and each branch processing circuit may be connected to four basic processing circuits respectively. Regarding circuits that are included in the main processing circuit and the N basic processing circuits, a description of them can be seen in the description of FIG. 1a, which is omitted here. It should be explained that the basic processing circuits may also be arranged inside the branch processing circuits, and besides, a count of basic processing circuits that are connected to each branch processing circuit may not be restricted to 4. Manufacturers can set the count according to actual needs. The main processing circuit and/or the N basic processing circuits may all include a data type conversion circuit. Specifically, it may be the main processing circuit that includes a data type conversion circuit, and may also be the N basic processing circuits or some of the basic processing circuits that include a data type conversion circuit, and may further be the main processing circuit and the N basic processing circuits that include a data type conversion circuit. The main processing circuit may dynamically allocate an entity to perform a step of data type conversion according to a neural network computation instruction. Specifically, the main processing circuit may determine whether to turn on the data type conversion circuit to perform the step of data type conversion on received data according to its loads. Specifically, a value of the loads may be set as a plurality of ranges, where each range corresponds to a different entity for performing the step of data type conversion. Taking three ranges as an instance, range 1 corresponds to light loads, where the main processing circuit may perform the step of data type conversion alone; range 2 corresponds to loads between range 1 and range 3, where the main processing circuit or the N basic processing circuits may perform the step of data type conversion together; and range 3 corresponds to heavy loads, where the N basic processing circuits may perform the step of data type conversion.

Figure 1J:
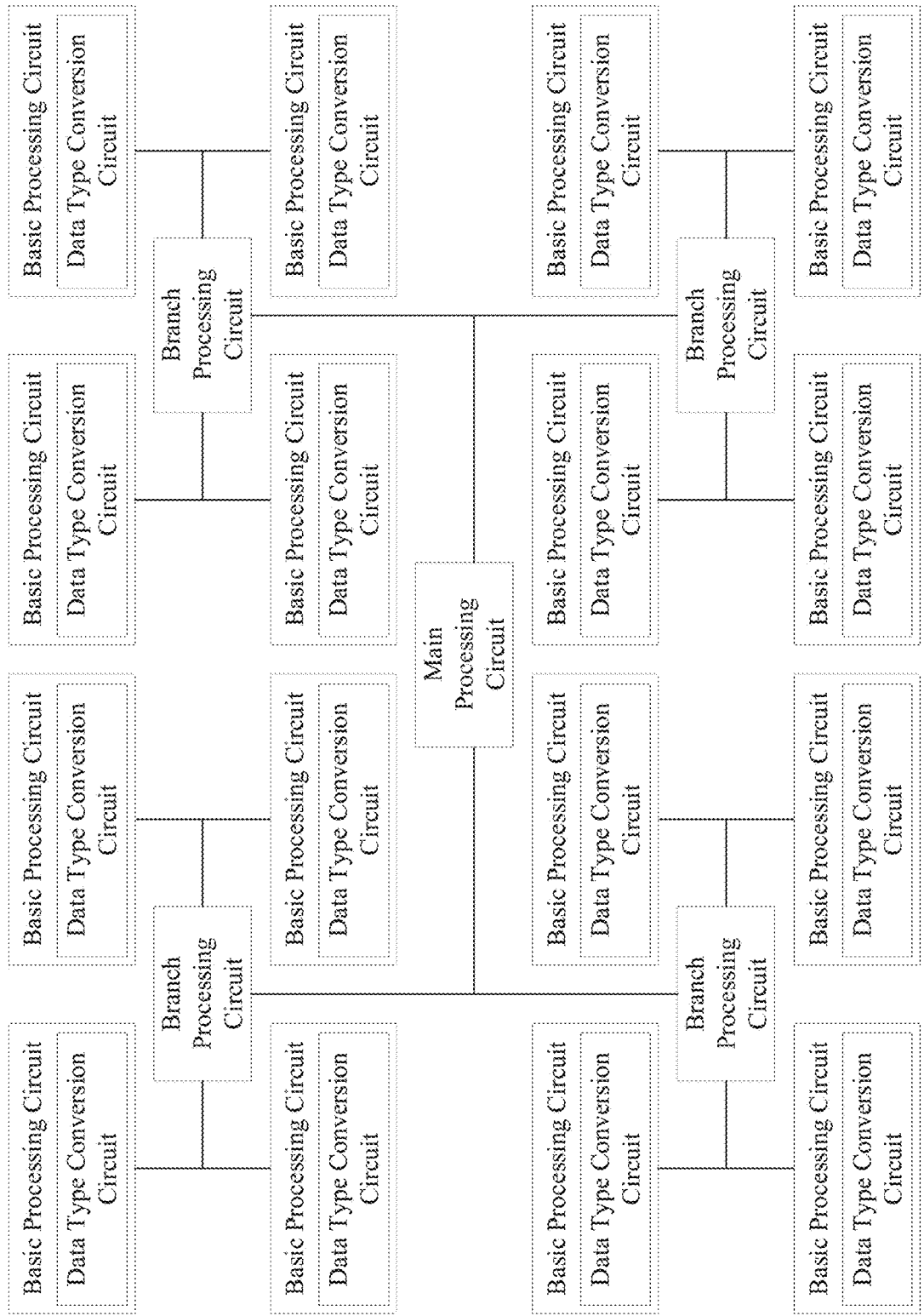
FIG. 1j is a structural diagram of integrated circuit chip apparatus.

Referring to a structure shown in FIG. 1j, the structure may include a main processing circuit (capable of performing vector operation) and a plurality of basic processing circuits (capable of performing inner product operation). A technical effect of the combination is that the apparatus can not only use the basic processing circuits to perform matrix and vector multiplication, but can also use the main processing circuit to perform any other vector computations, so that the apparatus may complete more computations faster with a configuration where a limited count of hardware circuits are included. The combination may reduce a count of times that data is transferred with the outside of the apparatus, improve computational efficiency, and reduce power consumption. Besides, in the chip, a data type conversion circuit may be arranged in the basic processing circuits and/or the main processing circuit, so that floating point data may be converted into fixed point data when a neural network computation is being performed, and fixed point data may also be converted into floating point data. In addition, the chip may also dynamically allocate a circuit to perform data type conversion according to the amount of computation (loads) of each circuit (mainly the main processing circuit and the basic processing circuits), which may reduce complex procedures of data computation and reduce power consumption. By dynamically allocating a circuit to perform data type conversion, the computational efficiency of the chip may not be affected. An allocation method may include but is not limited to: load balancing, load minimum allocation, and the like.

Figure 1K:
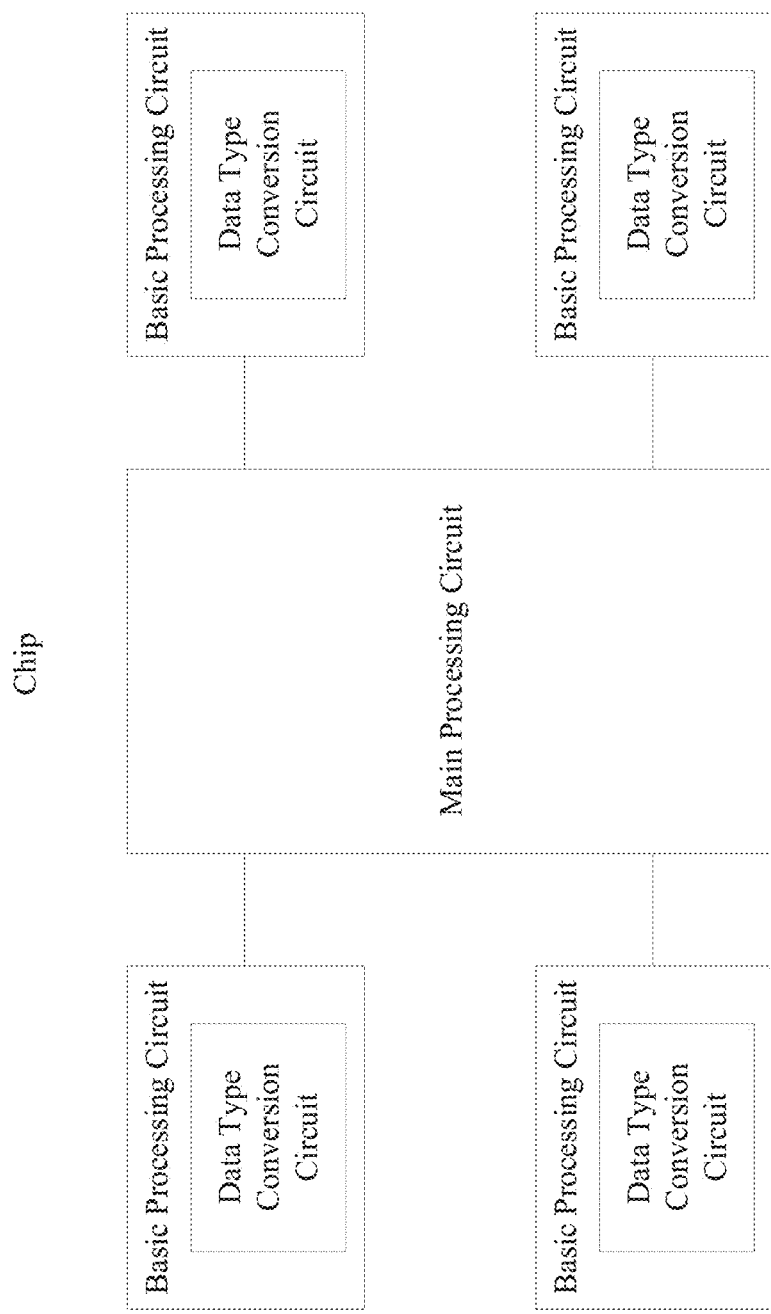
FIG. 1k is a structural diagram of other integrated circuit chip apparatus.

Referring to apparatus shown in FIG. 1k, the apparatus does not include any branch processing circuit. The apparatus in FIG. 1k may include a main processing circuit and N basic processing circuits, where the main processing circuit (whose structure is shown in FIG. 1c) may be connected to the N basic processing circuits directly or indirectly. If the main processing circuit is connected to the N basic processing circuits indirectly, an alternative scheme of connection is shown in FIG. 1j, where N/4 branch processing circuits may be included, and each branch processing circuit may be connected to four basic processing circuits respectively. Regarding circuits that are included in the main processing circuit and the N basic processing circuits, a description of them can be seen in the description of FIG. 1a, which is omitted here. It should be explained that the basic processing circuits may also be arranged inside the branch processing circuits, and besides, a count of basic processing circuits that are connected to each branch processing circuit may not be restricted to 4. Manufacturers can set the count according to actual needs. The main processing circuit and/or the N basic processing circuits may all include a data type conversion circuit. Specifically, it may be the main processing circuit that includes a data type conversion circuit, and may also be the N basic processing circuits or some of the basic processing circuits that include a data type conversion circuit, and may further be the main processing circuit and the N basic processing circuits that include a data type conversion circuit. The main processing circuit may dynamically allocate an entity to perform a step of data type conversion according to a neural network computation instruction. A method of allocating an entity to perform a step of data type conversion can be seen in the description of the example shown in FIG. 1i.

Figure 1L:
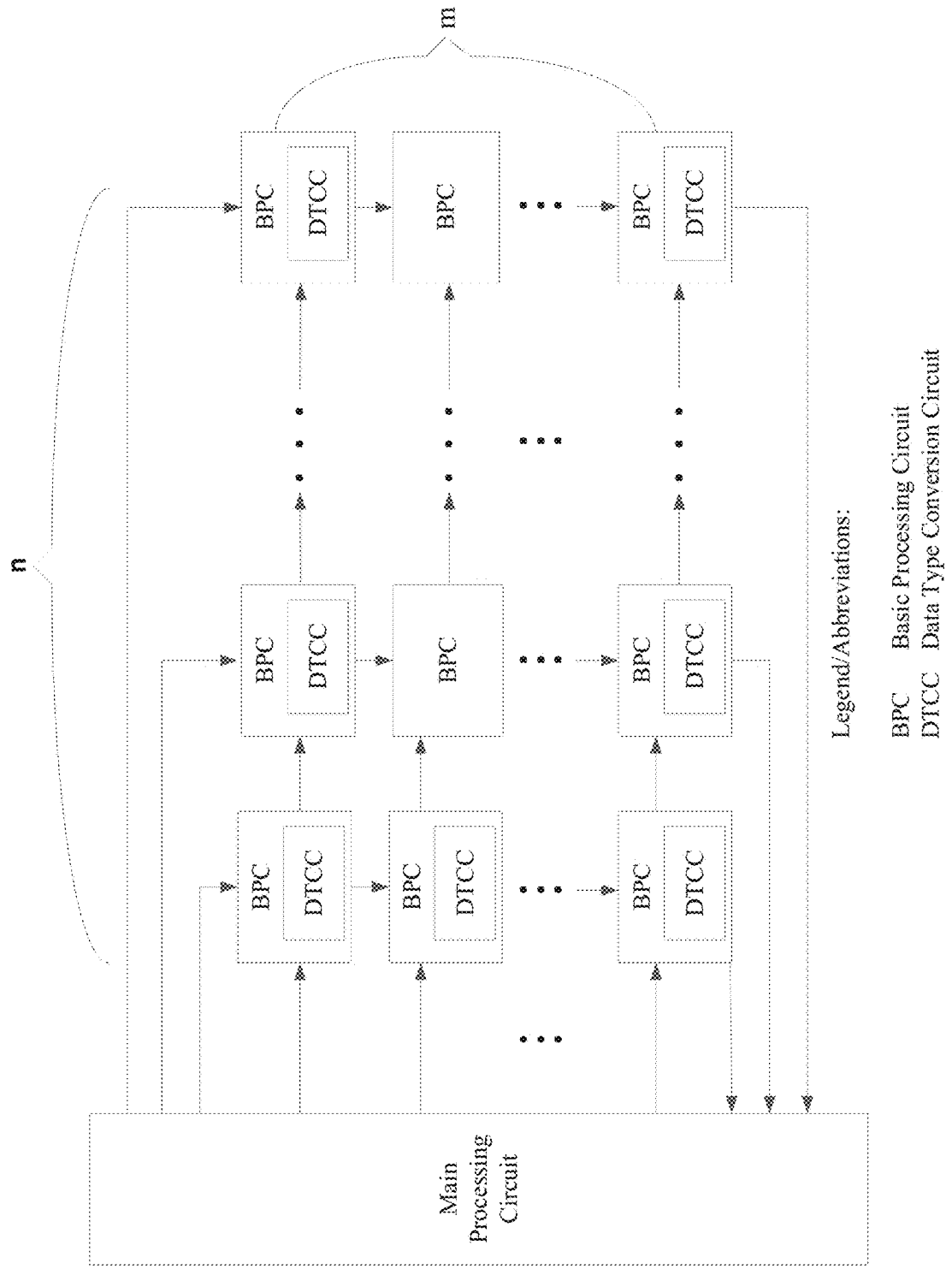
FIG. 1l is a structural diagram of integrated circuit chip apparatus.

FIG. 1l shows integrated circuit chip apparatus provided by the present disclosure. The integrated circuit chip apparatus may include: a main processing circuit and a plurality of basic processing circuits, where the plurality of basic processing circuits are arranged in a form of array (an m*n array), the value range of m and n is an integer greater than or equal to 1, and at least one of m and n is greater than or equal to 2. For the plurality of basic processing circuits that are arranged in the form of a m*n array, each basic processing circuit may be connected to an adjacent basic processing circuit, and the main processing circuit may be connected to k basic processing circuits of the plurality of basic processing circuits, where the k basic processing circuits may be: n basic processing circuits in a first row, n basic processing circuits in an $m^{th}$ row, and/or m basic processing circuits in a first column. In the integrated circuit chip apparatus shown in FIG. 1l, the main processing circuit and/or the plurality of basic processing circuits may include a data type conversion circuit, and specifically, some basic processing circuits of the plurality of basic processing circuits may include a data type conversion circuit. For instance, in an alternative example, the k basic processing circuits may be configured with a data type conversion circuit. In this way, the n basic processing circuits may perform a step of data type conversion on data of the m basic processing circuits of a current column. This configuration may improve computational efficiency and reduce power consumption. For the n basic processing circuits in the first row, since they are the first to receive data sent from the main processing circuit, by converting the received data into fixed point data, computations performed by subsequent basic processing circuits and data transferred by the subsequent basic processing circuits may be reduced. Similarly, configuring the m basic processing circuits of the first column with a data type conversion circuit may also have technical effects of fewer computations and less power consumption. In addition, according to the structure, the main processing circuit may use a dynamic data transferring strategy. For instance, the main processing circuit may broadcast data to the m basic processing circuits of the first column, and distribute data to the n basic processing circuits of the first row. A technical effect of the example is that by transferring different data to the basic processing circuits via different data input ports, the basic processing circuit may know the type of data merely according to a receiving port of the data without the need of distinguishing the type of the received data.

An example of the present disclosure provides an integrated circuit chip apparatus. The integrated circuit chip apparatus may include a main processing circuit (may also be referred to as a main unit) and a plurality of basic processing circuit (may also be referred to as basic units). A structure of the example is shown in FIG. 1f, where inside a dashed box is an internal structure of the neural network computing apparatus, a gray arrow indicates a data transferring path between the main processing circuit and the basic processing circuits, and an outlined arrow indicates a data transferring path between the respective basic processing circuits (adjacent basic processing circuits) in the basic processing circuit array. The length and width of the basic processing circuit array may be different. In other words, the values of m and n may be different, and may be the same. The values are not restricted in the present disclosure.

Figure 1M:
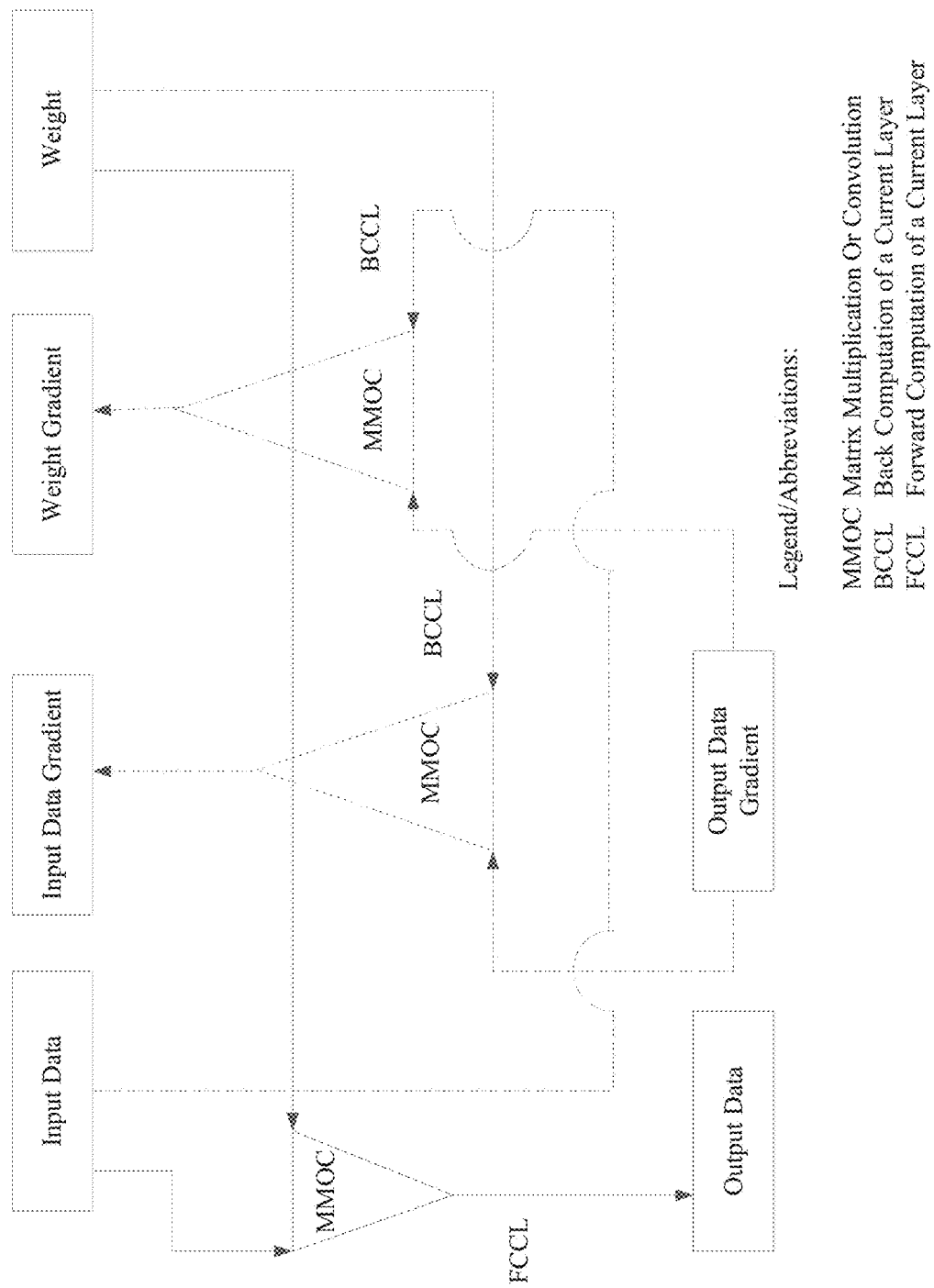
FIG. 1m is a schematic diagram of a neural network training method.

As shown in FIG. 1m, a step of neural network training may include: performing, by each layer of a (multi-layer) neural network, forward computation subsequently; performing a back computation subsequently according to a reverse order of the layers to obtain a weight gradient; and updating a weight of the forward computation by using the obtained weight gradient.

This is a sequential iteration of neural network training, which may be performed repeatedly (in other words, a plurality times of iteration computations) for a plurality of times during an entire training process.

The present disclosure further provides neural network computing apparatus. The apparatus may include one or a plurality of chips shown in FIG. 1a or FIG. 1b, where the apparatus may be configured to acquire data to be computed and control information from other processing apparatus, perform specified neural network operations, and transfer execution results to peripheral apparatus through an I/O interface. The peripheral apparatus may include a camera, a monitor, a mouse, a keyboard, a network card, a WIFI interface, a server, and the like. When more than one chips shown in FIG. 1a or FIG. 1b are included, the chips may be connected to and transfer data to each other through a structure, for example, the chips may be interconnected and transfer data via a PCIE bus to support neural network operations with larger scale. In this case, the chips as shown in FIG. 1a or FIG. 1b may share the same control system, or have separate control systems. The chips may share a memory, or have their own memories. In addition, an interconnection method of the chips as shown in FIG. 1a or FIG. 1b may be any interconnection topology.

The neural network computing apparatus may have good compatibility and may be connected to various types of servers through a PCIE interface.

The present disclosure also provides a processing apparatus which may include the neural network computing apparatus, a general interconnection interface, and other processing apparatus (general-purpose processing apparatus). The neural network computing apparatus may interact with other processing apparatus to perform operations specified by users. FIG. 4c is a schematic diagram of the processing apparatus.

The other processing apparatus may include at least one or more of a general-purpose/special-purpose processors such as a central processing unit (CPU), a graphics processing unit (GPU), a neural network processor, and the like. The present disclosure does not restrict a count of processors included in the other processing apparatus. The other processing apparatus may serve as an interface that connects the neural network computing apparatus to external data and control, including data moving, and may perform the basic control such as starting and stopping the neural network computing apparatus. The other processing apparatus may also cooperate with the neural network computing apparatus to complete computation tasks.

The general interconnection interface may be configured to transfer data and control instructions between the neural network computing apparatus and the other processing apparatus. The neural network computing apparatus may obtain required input data from the other processing apparatus and write the data in an on-chip storage device of the neural network computing apparatus. The neural network computing apparatus may obtain control instructions from the other processing apparatus, and write the control instructions in an on-chip control cache of the neural network computing apparatus. The neural network computing apparatus may further read data stored in a storage module of the neural network computing apparatus and transfer the data to the other processing apparatus.

As shown in FIG. 4d, alternatively, the structure may further include storage apparatus configured to store required data of a present computing unit/computing apparatus or another computing unit, and is particularly suitable for a case where data that need to be computed cannot be completely stored in an internal memory of the neural network computing apparatus or another processing apparatus.

The processing apparatus can be used as an SOC (System On Chip) of a device including a mobile phone, a robot, a drone, a video surveillance device, and the like, which may effectively reduce the core area of a control part, increase the processing speed, and reduce the overall power consumption. In this case, a universal interconnection interface of the processing apparatus may be connected to some components of the apparatus. The components may include a camera, a monitor, a mouse, a keyboard, a network card, and a WIFI interface.

The present disclosure provides a neural network processor board card which can be used in various general-purpose or special-purpose computing system environments or configurations. For instance, personal computers, server computers, handheld or portable devices, tablet devices, smart home, home appliances, multiprocessor systems, microprocessor based systems, robots, programmable consumer electronics, network personal computers, small computers, large computers, distributed computing environments including any of the systems or devices above, and the like.

Figure 5C:
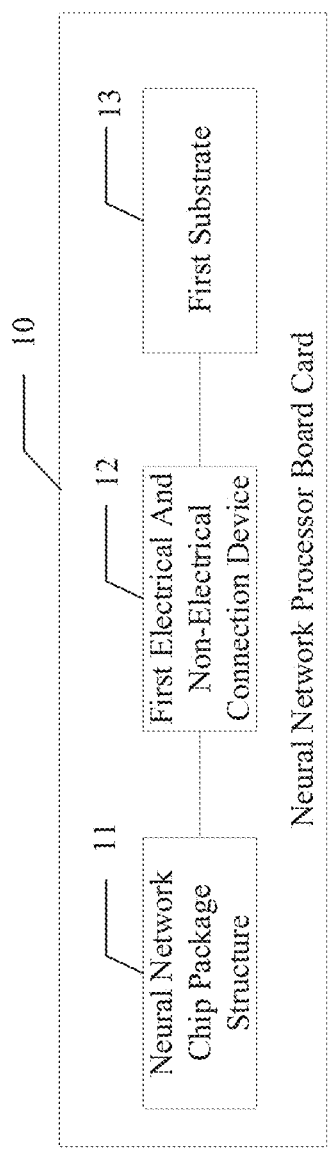
FIG. 5c is a structural diagram of a neural network processor board card according to an example of the present disclosure.

FIG. 5c is a structural diagram of a neural network processor board card according to an example of the present disclosure. As shown in FIG. 5c, the neural network processor board card 10 may include a neural network chip package structure 11, a first electrical and non-electrical connection device 12, and a first substrate 13.

Figure 5D:
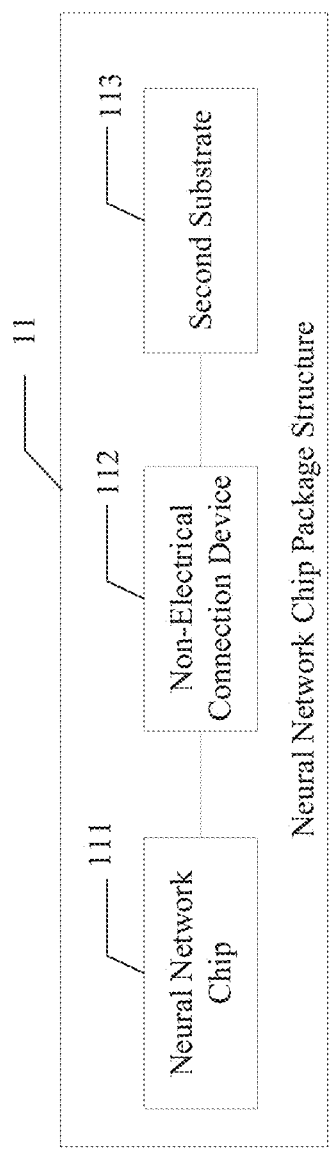
FIG. 5d is a structural diagram of a neural network chip package structure according to an example of the present disclosure.
Figure 5E:
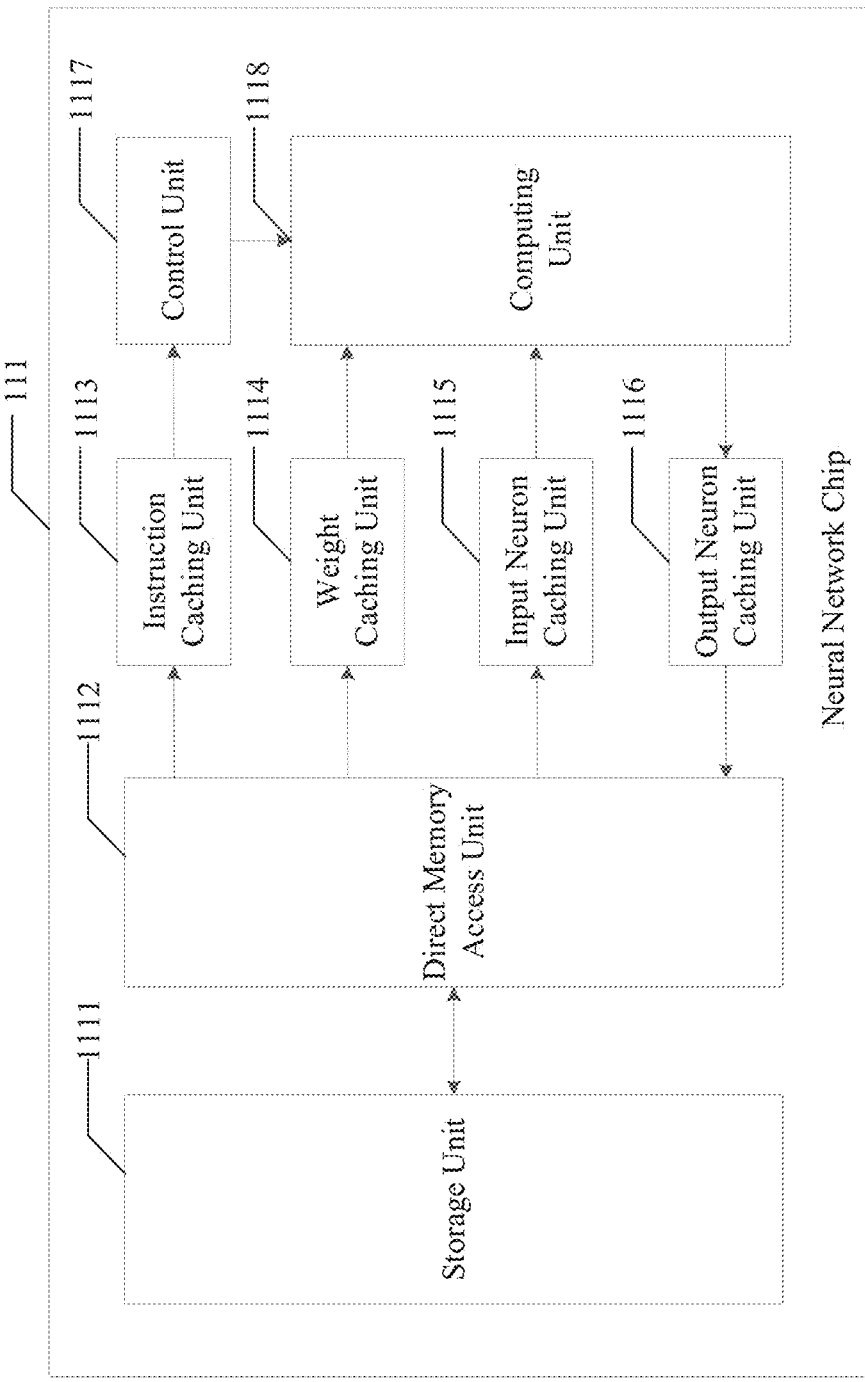
FIG. 5e is a structural diagram of a neural network chip according to an example of the present disclosure.

The present disclosure does not restrict a structure of the neural network chip package structure 11. Optionally, as shown in FIG. 5d, the neural network chip package structure 11 may include a neural network chip 111, a second electrical and non-electrical connection device 112, and a second substrate 113.

The present disclosure does not restrict a form of the neural network chip 111. The neural network chip 111 may include but is not limited to a neural network wafer integrated with a neural network processor, where the wafer may be made of silicon material, germanium material, quantum material, or molecular material. In some embodiments, the neural network wafer may be packaged (for example, a harsh environment), so that most of the neural network wafer may be wrapped, and leads on the neural network wafer may be connected to the outside of the packaging structure through conductors such as gold wire, which can be used for circuit connection with an outer layer.

The present disclosure does not restrict a structure of the neural network chip 111. Alternatively, the apparatus shown in FIG. 1a and FIG. 1b may be used as reference.

The present disclosure does not restrict types of the first substrate 13 and the second substrate 113. The types of the first substrate and the second substrate may be a printed circuit board (PCB) or a printed wiring board (PWB), and may also be another circuit board. The present disclosure does not restrict the material that the PCB is made of.

The second substrate 113 of the present disclosure may be used to bear the neural network chip 111, and the chip package structure obtained by connecting the neural network chip 111 and the second substrate 113 through the second electrical and non-electrical connection device 112 is used for protecting the neural network chip 111, so that the neural network chip package structure 11 and the first substrate 13 can be further packaged.

The present disclosure does not restrict a manner for packaging and a corresponding structure of the manner for packaging of the second electrical and non-electrical connection device 112. An appropriate package manner can be selected and be subject to simple improvement according to the specific application and different application requirements, such as Flip Chip Ball Grid Array Package (FCBGAP), Low-profile Quad Flat Package (LQFP), Quad Flat Package with Heat Sink (HQFP), Quad Flat Non-lead Package (QFN), or a Fine-Pitch Ball Grid Package (FBGA) and other package manners.

A flip chip may be suitable for a case where the requirement on the area after packaging is high or an inductor of a conductive wire and a transmission time of a signal are sensitive. In addition, a package manner of wire bonding may be adopted to reduce the cost and increase the flexibility of the package structure.

Ball Grid Array may provide more leads, and the average wire length of the leads is short, which can transfer signals at high speed, where the package may be replaced by Pin Grid Array (PGA), Zero Insertion Force (ZIF), Single Edge Contact Connection (SECC), Land Grid Array (LGA), and the like.

Figure 6A:
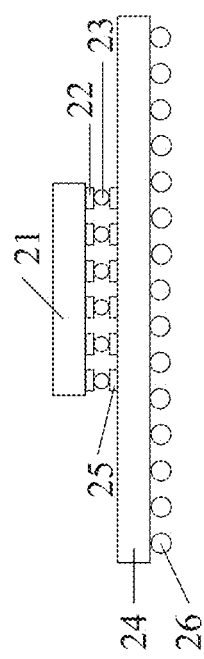
FIG. 6a is a schematic diagram of a neural network chip package structure according to an example of the present disclosure.

Optionally, the package manner of Flip Chip Ball Grid Array may be adopted to package the neural network chip 111 and the second substrate 113. Please refer to FIG. 6a for a schematic diagram of a package structure of the neural network chip. As shown in FIG. 6a, the neural network chip package structure may include a neural network chip 21, a pad 22, a ball 23, a second substrate 24, a connection point 25 on the second substrate 24, and a lead 26.

The pad 22 is connected to the neural network chip 21, and the ball 23 is formed by welding between the pad 22 and the connection point 25 on the second substrate 24, in this way, the neural network chip 21 and the second substrate 24 is connected, thereby realizing the package of the neural network chip 21.

The lead 26 is used to connect an external circuit of the package structure (for instance, the first substrate 13 on the neural network processor board card 10) for transferring external data and internal data, which may facilitate data processing by the neural network chip 21 or a corresponding neural network processor of the neural network chip 21. A type and quantity of leads are not restricted in the present disclosure. Different lead types can be selected according to different packaging technologies, and leads can be arranged according to certain rules.

Optionally, the neural network chip package structure may further include an insulating filler disposed in the gap between the pad 22, the ball 23, and the connection point 25 for preventing interference between balls.

The material of the insulating filler may be silicon nitride, silicon oxide or silicon oxynitride; and the interference may include electromagnetic interference, inductance interference, and the like.

Optionally, the neural network chip package structure may further include a heat dissipation device for dissipating heat generated during the operation of the neural network chip 21. The heat dissipation device may be a piece of metal with good thermal conductivity, a heat sink, or a radiator such as a fan.

Figure 6B:
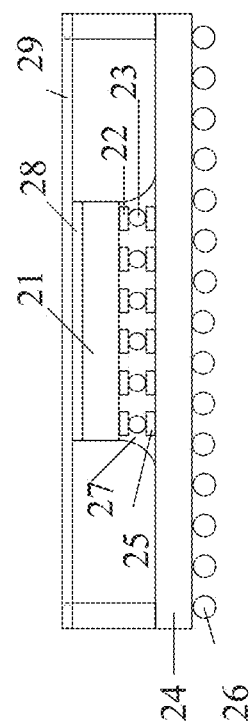
FIG. 6b is a schematic diagram of another neural network chip package structure according to an example of the present disclosure.
Figure 7A:
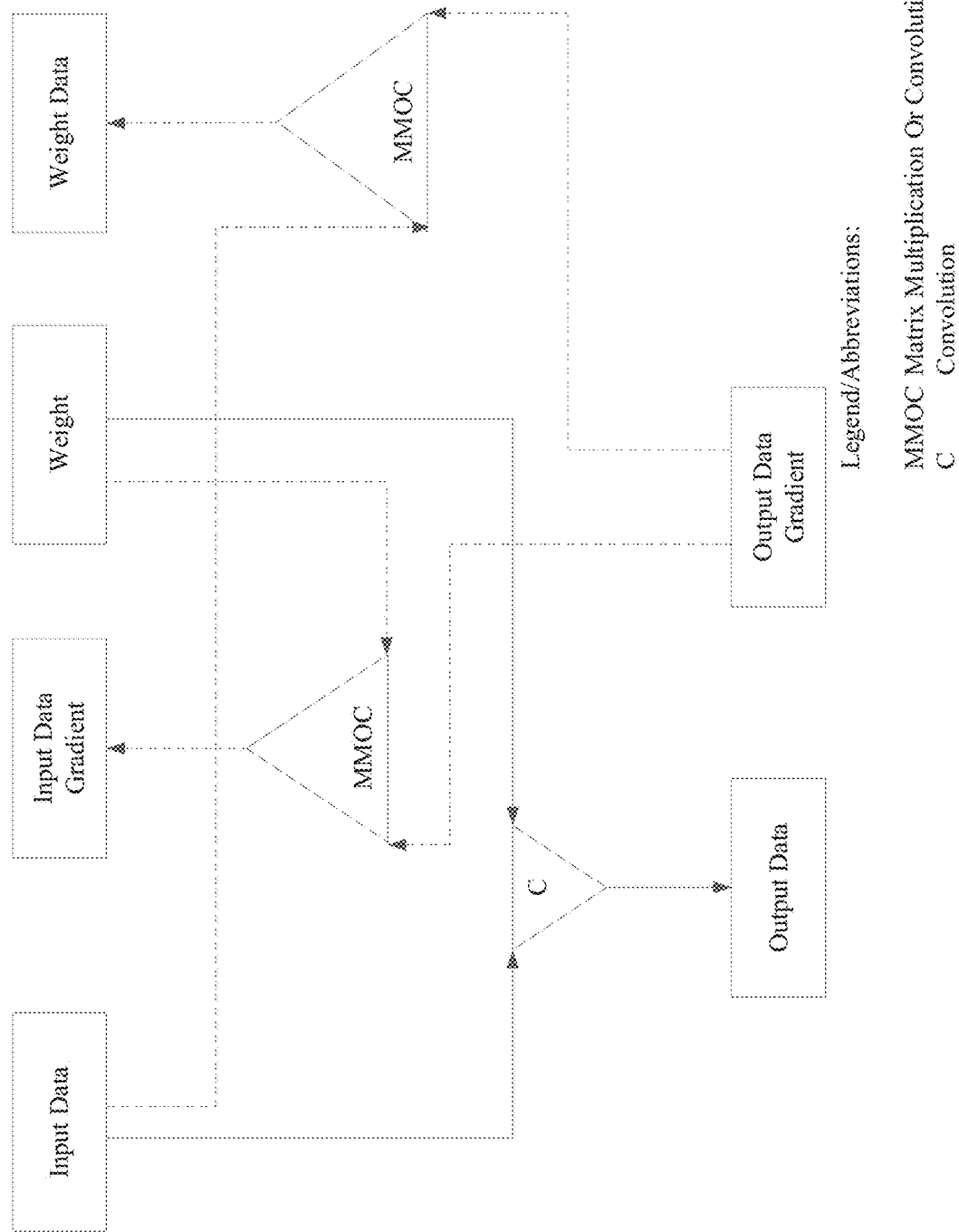
FIG. 7a is another schematic diagram of neural network training.
Figure 7B:
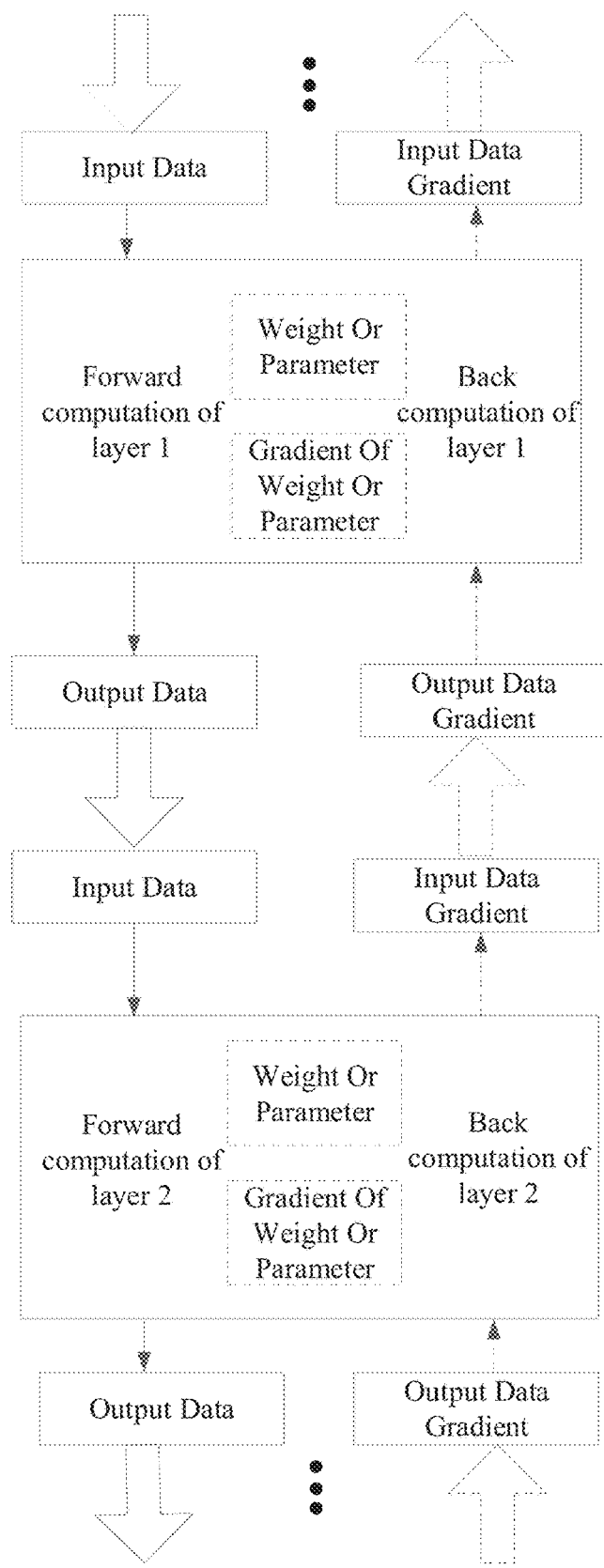
FIG. 7b is a schematic diagram of a forward computation and a back computation of a neural network.
Figure 7C:
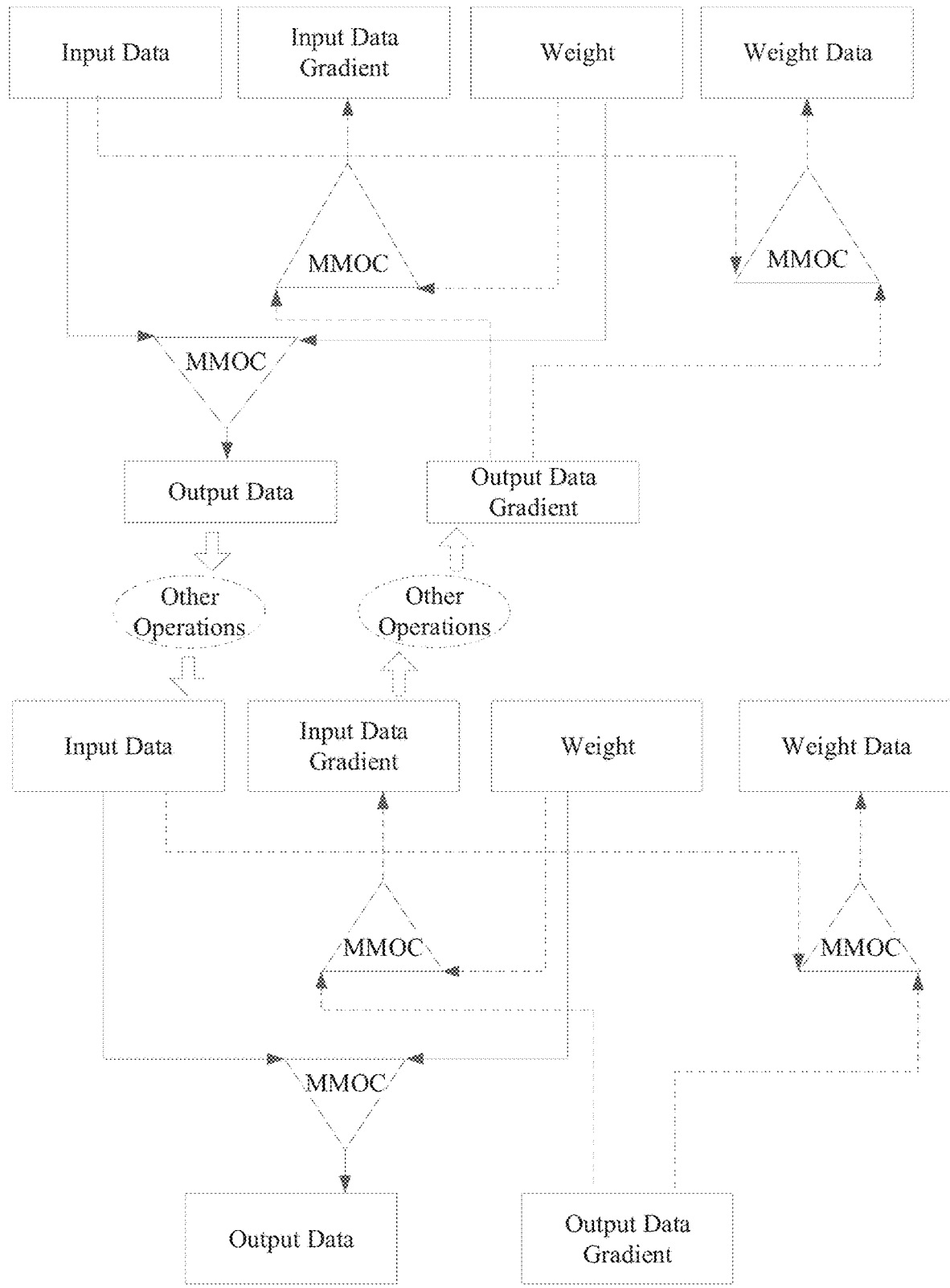
FIG. 7c is a schematic diagram of a multi-layer structure of neural network training.

For instance, as shown in FIG. 6b, the neural network chip package structure 11 may include: a neural network chip 21, a pad 22, a ball 23, a second substrate 24, a connection point 25 on the second substrate 24, a lead 26, an insulating filler 27, thermal compound 28, and a fin 29 with metal housing. Among them, the thermal compound 28 and the fin 29 with metal housing are configured to dissipate the heat generated during the operation of the neural network chip 21.

Optionally, the neural network chip package structure 11 may further include a reinforcing structure, which is connected to the pad 22, and is buried in the ball 23 to enhance the connection strength between the ball 23 and the pad 22.

The reinforcing structure may be a metal wire structure or a columnar structure, which is not restricted herein.

A form of the first electrical and non-electrical device 12 is not restricted in the present disclosure. Please refer to the description of the second electrical and non-electrical device 112. In other words, the neural network chip package structure may be packaged by welding, or by connecting the second substrate 113 and the first substrate 13 through a connecting line or by means of plugging, so that the first substrate 13 or the neural network chip package structure 11 can be replaced conveniently later.

Optionally, the first substrate 13 may include a memory unit interface for expanding storage capacity, such as a Synchronous Dynamic Random Access Memory (SDRAM), and a Double Date Rate (DDR) SDRAM, and the like. By expanding the memory, the processing capacity of the neural network processor may be improved.

The first substrate 13 may further include a Peripheral Component Interconnect-Express (PCI-E or PCIe) interface, a Small Form-factor Pluggable (SFP) interface, and an Ethernet interface, a Controller Area Network (CAN) interface, and the like, which can be used for data transferring between the package structure and external circuits. In this way, the computational speed may be improved, and the operation may be easier.

The neural network processor is packaged into a neural network chip 111, the neural network chip 111 is packaged into a chip package structure 11, and the neural network chip package structure 11 is packaged into a neural network processor board card 10. Data interaction with an external circuit (for instance, a computer motherboard) may be performed through an interface (slot or ferrule) on the board card, that is, the function of the neural network processor may be implemented by using the neural network processor board card 10 directly, which may also protect the neural network chip 111. In addition, other modules may be added to the neural network processor board card 10, which may improve the application range and computational efficiency of the neural network processor.

An example of the present disclosure provides an electronic device including the neural network processor board card 10 or the neural network chip package structure 11.

The electronic device may include a data processing device, a robot, a computer, a printer, a scanner, a tablet, a smart terminal, a mobile phone, a traffic recorder, a navigator, a sensor, a webcam, a server, a camera, a video camera, a projector, a watch, a headphone, a mobile storage, a wearable device, a vehicle, a household appliance, and/or a medical equipment.

The vehicle may include an airplane, a ship, and/or a car. The household electrical appliance may include a television, an air conditioner, a microwave oven, a refrigerator, an electric rice cooker, a humidifier, a washing machine, an electric lamp, a gas cooker, and a range hood; and the medical equipment may include a nuclear magnetic resonance spectrometer, a B-ultrasonic scanner, and/or an electrocardiograph.

The examples further explain the purpose, technical solutions and technical effects of the present disclosure. It should be understood that the foregoing are merely examples of the present disclosure, and are not intended to limit the present disclosure. Any modification, equivalent substitution, improvement, and the like, to the present disclosure within the spirit and principles of the present disclosure shall be included in the protection scope of the present disclosure.

What is claimed is:

1. An integrated circuit chip apparatus comprising: a main processing circuit and a plurality of basic processing circuits, wherein
    the plurality of basic processing circuits are configured to perform a first set of neural network computations in parallel on data transferred by the main processing circuit to obtain a plurality of computation results, and transfer the plurality of computation results to the main processing circuit, and
    the main processing circuit is configured to perform a second set of neural network computations in series on the plurality of computation results.

2. The integrated circuit chip apparatus of claim 1, wherein the main processing circuit or at least one of the plurality of basic processing circuits includes a data type conversion circuit configured to convert data between a floating point data type and a fixed point data type.

3. The integrated circuit chip apparatus of claim 2, wherein the main processing circuit is further configured to:
    receive a data block; and
    convert the data block to a fixed point data block using the data type conversion circuit.

4. The integrated circuit chip apparatus of claim 3, wherein the main processing circuit is further configured to:
    divide the fixed point data block into a distribution data block and a broadcasting data block;
    partition the distribution data block to obtain a plurality of basic data blocks;
    distribute the plurality of basic data blocks to the plurality of basic processing circuits; and
    broadcast the broadcasting data block to the plurality of basic processing circuits.

5. The integrated circuit chip apparatus of claim 4, wherein the basic processing circuits are further configured to:
    perform the first set of neural network computations on the basic data blocks and the broadcasting data block in the fixed point data type to obtain the plurality of computation results.

6. The integrated circuit chip apparatus of claim 5, wherein the main processing circuit is further configured to:
    convert the plurality of computation results to the floating point data type; and
    perform the second set of neural network computations on the computation results in the floating point data type.

7. The integrated circuit chip apparatus of claim 1, wherein the main processing circuit is further configured to:
    receive a data block;
    divide the data block into a distribution data block and a broadcasting data block;
    partition the distribution data block to obtain a plurality of basic data blocks;
    distribute the plurality of basic data blocks to the plurality of basic processing circuits; and
    broadcast the broadcasting data block to the plurality of basic processing circuits.

8. The integrated circuit chip apparatus of claim 7, wherein the basic processing circuits are further configured to:
    convert the basic data blocks and the broadcasting data block into data blocks of a fixed point data type; and perform the first set of neural network computations on the basic data blocks and the broadcasting data block in the fixed point data type to obtain fixed point computation results.

9. The integrated circuit chip apparatus of claim 8, wherein the basic processing circuits are further configured to:
convert the computation results from the fixed point data type to a floating point data type; and
transfer the computation results in the floating point data type to the main processing circuit.

10. The integrated circuit chip apparatus of claim 8, wherein the basic processing circuits are further configured to:
transfer the computation results in fixed point data type to the main processing circuit, wherein the main processing circuit is further configured to:
convert the plurality of computation results to a floating point data type; and
perform the second set of neural network computations on the computation results in the floating point data type.

11. The integrated circuit chip apparatus of claim 7, wherein the main processing circuit is configured to broadcast the broadcasting data block as a whole to the plurality of basic processing circuits.

12. The integrated circuit chip apparatus of claim 7, wherein the broadcasting data block is a multiplier data block and the distribution data block a multiplicand data block.

13. The integrated circuit chip apparatus of claim 7, wherein the broadcasting data block is an input data block for convolution and the distribution data block is a convolution kernel.

14. The integrated circuit chip apparatus of claim 1, wherein
the main processing circuit includes a main register or a main on-chip caching circuit, and
each of the plurality of basic processing circuits includes a basic register or a basic on-chip caching circuit.

15. The integrated circuit chip apparatus of claim 1, wherein the main processing circuit includes one or more of a vector computing unit circuit, an arithmetic and logic unit circuit, an accumulator circuit, a matrix transposition circuit, a direct memory access circuit, a data type conversion circuit, or a data rearrangement circuit.

16. The integrated circuit chip apparatus of claim 1, wherein the first set of neural network computations are inner product computations, wherein the second set of neural computations are accumulation computations that accumulate the computation results obtained by the inner product computations.

17. The integrated circuit chip apparatus of claim 1, further comprising: a branch processing circuit, wherein the branch processing circuit is located between the main processing circuit and at least one basic processing circuit, wherein the branch processing circuit is configured to forward data between the main processing circuit and at least one basic processing circuit.

18. A processing system, comprising:
a neural network computing apparatus;
a general interconnection interface; and
a general-purpose processing apparatus connected to the neural network computing apparatus via the general interconnection interface,
wherein the neural network computing apparatus further comprises: a main processing circuit and a plurality of basic processing circuits, wherein
the plurality of basic processing circuits are configured to perform a first set of neural network computations in parallel on data transferred by the main processing circuit to obtain a plurality of computation results, and transfer the plurality of computation results to the main processing circuit, and
the main processing circuit is configured to perform a second set of neural network computations in series on the plurality of computation results.

19. A method for performing neural network operations using an integrated circuit chip apparatus comprising a main processing circuit, and a plurality of basic processing circuits, the method comprising:
performing, by the plurality of basic processing circuits, a first set of neural network computations in parallel on data transferred by the main processing circuit to obtain a plurality of computation results, and transfer the plurality of computation results to the main processing circuit, and
performing, by the main processing circuit, a second set of neural network computations in series on the plurality of computation results.

20. The method of claim 19, wherein the main processing circuit or at least one of the plurality of basic processing circuits includes a data type conversion circuit, wherein the method further comprises:
converting data, by the data type conversion circuit, between a floating point data type and a fixed point data type.

* * * * *